United States Patent
Nakamura et al.

(10) Patent No.: US 7,033,868 B2
(45) Date of Patent: Apr. 25, 2006

(54) SEMICONDUCTOR DEVICE AND METHOD OF MANUFACTURING SAME

(75) Inventors: Shunji Nakamura, Kawasaki (JP); Yosuke Shimamune, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/708,792

(22) Filed: Mar. 25, 2004

(65) Prior Publication Data
US 2005/0062080 A1 Mar. 24, 2005

(30) Foreign Application Priority Data
Sep. 24, 2003 (JP) .............................. 2003-332383

(51) Int. Cl.
*H01L 21/84* (2006.01)
*H01L 21/76* (2006.01)
*H01L 21/46* (2006.01)

(52) U.S. Cl. ..................... 438/149; 438/151; 438/421; 438/457

(58) Field of Classification Search ................. None
See application file for complete search history.

(56) References Cited

U.S. PATENT DOCUMENTS 6,881,635 B1 * 4/2005 Chidambarrao et al. ..... 438/300
2005/0045947 A1 * 3/2005 Chen et al. ................. 257/336

OTHER PUBLICATIONS

Patent Abstracts of Japan No. 08-186249 (Abstract).
Patent Abstracts of Japan No. 05-121450 (Abstract).
Patent Abstracts of Japan No. 2000-012791 (Abstract).
Patent Abstracts of Japan No. 2000-022158 (Abstract).
Patent Abstracts of Japan No. 2000-286418 (Abstract).

* cited by examiner

*Primary Examiner*—Ha Tran Nguyen
(74) *Attorney, Agent, or Firm*—Armstrong, Kratz, Quintos, Hanson & Brooks, LLP

(57) ABSTRACT

A high-speed, low-power-consumption semiconductor device has a thin-film Si layer with a source/drain formed therein. The thin-film Si layer is curved from a region directly below a gate electrode toward a region near the source/drain. The curved thin-film Si layer develops strains in a channel region disposed directly below the gate electrode sandwiched by the source/drain in the thin-film Si layer, for thereby increasing a carrier mobility. A cavity is defined below the curved thin-film Si layer for reducing a parasitic capacitance due to a pn junction.

11 Claims, 67 Drawing Sheets

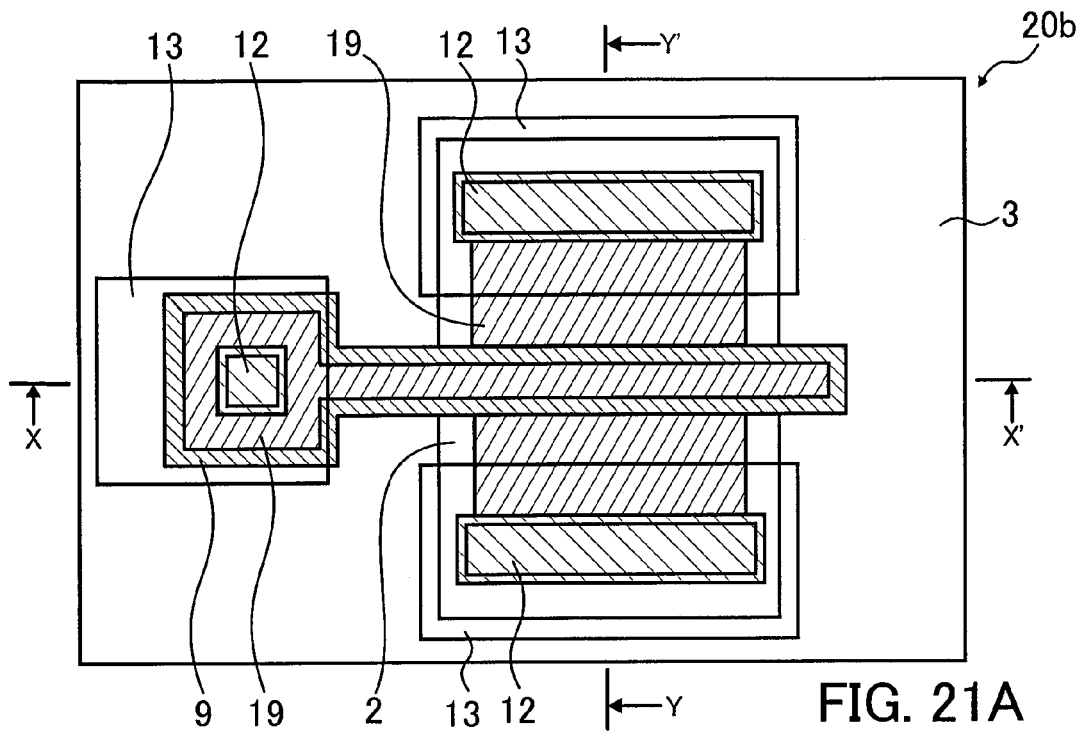
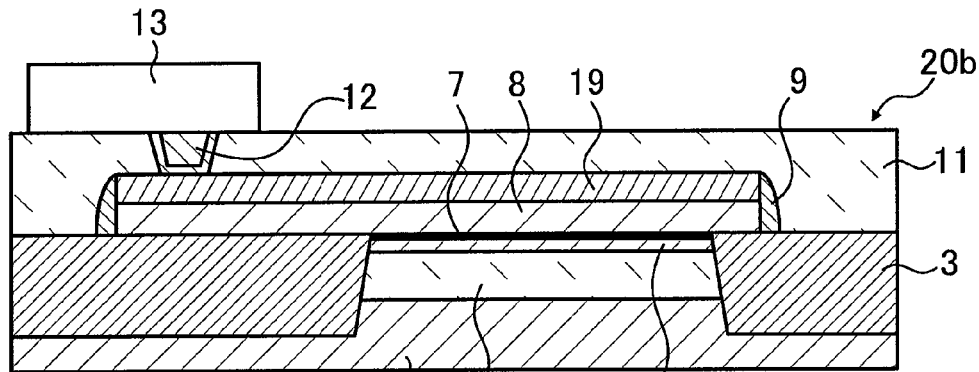
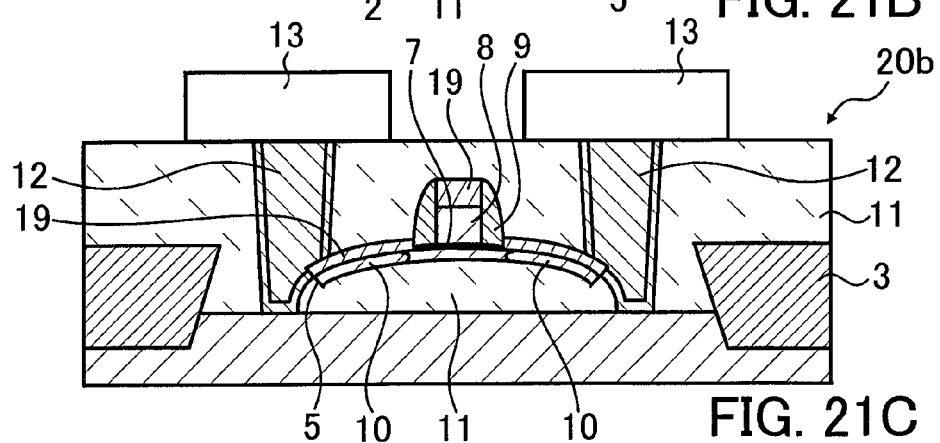
FIG. 21A
FIG. 21B
FIG. 21C

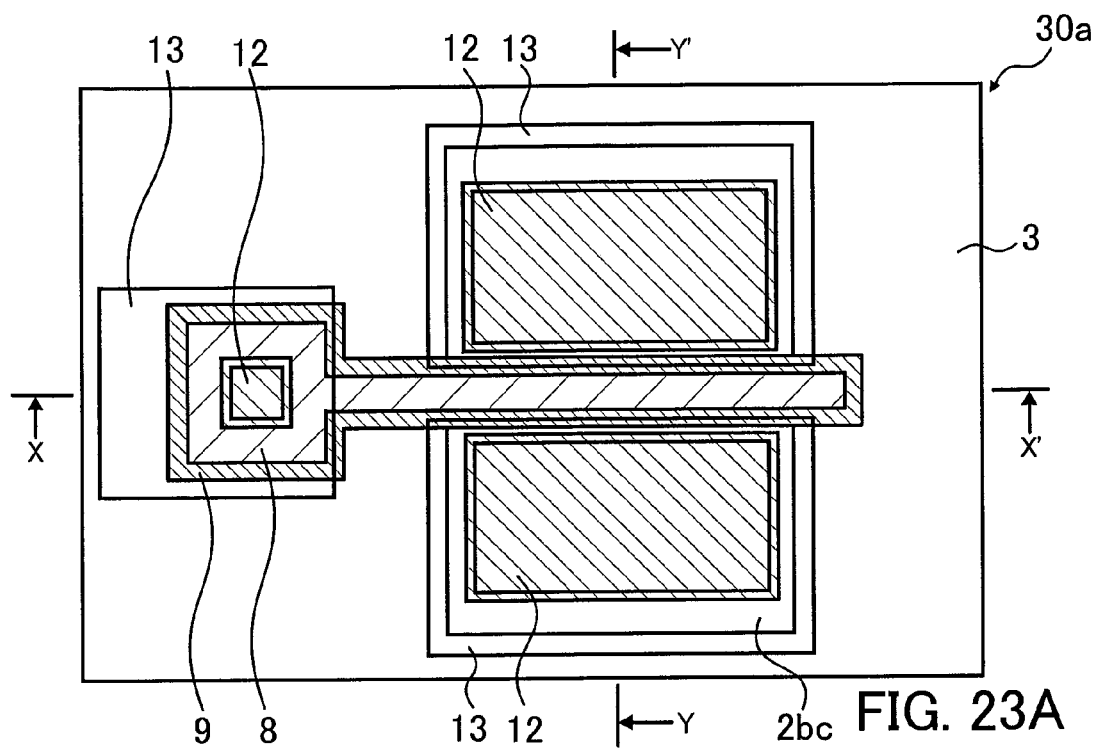
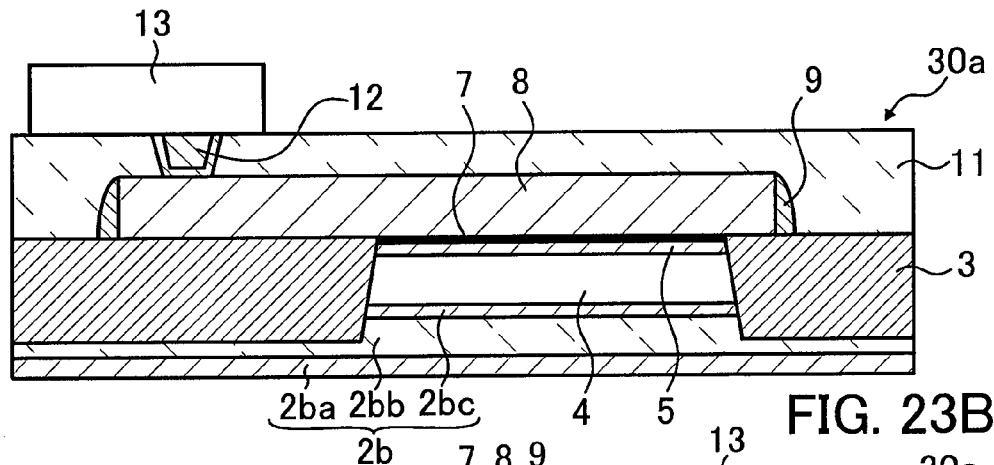
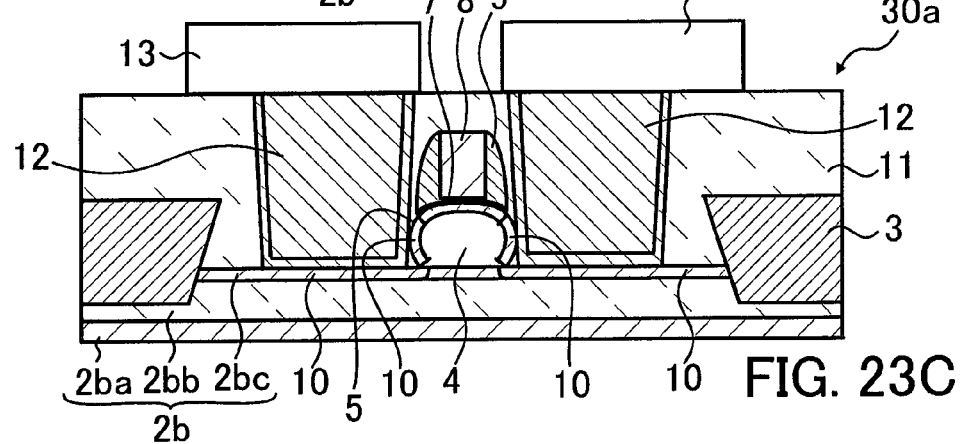
FIG. 23A
FIG. 23B
FIG. 23C

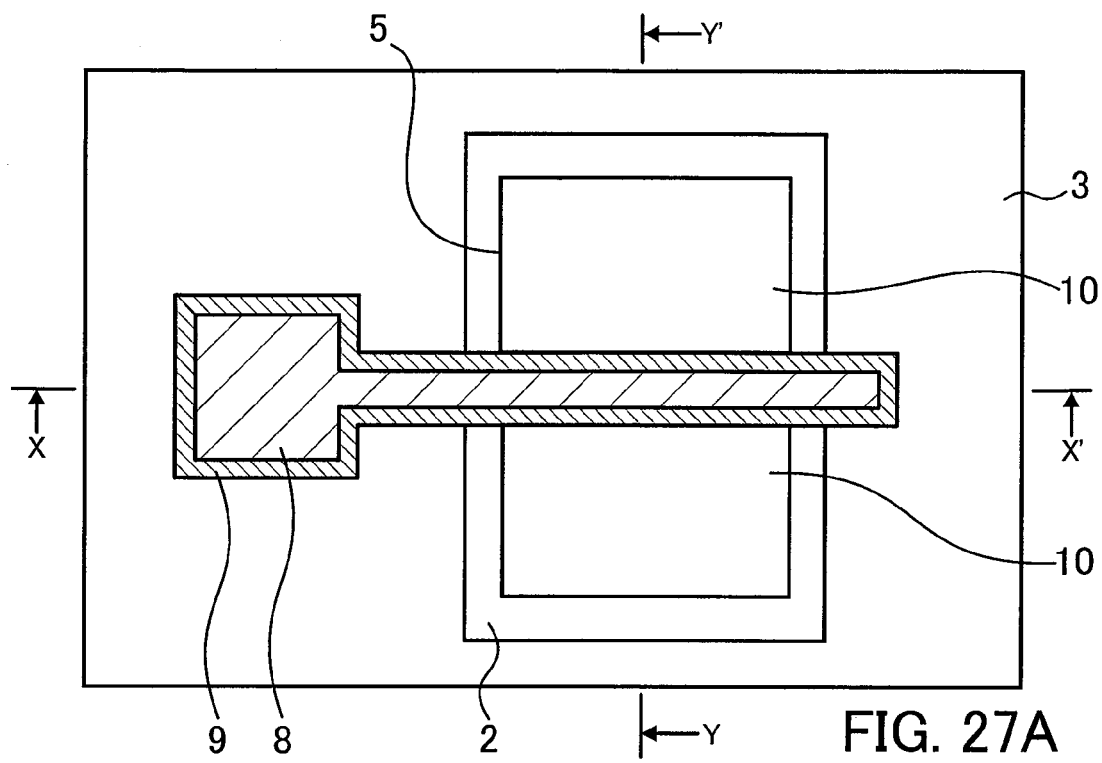
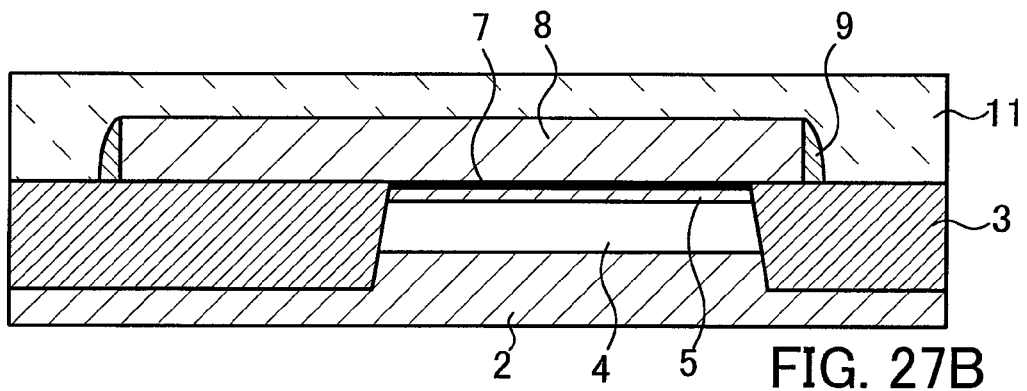
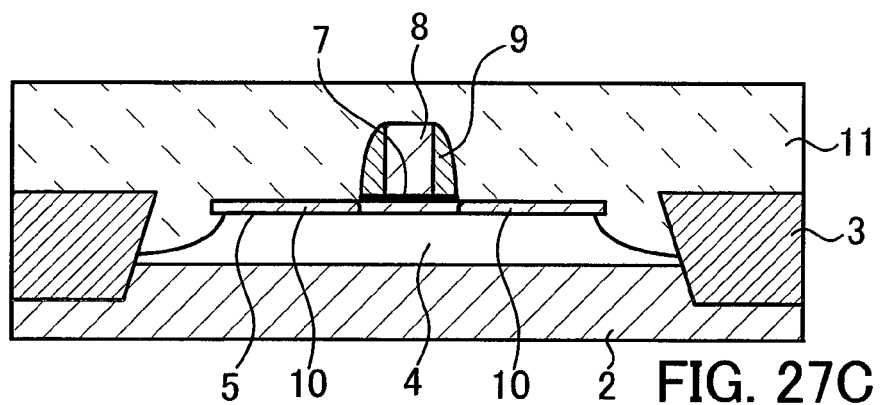
FIG. 27A
FIG. 27B
FIG. 27C

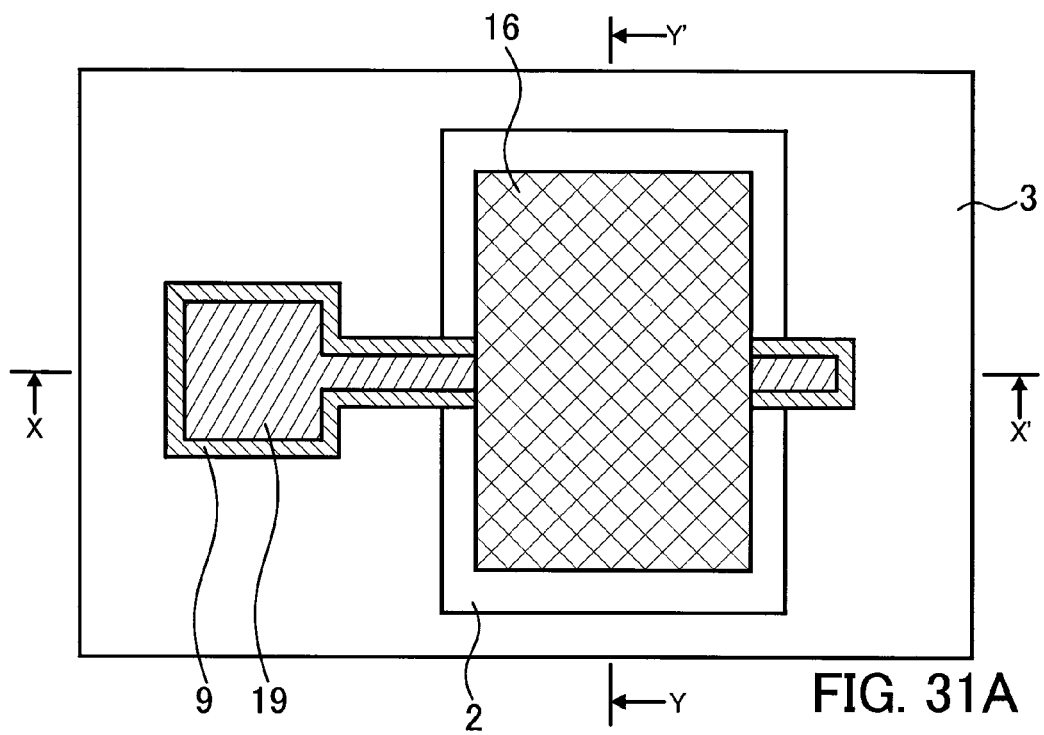
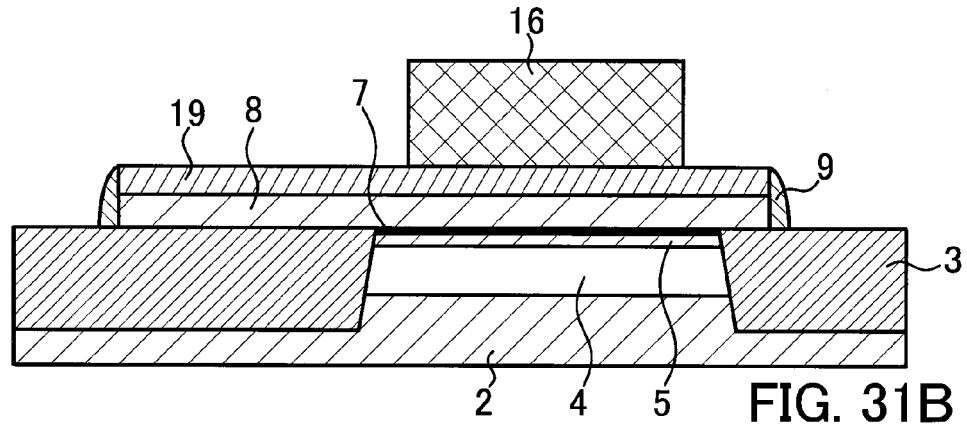
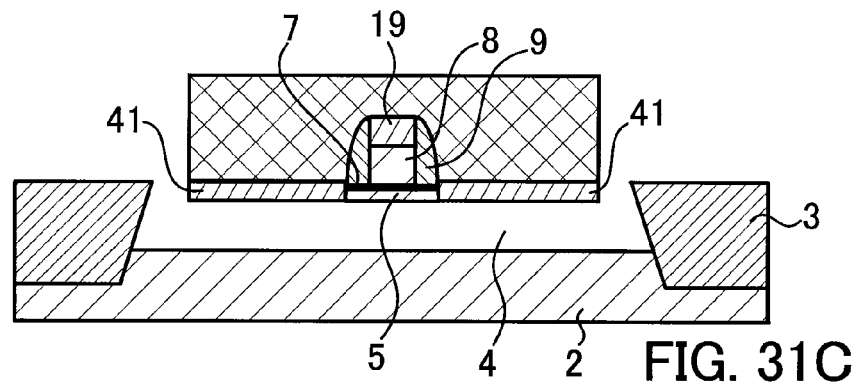

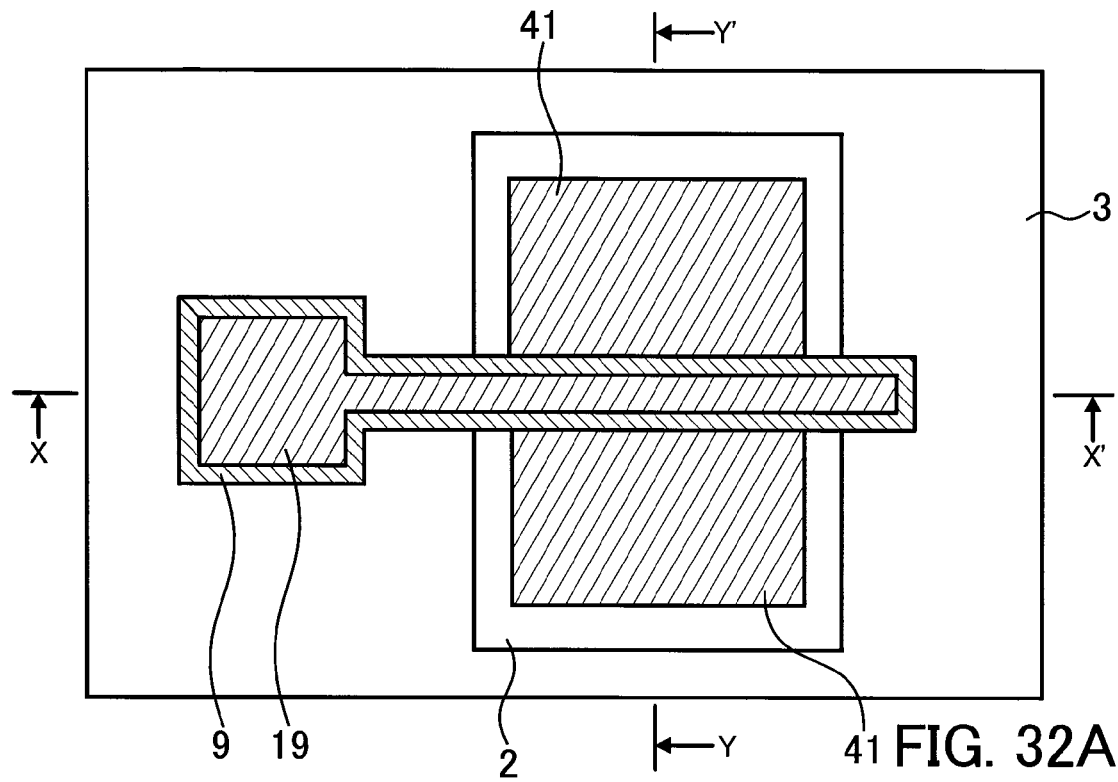
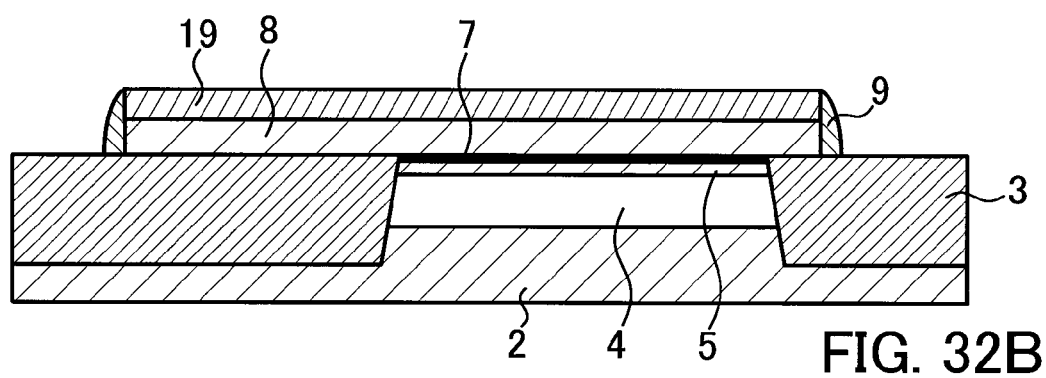
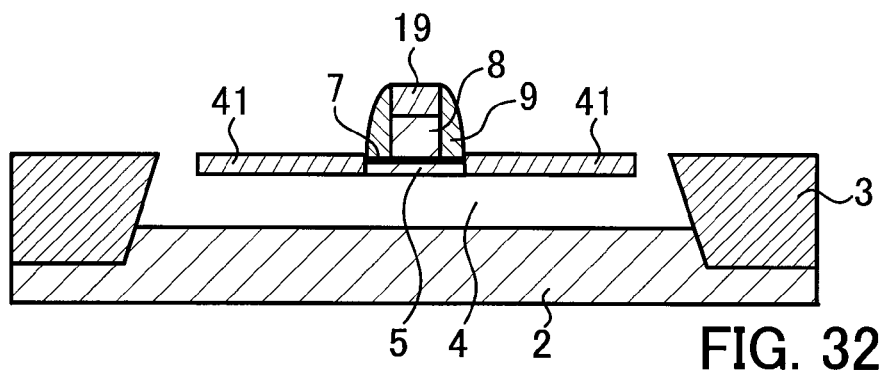
FIG. 32A
FIG. 32B
FIG. 32C

US 7,033,868 B2

SEMICONDUCTOR DEVICE AND METHOD OF MANUFACTURING SAME

CROSS-REFERENCE TO RELATED APPLICATIONS

This application is based upon and claims priority of Japanese Patent Application No. 2003-332383, filed on Sep. 24, 2003, the contents being incorporated herein by reference.

BACKGROUND OF THE INVENTION (1) Field of the Invention

The present invention relates to a semiconductor device and a method of manufacturing such a semiconductor device, and more particularly to a semiconductor device having a transistor structure capable of moving electrons or holes as a carrier at a high speed, and a method of manufacturing such a semiconductor device.

(2) Description of the Related Art

In recent years, the society is rapidly growing more and more information-intensive, and efforts are being made to make many information-processing electronic devices such as large-size computers, personal computers (PCs), personal digital assistants (PDAs), cell phones, etc. higher in operational speed and functionality and lower in power consumption. For further advancing those information-processing electronic devices, it is essential to make semiconductor devices which support the advancement as internal components also higher in operational speed and functionality and lower in power consumption.

FIG. 64 of the accompanying drawings is a schematic cross-sectional view of a basic structure of a conventional semiconductor device.

A semiconductor device 100 shown in FIG. 64 has a device-separating region 102 formed in a silicon (Si) substrate 101 and surrounding a region serving as a transistor forming region. A gate insulating film 103 and a gate electrode 104 are formed in the transistor forming region, and a low-concentration LDD (Lightly Doped Drain) region 105 and a source/drain 106 are formed in the Si substrate 101. Plugs 107 are connected to the source/drain 106 and also to interconnection layers 108, thus providing the semiconductor device 100. If necessary, a well region is formed in the Si substrate 101.

Heretofore, it has been customary to improve the performance of transistors by reducing the size of gate electrodes. However, since enormous facility investments are required to reduce the size of gate electrodes and limitations will sometimes be posed on attempts to reduce the size of gate electrodes, there have been efforts to improve the performance of transistors without reducing the size of gate electrodes. Conventional semiconductor devices according to first through third examples for the purpose of improving the performance of transistors are shown in FIGS. 65 through 67 of the accompanying drawings.

FIG. 65 is a schematic cross-sectional view of a semiconductor device according to a first conventional example. In FIG. 65, those elements which are identical to those shown in FIG. 64 are denoted by identical reference numerals.

A semiconductor device 200 shown in FIG. 65 is different from the semiconductor device 100 shown in FIG. 64 in that a silicone germanium (SiGe) layer 201 is formed by epitaxial growth on the surface region of the Si substrate 101 where a channel is formed. Other structural details of the semiconductor device 200 are identical to those of semiconductor device 100. Si and SiGe have different lattice constants, the lattice constant of SiGe being greater than the lattice constant of Si. However, because SiGe is formed as a thin layer on Si, SiGe is formed with the same lattice constant as Si. Such a structure is called "strained SiGe structure", and has a hole mobility about twice greater than if only the Si substrate 101 were used.

FIG. 66 is a schematic cross-sectional view of a semiconductor device according to a second conventional example. In FIG. 66, those elements which are identical to those shown in FIGS. 64 and 65 are denoted by identical reference numerals.

A semiconductor device 300 shown in FIG. 66 is different from the semiconductor device 200 shown in FIG. 65 in that a SiGe layer 201 and an Si layer 301 are successively formed by epitaxial growth on the Si substrate 101 and the uppermost Si layer 301 is used as a transistor channel. Other structural details of the semiconductor device 300 are identical to those of semiconductor device 200 according to the first example. With the semiconductor device 300 according to the second example, SiGe is deposited by way of epitaxial growth on the Si substrate 101, forming the SiGe layer 201. Though SiGe has the same lattice constant as Si insofar as the film thickness of SiGe is small in an initial growth state, SiGe comes to have its inherent lattice constant as its thickness increases (relaxed SiGe layer). When a thin layer of Si is formed by epitaxial growth on the relaxed SiGe layer, Si is formed with the same lattice constant as SiGe contrary to the strained SiGe structure. Such a structure is called "strained Si structure", and has an electron mobility about twice greater than if only the Si substrate 101 were used and a hole mobility about several tens % greater than if only the Si substrate 101 were used.

FIG. 67 is a schematic cross-sectional view of a semiconductor device according to a third conventional example. In FIG. 67, those elements which are identical to those shown in FIG. 64 are denoted by identical reference numerals.

A semiconductor device 400 shown in FIG. 67 is different from the semiconductor devices 200, 300 according to the first and second examples which utilize a strain developed due to different lattice constants. In the semiconductor device 400, an insulating film 401 is formed in the Si substrate 101 near the gate electrode 104. Forces tending to spread the Si substrate 101 are produced by stresses that are generated when the insulating film 401 is expanded or contracted in a heat treatment process. In this manner, the channel region of the transistor is strained to increase the carrier mobility. It has been said that the electron mobility is increased several tens % by straining the channel region of the transistor with the above structure.

Heretofore, the above transistor structures based on strains have been adopted to increase the electron or hole mobility without reducing the size of the gate electrodes. However, with conventional general transistor structures, a parasitic capacitance due to a pn junction exists between the source/drain and the substrate and between the channel and the substrate, and the operation of the transistor is delayed by such a parasitic capacitance. It has strongly been desired to solve such a problem and produce high-speed, low-power-consumption transistors.

To solve the problem of the parasitic capacitance due to the pn junction, there has been proposed a semiconductor device having a cavity defined below a semiconductor layer where a source/drain and a channel are formed (for example, see Japanese Unexamined Patent Publication No. 2000-

22158 (paragraph Nos. [0019] through [0025], [0035] through [0039], FIGS. 1, 3, and 4). According to this proposal, the semiconductor layer is formed above the cavity which serves as an insulating layer, providing an SOI (Silicon On Insulator) structure. By providing the cavity whose dielectric constant is lower than that of an insulating layer such as a silicon oxide ($SiO_2$) layer formed beneath a semiconductor layer in a usual SOI structure, the capacitance between the source/drain and the substrate and the capacitance between the channel and the substrate are reduced, preventing the transistor operation from being delayed. The semiconductor device can be produced by forming a sacrificial oxide film and a semiconductor layer on a semiconductor substrate, pattering the sacrificial oxide film and the semiconductor layer to the size of the gate of a transistor to be formed, and covering the exposed portion with a protective oxide film. After forming an opening with the protective oxide film left as a side wall, an etching liquid is introduced through the opening to selectively remove the sacrificial oxide film. Thereafter, the opening is closed by an insulating film deposited according to CVD (Chemical Vapor Deposition) or sputtering. A gate electrode and a source/drain are formed on the semiconductor layer above the cavity which has been formed by removal of the sacrificial oxide film.

SUMMARY OF THE INVENTION

There is provided in accordance with the present invention a semiconductor device having a gate electrode formed on a semiconductor layer with a gate insulating film interposed therebetween, and a source/drain formed in the semiconductor layer. The semiconductor device is characterized in that the semiconductor layer is curved from a region directly below the gate electrode sandwiched by the source/drain toward a region near the source/drain.

There is also provided in accordance with the present invention a method of manufacturing a semiconductor device having a gate electrode formed on a semiconductor layer with a gate insulating film interposed therebetween, and a source/drain formed in the semiconductor layer. The method comprises the steps of forming a laminated region of a sacrificial layer and a semiconductor layer and a device separating region surrounding the laminated region, on a substrate, forming a gate electrode on the device separating region and the semiconductor layer with a gate insulating film interposed therebetween, forming an opening through which the sacrificial layer is exposed between the device separating region and the semiconductor layer, and removing the sacrificial layer through the opening to form a cavity below the semiconductor layer.

There is further provided in accordance with the present invention a method of manufacturing a semiconductor device having a gate electrode formed on a semiconductor layer with a gate insulating film interposed therebetween and a source/drain formed in the semiconductor layer. The method comprises the steps of forming a laminated region of a sacrificial layer and a semiconductor layer and a device separating region surrounding the laminated region, on a substrate, forming a gate electrode on the device separating region and the semiconductor layer with a gate insulating film interposed therebetween, forming a source/drain in the semiconductor layer in sandwiching relation to a region directly below the gate electrode, forming an interlayer insulating film on the entire surface, forming a contact hole extending through the interlayer insulating film, and removing the sacrificial layer through the contact hole to form a cavity below the semiconductor layer.

There is further provided in accordance with the present invention a semiconductor device having a gate electrode formed on a semiconductor layer with a gate insulating film interposed therebetween and a source/drain formed in the semiconductor layer. The semiconductor device comprises a dome-shaped semiconductor disposed on a substrate, a gate insulating film and a gate electrode disposed on an outer wall surface of the dome-shaped semiconductor, and a semiconductor layer disposed on an inner wall surface of the dome-shaped semiconductor and having a source/drain formed therein in sandwiching relation to a region directly below the gate electrode.

There is also provided in accordance with the present invention a method of manufacturing a semiconductor device having a gate electrode formed on a semiconductor layer with a gate insulating film interposed therebetween and a source/drain formed in the semiconductor layer. The method comprises the steps of forming a first semiconductor layer partly on a surface of a substrate, forming a second semiconductor layer on an entire surface, forming a gate insulating film and a gate electrode on the second semiconductor layer directly above the first semiconductor layer, forming an opening extending to the first semiconductor layer in the second semiconductor layer and selectively removing the first semiconductor layer thereby to form a dome-shaped semiconductor which comprises the second semiconductor layer, and forming a third semiconductor layer on an inner wall surface of the dome-shaped semiconductor, with a source/drain formed in the third semiconductor layer.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIGS. 21A through 21C are views showing a semiconductor device according to a third example of the second embodiment of the present invention, FIG. 21A being a plan view of the semiconductor device, FIG. 21B a cross-sectional view taken along line X–X' of FIG. 21A, and FIG. 21C a cross-sectional view taken along line Y–Y' of FIG. 21A;

FIGS. 23A through 23C are views showing a semiconductor device according to a second example of the third embodiment of the present invention, FIG. 23A being a plan view of the semiconductor device, FIG. 23B a cross-sectional view taken along line X–X' of FIG. 23A, and FIG. 23C a cross-sectional view taken along line Y–Y' of FIG. 23A;

FIGS. 27A through 27C are views showing a manufacturing process for manufacturing the semiconductor device according to the first example of the fourth embodiment of the present invention, FIG. 27A being a plan view, FIG. 27B a cross-sectional view taken along line X–X' of FIG. 27A, and FIG. 27C a cross-sectional view taken along line Y–Y' of FIG. 27A;

FIGS. 31A through 31C are views showing a manufacturing process (3) for manufacturing the semiconductor device according to the third example of the fourth embodiment of the present invention, FIG. 31A being a plan view, FIG. 31B a cross-sectional view taken along line X–X' of FIG. 31A, and FIG. 31C a cross-sectional view taken along line Y–Y' of FIG. 31A;

FIGS. 32A through 32C are views showing a manufacturing process (4) for manufacturing the semiconductor device according to the third example of the fourth embodiment of the present invention, FIG. 32A being a plan view, FIG. 32B a cross-sectional view taken along line X–X' of FIG. 32A, and FIG. 32C a cross-sectional view taken along line Y–Y' of FIG. 32A;

DESCRIPTION OF THE PREFERRED EMBODIMENTS

As described in the Related Art, there have been proposed various conventional transistor structures which are designed for high-speed operation by straining the channel region. In the future, the carrier mobility that is achieved by the transistor structures according to the above first through third examples will not be sufficient enough. These transistor structures may not necessarily be highly effective to increase both the hole mobility and the electron mobility, and may fail to make both p- and n-type transistors high in speed due to structural limitations as when p- and n-type transistors are to be formed on one substrate. Furthermore, if the strained SiGe structure or the strained Si structure is employed, then since the crystal surface morphology tends to be degraded as the film thickness increases upon epitaxial growth of semiconductor layers having different lattice constants, some countermeasures are needed to prevent crystal defects such as dislocations from occurring in the SiGe layer and the Si layer where the channel is to be formed.

The conventional transistor structure in which the cavity is formed beneath the semiconductor layer where a channel is to be formed is problematic in that since a thin gate electrode is formed over the cavity, the gate electrode is liable to fall into the cavity. The opening for removing the sacrificial oxide film to form the cavity is defined in a region relatively close to the gate electrode. Consequently, when the opening is closed by an epitaxial layer or the like, the epitaxial layer or the like may possibly enter deeply into the cavity, filling up the cavity. If the cavity is filled up, then the performance of small-size transistors cannot sufficiently be improved. If the cavity is thick, then it has a large ability to reduce the parasitic capacitance. However, if the cavity is not made thick for preventing the insulating film from entering the cavity, then a sufficient ability to reduce the parasitic capacitance is not achieved.

A first embodiment of the present invention will first be described below.

Figure 1A:
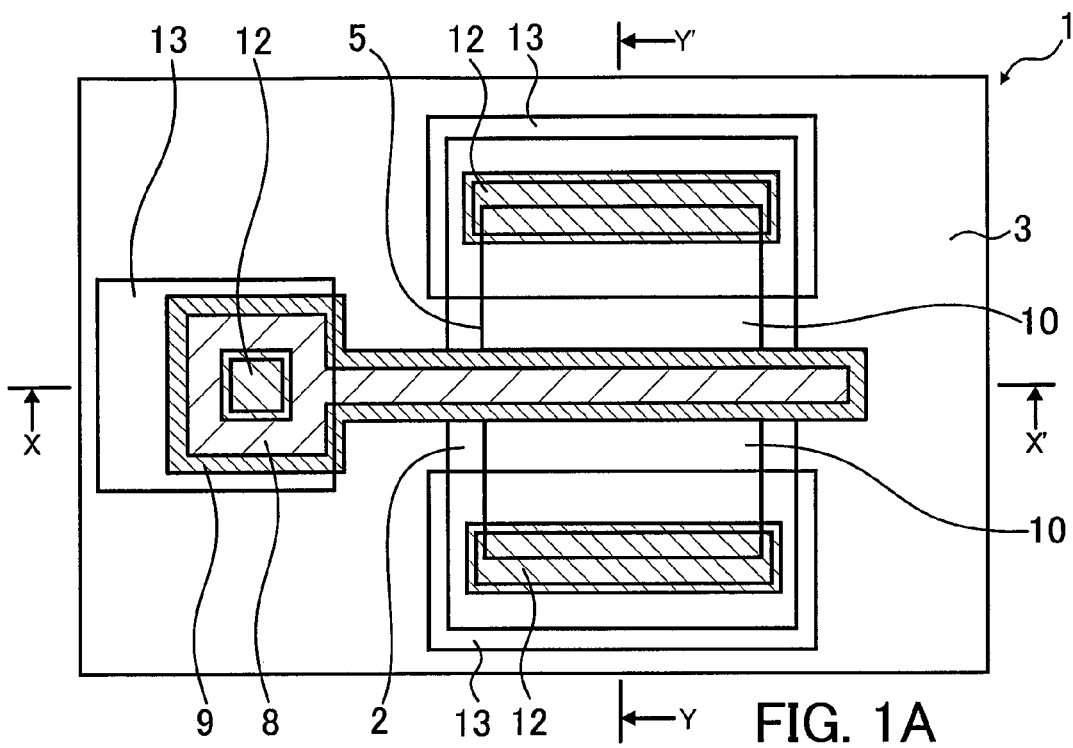
FIGS. 1A through 1C are views showing a semiconductor device according to a first example of a first embodiment of the present invention, FIG. 1A being a plan view of the semiconductor device, FIG. 1B a cross-sectional view taken along line X–X' of FIG. 1A, and FIG. 1C a cross-sectional view taken along line Y–Y' of FIG. 1A.
Figure 1B:
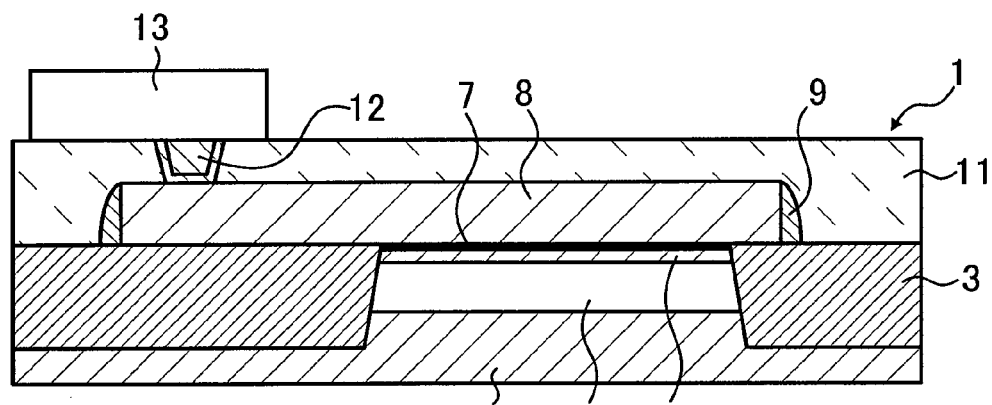
Figure 1C:
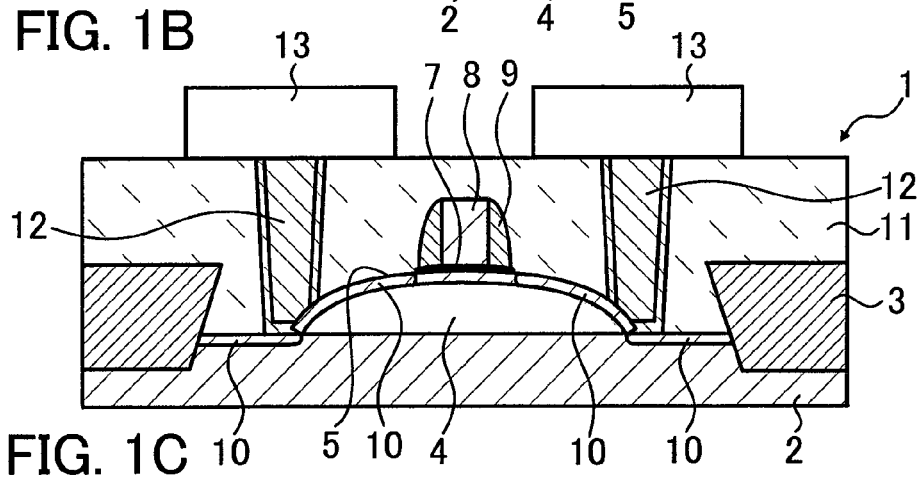

FIGS. 1A through 1C are views showing a semiconductor device according to a first example of a first embodiment of the present invention, FIG. 1A being a plan view of the semiconductor device, FIG. 1B a cross-sectional view taken along line X–X' of FIG. 1A, and FIG. 1C a cross-sectional view taken along line Y–Y' of FIG. 1A.

A semiconductor device 1 shown in FIGS. 1A, 1B, and 1C has a device-separating region 3 formed in an Si substrate 2 and surrounding a transistor forming region in which a cavity 4 is defined and a thin-film Si layer 5 is formed, as shown in FIGS. 1B and 1C. A gate insulating film 7 is formed on the surface of the thin-film Si layer 5. A gate electrode 8 is formed on the gate insulating film 7, and a side wall 9 is formed on side edges of the ate electrode 8. As shown in FIG. 1C, a source/drain 10 is formed on the Si substrate 2 and extends from the thin-film Si layer 5 to the Si substrate 2. Interconnection layers 13 are connected to the gate electrode 8 and the source/drain 10 by plugs 12 which extend through an interlayer insulating film 11. The interlayer insulating film 11 is omitted from illustration in FIG. 1A.

The thin-film Si layer 5 of the semiconductor device 1 is connected to the gate electrode 8 with the gate insulating film 8 interposed therebetween. As shown in FIG. 1C, the thin-film Si layer 5 is curved from the gate electrode 8 toward the Si substrate 2 in a substantially arcuate shape as viewed in a cross section taken along line Y–Y'. The thin-film Si layer 5 has ends in the direction of the gate length held in contact with the Si substrate 2 as shown in FIG. 1C. In the semiconductor device 1, the source/drain 10 is formed on the curved thin-film Si layer 5, providing a transistor channel directly below the gate electrode 8.

With the semiconductor device 1 thus constructed, the thin-film Si layer 5 is curved and hence is elongated to produce stresses, developing very large strains in the channel region directly below the gate electrode 8. While it has heretofore been customary to produce microscopic atomic-level strains in the channel region by changing lattice constants, the semiconductor device 1 according to the present invention has the thin-film Si layer 5 dynamically curved to develop large strains in the channel region. Large strains developed in the channel region drastically increase the carrier mobility. Furthermore, the cavity 4 is formed below the curved thin-film Si layer 5 to provide an SOI structure (so-called SON (Silicon On Nothing) structure) for reducing a parasitic capacitance due to a pn junction for increasing the high-speed performance of the transistor and reducing the power consumption thereof.

A method of manufacturing the semiconductor device 1 having the above structure will be described below by way of example with reference to FIGS. 2A through 15C. In FIGS. 2A through 15C, those elements which are identical to those shown in FIGS. 1A through 1C are denoted by identical reference numerals.

Figure 2A:
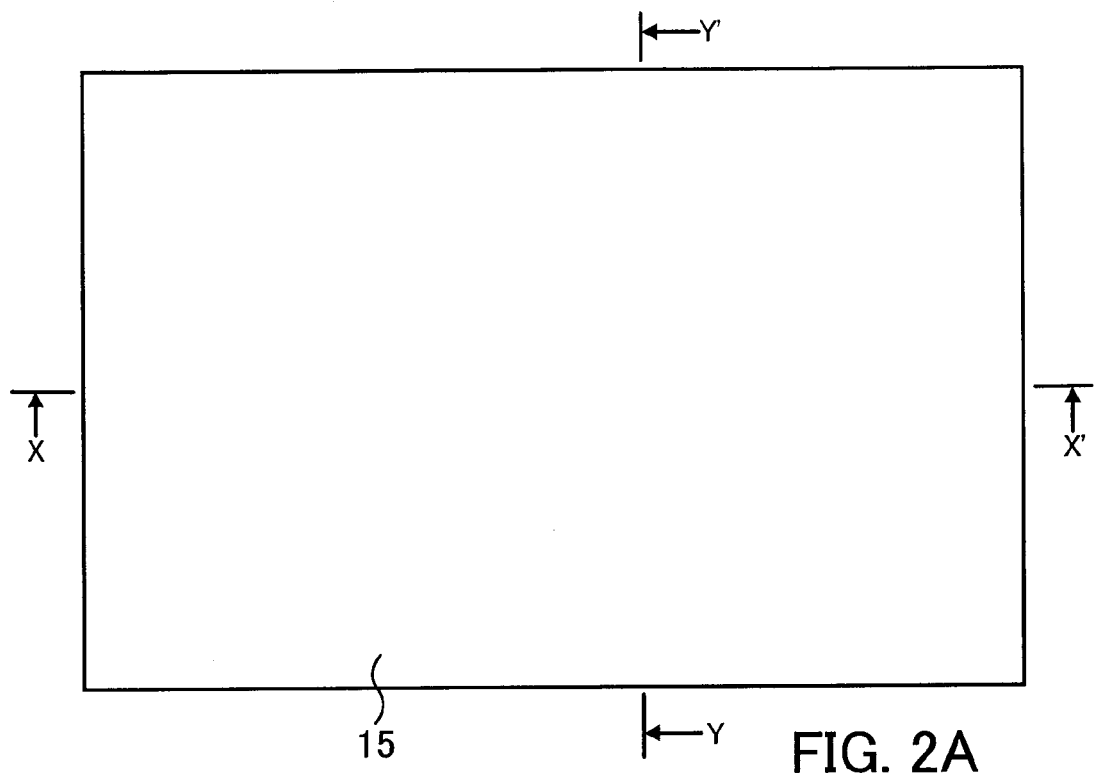
FIGS. 2A through 2C are views showing a first manufacturing step of manufacturing the semiconductor device according to the first example of the first embodiment of the present invention, FIG. 2A being a plan view, FIG. 2B a cross-sectional view taken along line X–X' of FIG. 2A, and FIG. 2C a cross-sectional view taken along line Y–Y' of FIG. 2A.
Figure 2B:
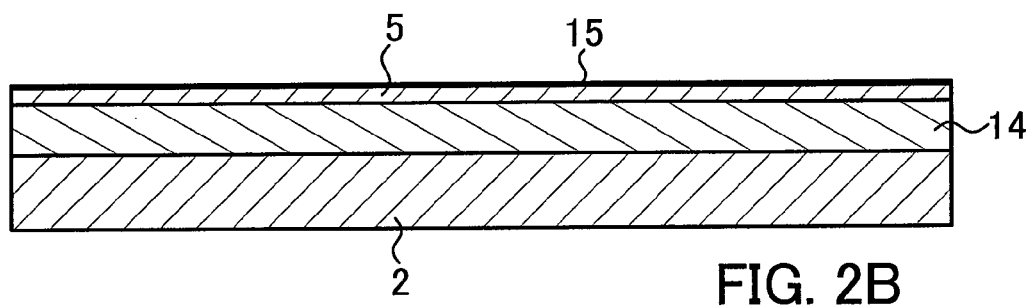
Figure 2C:
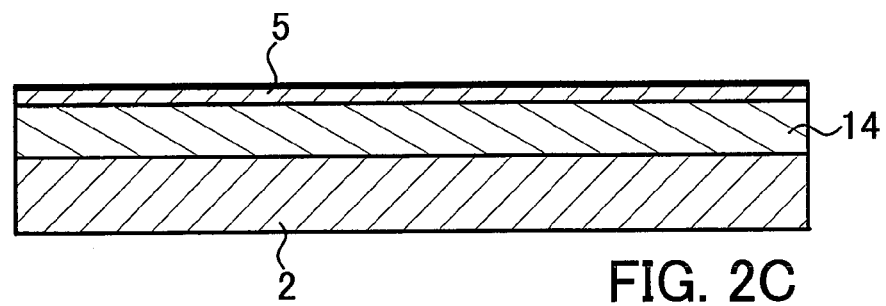

FIGS. 2A through 2C are views showing a first manufacturing step of manufacturing the semiconductor device according to the first example of the first embodiment of the present invention, FIG. 2A being a plan view, FIG. 2B a cross-sectional view taken along line X–X' of FIG. 2A, and FIG. 2C a cross-sectional view taken along line Y–Y' of FIG. 2A.

In the first manufacturing step, SiGe and Si are epitaxially grown to respective thicknesses on an Si substrate 2, forming a laminated substrate comprising the Si substrate 2, an SiGe layer 14 serving as a sacrificial layer, and a thin-film Si layer 5 as shown in FIGS. 2B and 2C. A thin insulating film 15 may be formed on the surface of the thin-film Si layer 5 after the thin-film Si layer 5 is formed, thus stabilizing the interface between the thin-film Si layer 5 and a gate insulating film 7 which will subsequently be formed on the thin-film Si layer 5. The insulating film 15 may be formed by exposing the surface of the thin-film Si layer 5 to the atmosphere. In the description which follows, it is assumed that the laminated substrate comprising the Si substrate 2, the SiGe layer 14, and the thin-film Si layer 5 includes the insulating layer 15 formed for the purpose of stabilizing the interface. Though the insulating film 15 may not necessarily be formed in the production of the semiconductor device 1, the semiconductor device 1 including the insulating film 15 will be described below.

Figure 3A:
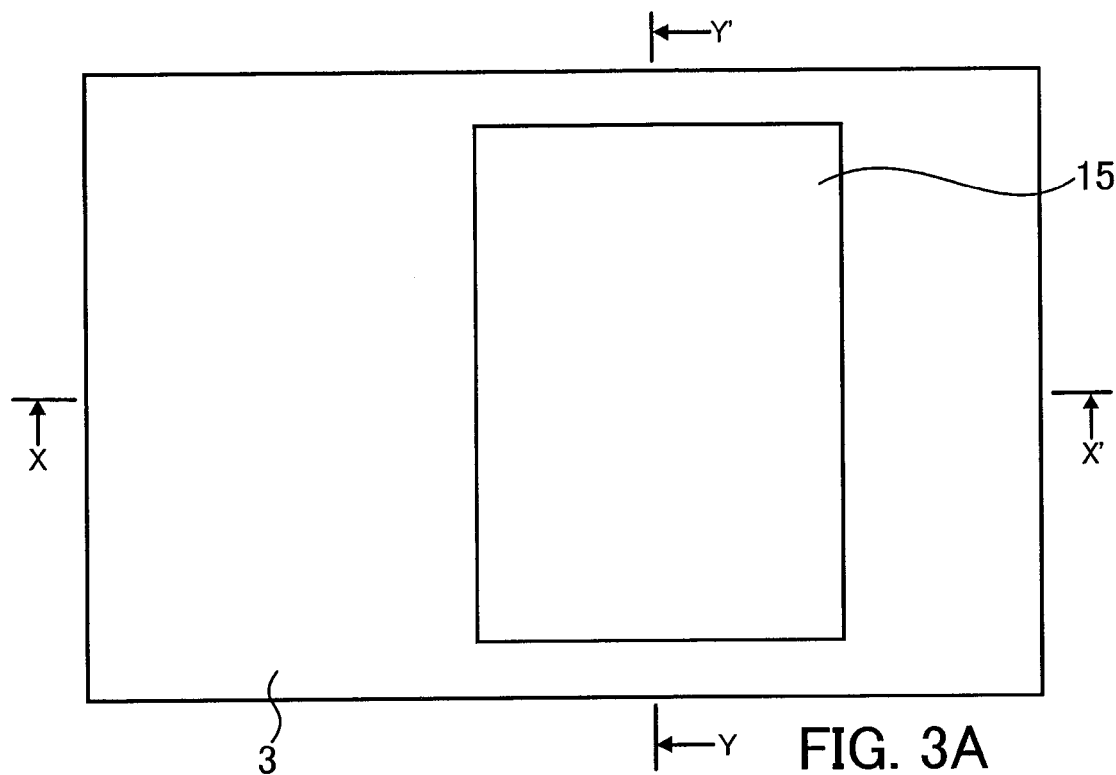
FIGS. 3A through 3C are views showing a second manufacturing step of manufacturing the semiconductor device according to the first example of the first embodiment of the present invention, FIG. 3A being a plan view, FIG. 3B a cross-sectional view taken along line X–X' of FIG. 3A, and FIG. 3C a cross-sectional view taken along line Y–Y' of FIG. 3A.
Figure 3B:
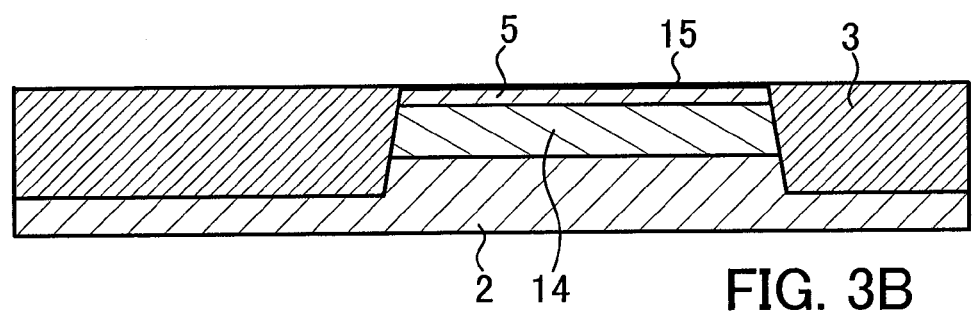
Figure 3C:
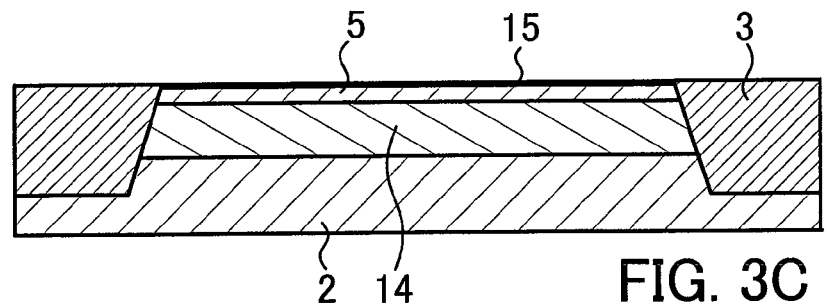

FIGS. 3A through 3C are views showing a second manufacturing step of manufacturing the semiconductor device according to the first example of the first embodiment of the present invention, FIG. 3A being a plan view, FIG. 3B a cross-sectional view taken along line X–X' of FIG. 3A, and FIG. 3C a cross-sectional view taken along line Y–Y' of FIG. 3A.

In the second manufacturing step, a trench extending into the Si substrate 2 is formed, and $SiO_2$ or the like is deposited in the trench and planarized to form a device separating region 3. A region surrounded by the device separating region 3 as shown in FIGS. 3A, 3B, and 3C serves as a transistor forming region of the semiconductor device 1.

Figure 4A:
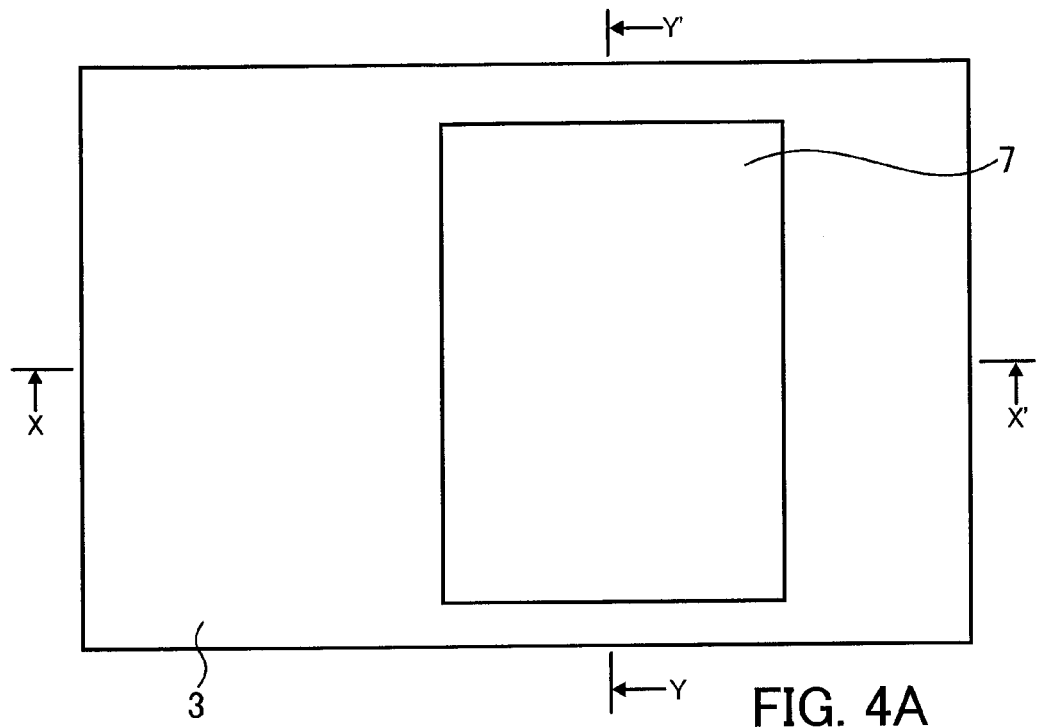
FIGS. 4A through 4C are views showing a third manufacturing step of manufacturing the semiconductor device according to the first example of the first embodiment of the present invention, FIG. 4A being a plan view, FIG. 4B a cross-sectional view taken along line X–X' of FIG. 4A, and FIG. 4C a cross-sectional view taken along line Y–Y' of FIG. 4A.
Figure 4B:
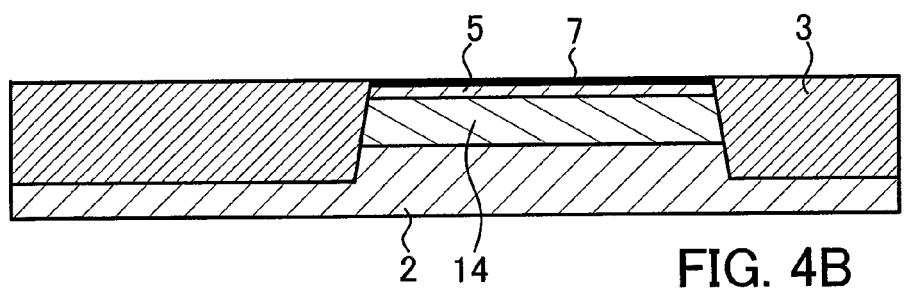
Figure 4C:
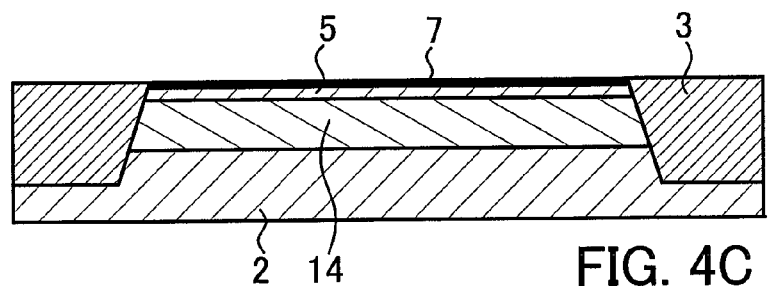

FIGS. 4A through 4C are views showing a third manufacturing step of manufacturing the semiconductor device according to the first example of the first embodiment of the present invention, FIG. 4A being a plan view, FIG. 4B a cross-sectional view taken along line X–X' of FIG. 4A, and FIG. 4C a cross-sectional view taken along line Y–Y' of FIG. 4A.

In the third manufacturing step, the thin-film Si layer 5 is oxidized or nitrided to form a gate insulating film 7 as shown in FIGS. 4A, 4B, and 4C. The gate insulating film 7 may be formed, rather than by oxidizing or nitriding the thin-film Si layer 5, by depositing a high-dielectric-constant material (high-k material) such as aluminum oxide ($Al_2O_3$), hafnium oxide ($HfO_2$), zirconium oxide ($ZrO_2$), or the like according to CVD. In the description which follows, if the insulating film 15 is formed on the surface of the thin-film Si layer 5, then the gate insulating film 7 is assumed to include the insulating film 15.

Figure 5A:
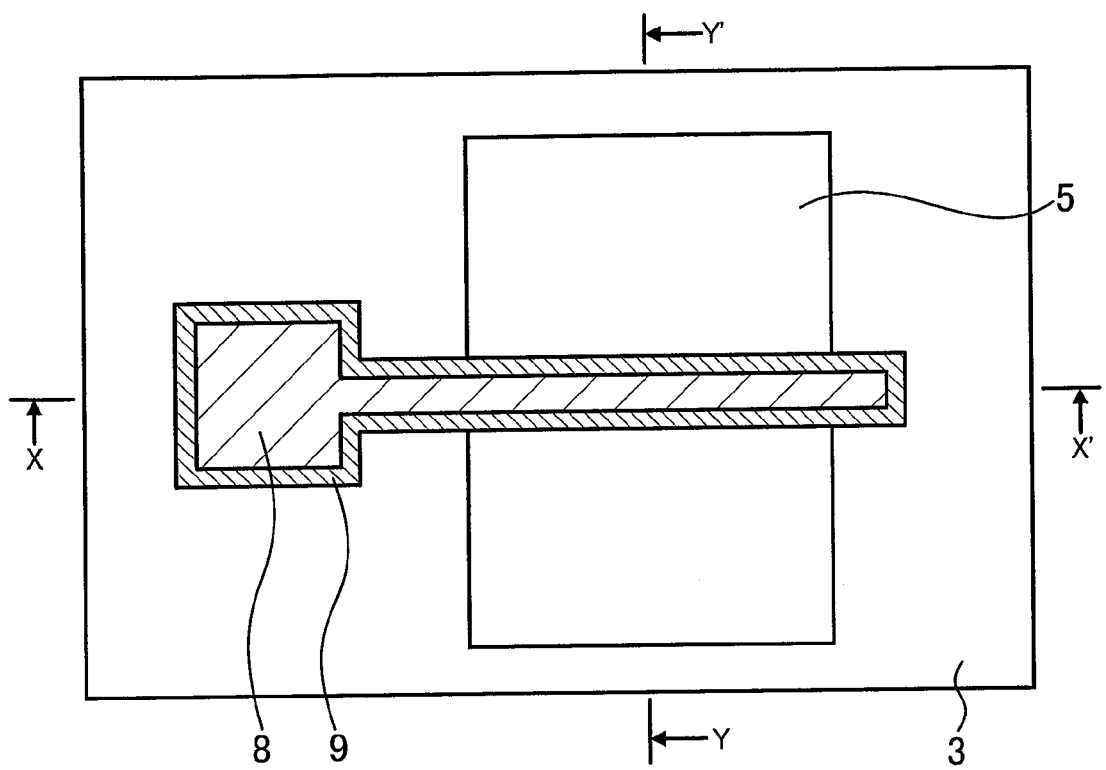
FIGS. 5A through 5C are views showing a fourth manufacturing step of manufacturing the semiconductor device according to the first example of the first embodiment of the present invention, FIG. 5A being a plan view, FIG. 5B a cross-sectional view taken along line X–X' of FIG. 5A, and FIG. 5C a cross-sectional view taken along line Y–Y' of FIG. 5A.
Figure 5B:
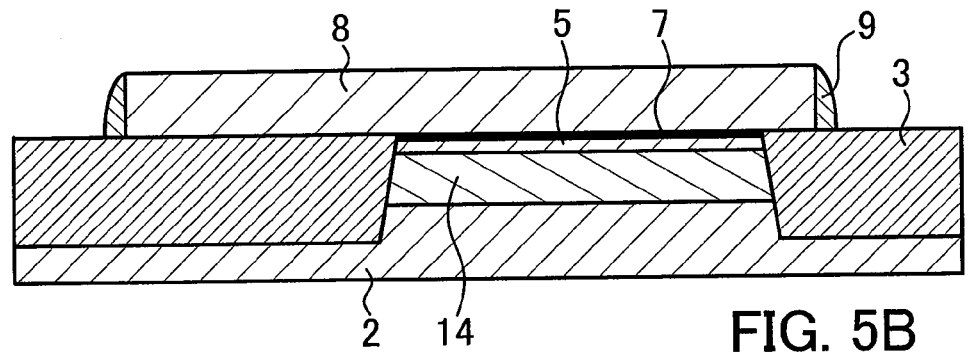
Figure 5C:
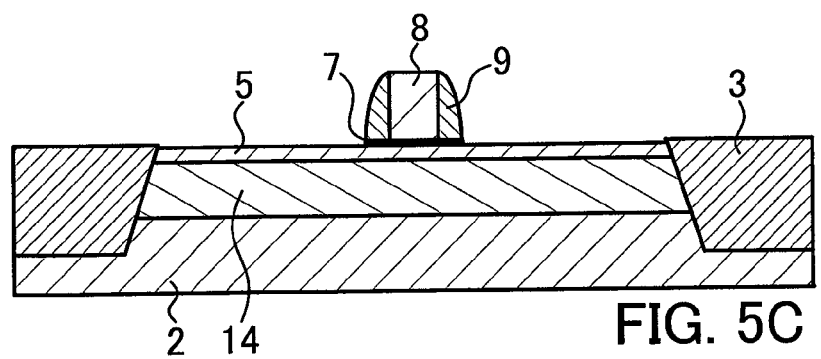

FIGS. 5A through 5C are views showing a fourth manufacturing step of manufacturing the semiconductor device according to the first example of the first embodiment of the present invention, FIG. 5A being a plan view, FIG. 5B a cross-sectional view taken along line X–X' of FIG. 5A, and FIG. 5C a cross-sectional view taken along line Y–Y' of FIG. 5A.

In the fourth manufacturing step, a gate electrode 8 and a side wall 9 are formed. For example, after polysilicon (poly-Si) is formed on the entire surface by CVD, the assembly is anisotropically etched using a resist pattern formed by photolithography as a mask, forming the gate electrode 8. Then, using the gate electrode 8 as a mask, ions are introduced by ion implantation, forming an LDD region (or an extension region). For forming the LDD region, boron ions ($B^+$) or phosphorus ions ($P^+$) are introduced into the thin-film Si layer 5 under the conditions of an acceleration energy of 5 keV and a dose of $4 \times 10^{14}$ $cm^{-2}$. Thereafter, silicon nitride (SiN) or the like is deposited on the entire surface by CVD, and then anisotropically etched to form the side wall 9 on the side edges of the gate electrode 8. The assembly is then processed by wet etching or the like to remove the exposed gate insulating film 7. The gate insulating film 7 may not necessarily be removed at this time, but may be removed at least until plugs will be formed.

Figure 6A:
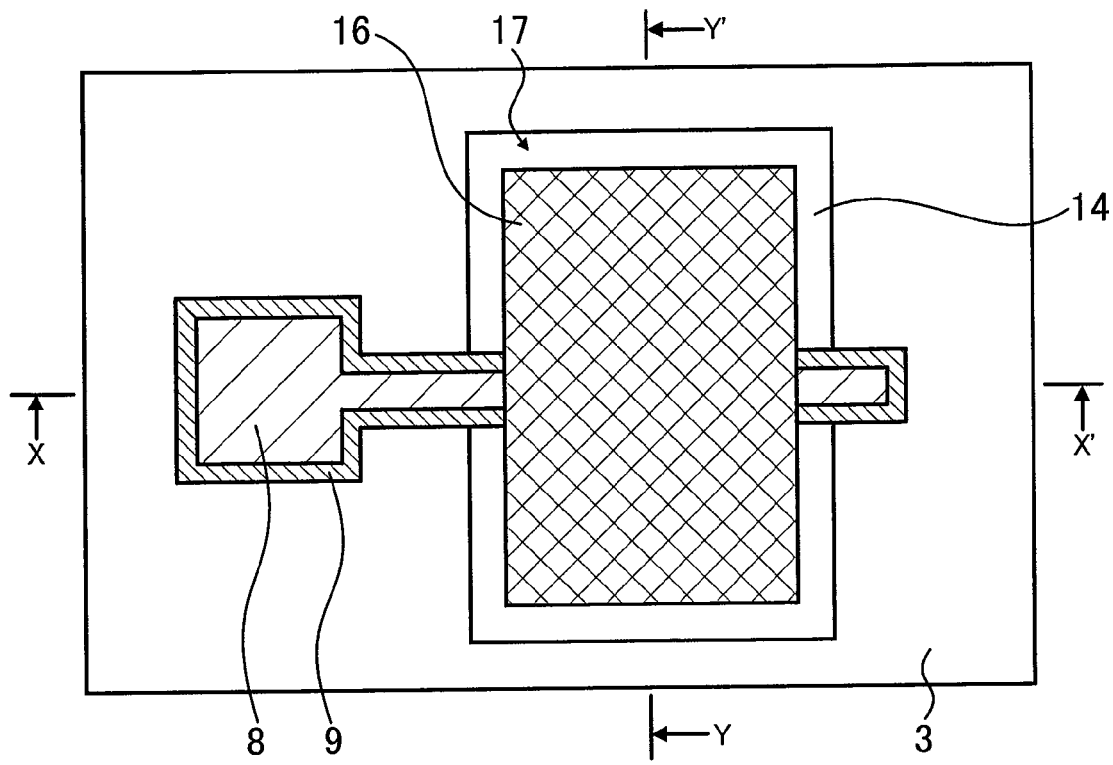
FIGS. 6A through 6C are views showing a fifth manufacturing step of manufacturing the semiconductor device according to the first example of the first embodiment of the present invention, FIG. 6A being a plan view, FIG. 6B a cross-sectional view taken along line X–X' of FIG. 6A, and FIG. 6C a cross-sectional view taken along line Y–Y' of FIG. 6A.
Figure 6B:
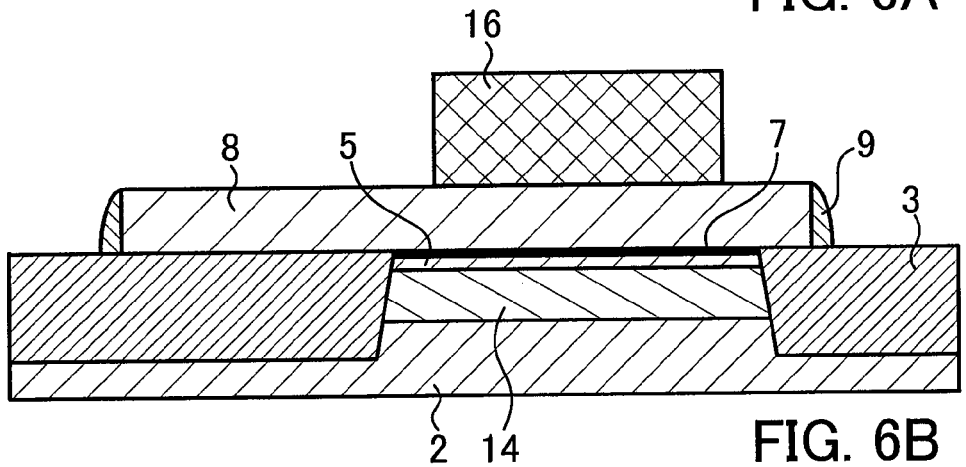
Figure 6C:
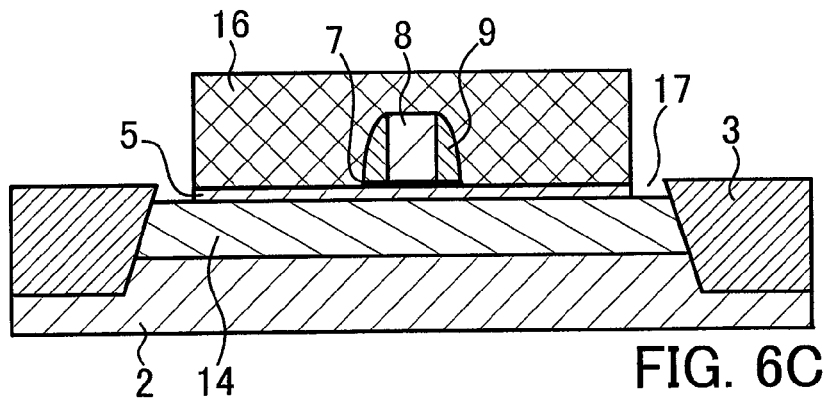

FIGS. 6A through 6C are views showing a fifth manufacturing step of manufacturing the semiconductor device according to the first example of the first embodiment of the present invention, FIG. 6A being a plan view, FIG. 6B a cross-sectional view taken along line X–X' of FIG. 6A, and FIG. 6C a cross-sectional view taken along line Y–Y' of FIG. 6A.

In the fifth manufacturing step, a resist pattern 16 is formed over the gate electrode 8 within the device separating region 3 by photolithography as shown in FIGS. 6A, 6B, and 6C. At this time, it is important that the resist pattern 16 be separate from the surrounding device separating region 3 and formed on the gate electrode 8. After the resist pattern 16 is formed, the thin-film Si layer 5 is etched using the resist pattern 6 as a mask, exposing the SiGe layer 14 to form an opening 17 between the device separating region 3 and the thin-film Si layer 5.

Figure 7A:
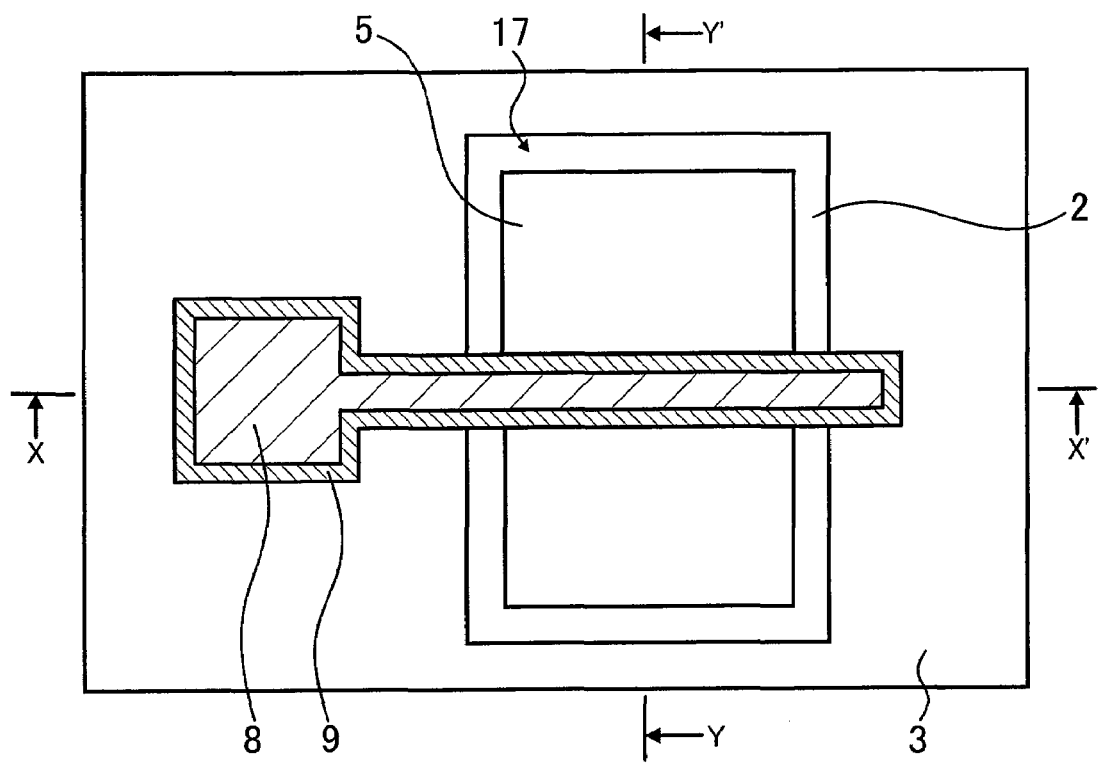
FIGS. 7A through 7C are views showing a sixth manufacturing step of manufacturing the semiconductor device according to the first example of the first embodiment of the present invention, FIG. 7A being a plan view, FIG. 7B a cross-sectional view taken along line X–X' of FIG. 7A, and FIG. 7C a cross-sectional view taken along line Y–Y' of FIG. 7A.
Figure 7B:
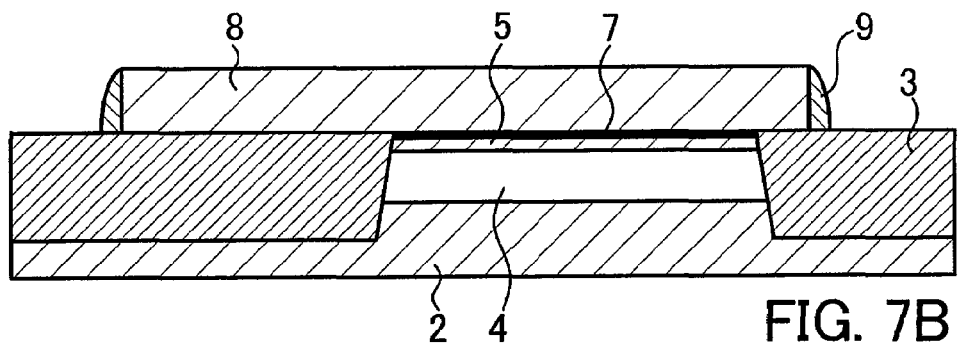
Figure 7C:
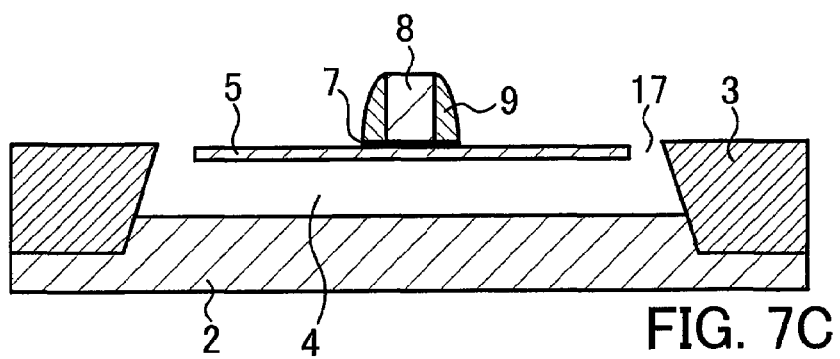

FIGS. 7A through 7C are views showing a sixth manufacturing step of manufacturing the semiconductor device according to the first example of the first embodiment of the present invention, FIG. 7A being a plan view, FIG. 7B a cross-sectional view taken along line X–X' of FIG. 7A, and FIG. 7C a cross-sectional view taken along line Y–Y' of FIG. 7A.

In the sixth manufacturing step, the SiGe layer 14 as the sacrificial layer is selectively removed by wet etching as shown in FIGS. 7A, 7B, and 7C. For performing the wet etching, an etching liquid is introduced from the opening 17 shown in FIGS. 6A and 6C, removing only the SiGe layer 14 through the opening 17. In this manner, a cavity 4 is formed below the thin-film Si layer 5. After the wet etching, the resist pattern 16 is removed. The etching liquid may comprise a mixed solution of 50% hydrogen fluoride (HF), hydrogen peroxide ($H_2O_2$), and acetic acid ($CH_2COOH$) at a weight ratio of 1:16:24. The thin-film Si layer 5 which is left after the wet etching remains connected to the gate electrode 8 with the gate insulating film 7 interposed therebetween, and does not fall toward the Si substrate 2.

Figure 8A:
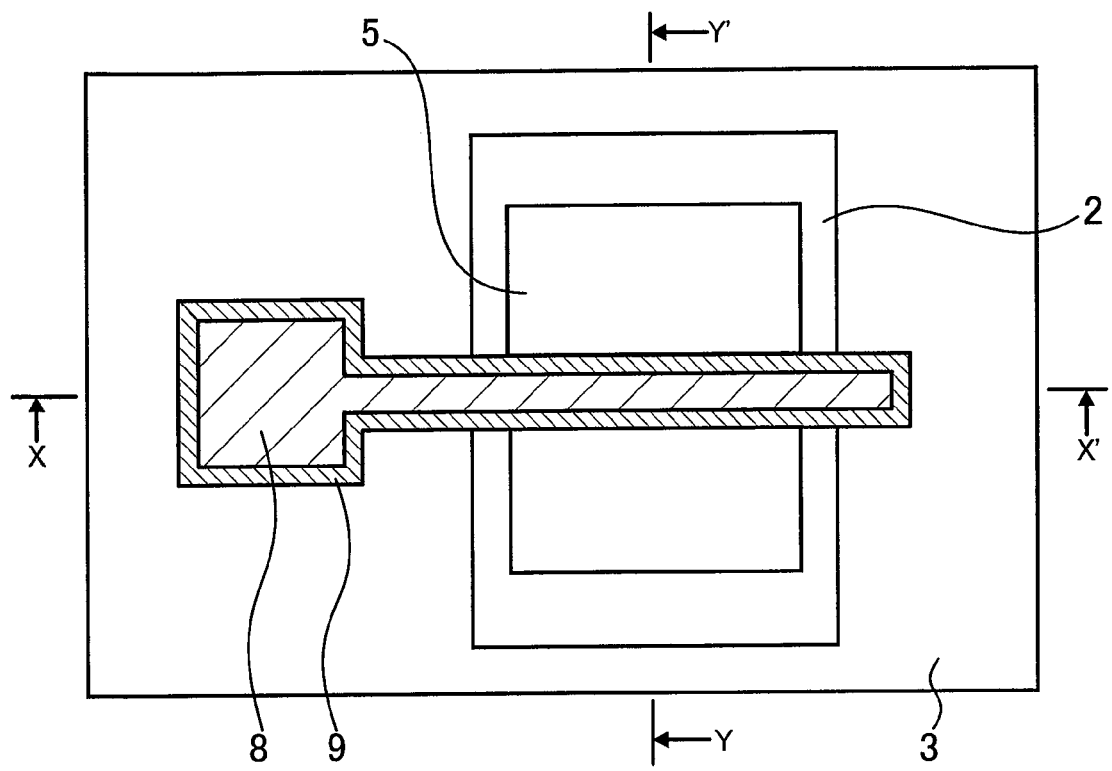
FIGS. 8A through 8C are views showing a seventh manufacturing step of manufacturing the semiconductor device according to the first example of the first embodiment of the present invention, FIG. 8A being a plan view, FIG. 8B a cross-sectional view taken along line X–X' of FIG. 8A, and FIG. 8C a cross-sectional view taken along line Y–Y' of FIG. 8A.
Figure 8B:
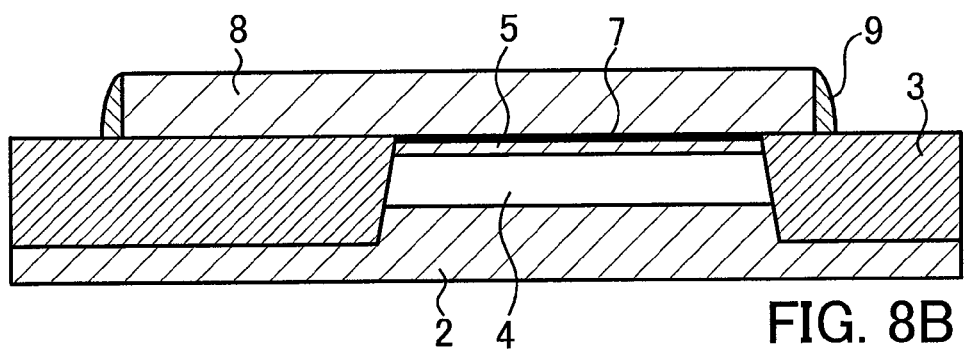
Figure 8C:
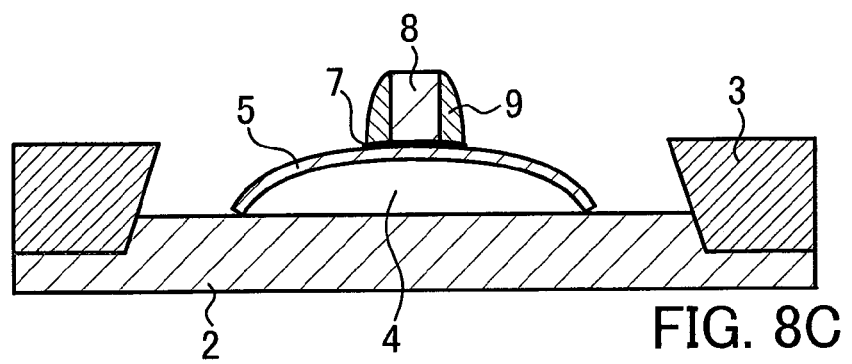

FIGS. 8A through 8C are views showing a seventh manufacturing step of manufacturing the semiconductor device according to the first example of the first embodiment of the present invention, FIG. 8A being a plan view, FIG. 8B a cross-sectional view taken along line X–X' of FIG. 8A, and FIG. 8C a cross-sectional view taken along line Y–Y' of FIG. 8A.

In the seventh manufacturing step, the thin-film Si layer 5 is curved to develop strains therein. Processes of curving the thin-film Si layer 5 will be described below. The thin-film Si layer 5 may be curved by a process which utilizes a surface tension produced when the assembly is processed in a wet environment, a process which utilizes a film (thermally elongatable film) having different stresses from the thin-film Si layer 5, a process which utilizes a heat treatment after ion implantation, a process which utilizes a laser beam application, or a process which utilizes the ejection of a fluid such as a gas or a liquid.

In FIGS. 8A through 8C, the thin-film Si layer 5 is curved by the process which utilizes a surface tension produced when the assembly is processed in a wet environment in the seventh manufacturing step. According to the process which utilizes a surface tension, when the SiGe layer 14 is selectively removed by the wet etching in the sixth manufacturing step, the thin-film Si layer 5 is curved by a surface tension acting between the thin-film Si layer 5 is curved and the Si substrate 2 at the time the etching liquid is washed by water and the assembly is lifted out of the water.

According this process, after the SiGe layer 14 is removed through the opening 17 by the wet etching, the assembly is immersed in pure water to wash away the etching liquid attached to the assembly. After the assembly is washed by the pure water, the assembly is immersed in an aqueous solution of nitric acid. When the assembly is immersed in the aqueous solution of nitric acid, the surfaces of the Si substrate 2 and the thin-film Si layer 5 are slightly oxidized and become hydrophilic. After the assembly is immersed in the aqueous solution of nitric acid, the assembly is immersed again in pure water to wash away the nitric acid. Then, the assembly is slowly lifted out of the pure water. At this time, a surface tension acts between the Si substrate 2 and the thin-film Si layer 5. Since the thin-film Si layer 5 is connected to the gate electrode 8, the thin-film Si layer 5 is curved from its portion directly underneath the gate electrode 8 in a substantially arcuate cross-sectional shape as shown in FIG. 8C, for example. As a result, the thin-film Si layer 5 is strained with the cavity 4 formed therebelow. Thereafter, the assembly is dried with heat to remove water therefrom. Once the thin-film Si layer 5 is curved, its ends are bonded to the Si substrate 2 under interatomic forces, so that the thin-film Si layer 5 will not easily restore its original shape even when it is dried. Thereafter, the processing goes to an eighth manufacturing step to be described later on.

If the thin-film Si layer 5 is curved by the process which utilizes a surface tension produced when the assembly is processed in a wet environment, then ions may be introduced for forming the LDD region after the gate electrode 8 is formed in the fourth manufacturing step, the side wall 9 may be formed, and the gate insulating film 7 may be partly removed, all after the thin-film Si layer 5 is curved. Specifically, after the gate electrode 8 is formed in the fourth manufacturing step, the thin-film Si layer 5 may be curved by a surface tension, and thereafter ions may be introduced for forming the LDD region, the side wall 9 may be formed, and the gate insulating film 7 may be partly removed.

Other processes of curving the thin-film Si layer 5 will be described below.

Figure 9A:
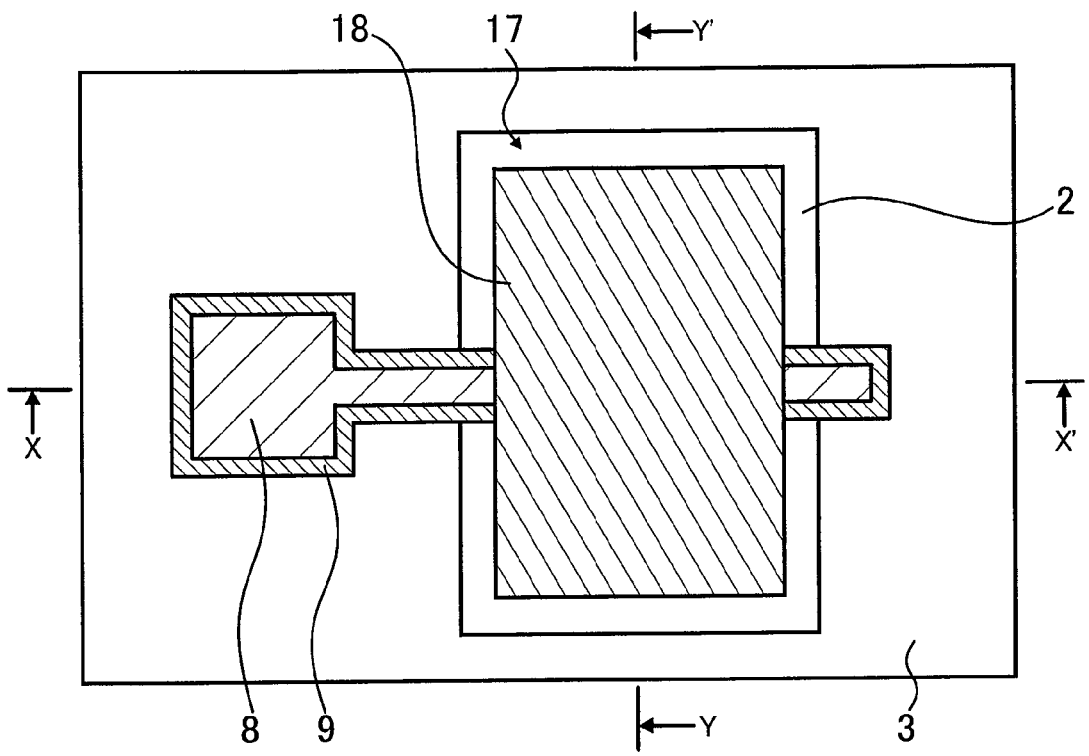
FIGS. 9A through 9C are first views illustrative of a step of curving a thin-film Si layer using a thermally elongatable film, FIG. 9A being a plan view, FIG. 9B a cross-sectional view taken along line X–X' of FIG. 9A, and FIG. 9C a cross-sectional view taken along line Y–Y' of FIG. 9A.
Figure 9B:
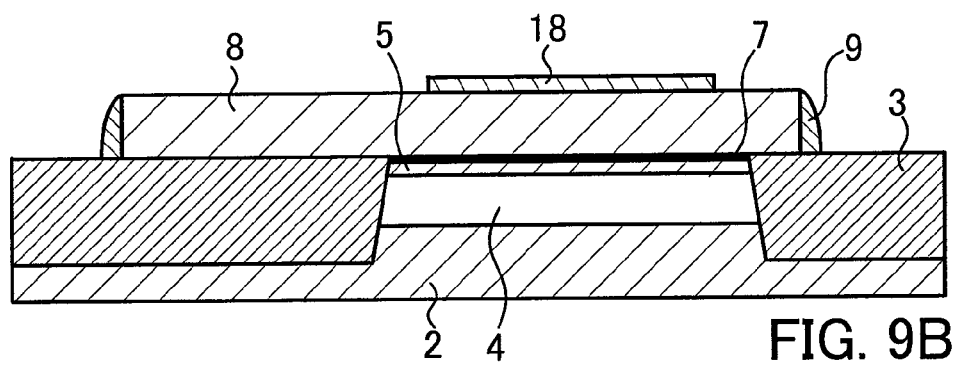
Figure 9C:
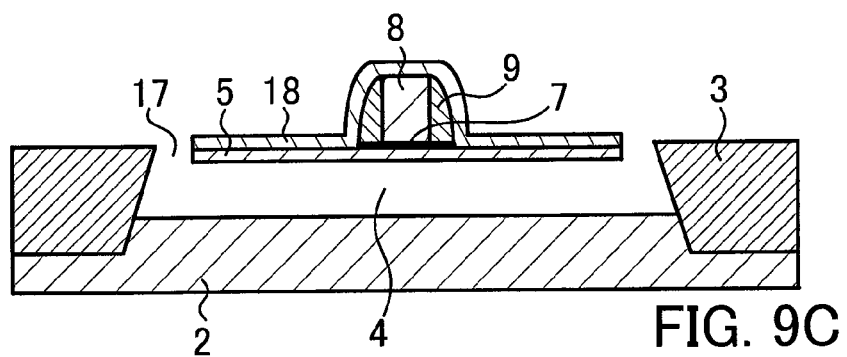
Figure 10A:
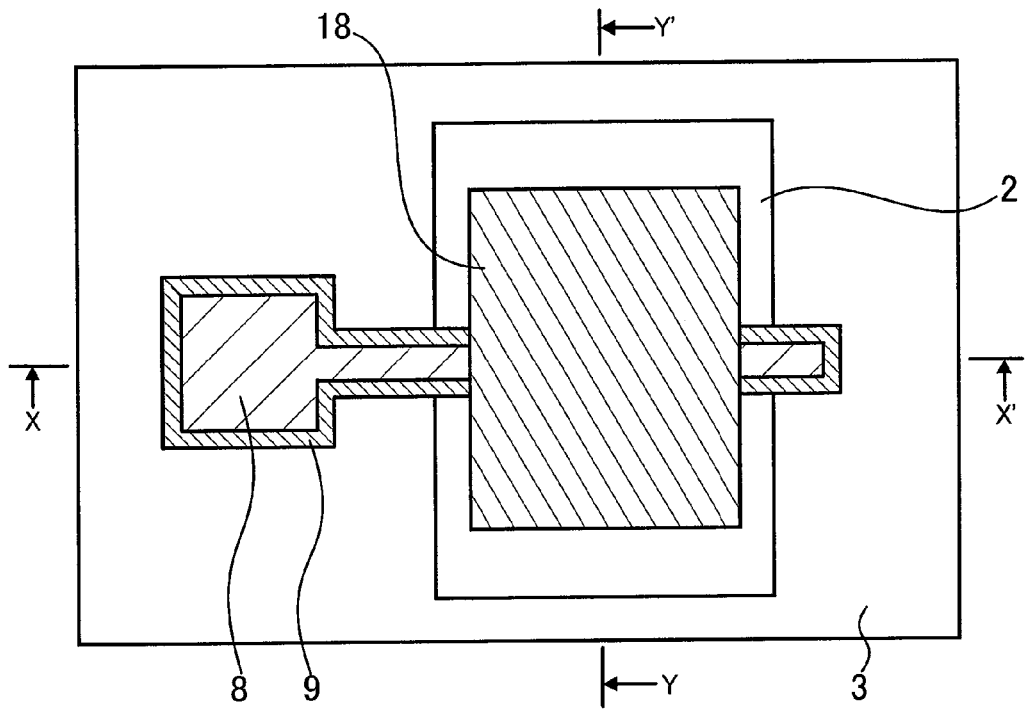
FIGS. 10A through 10C are second views illustrative of the step of curving the thin-film Si layer using the thermally elongatable film, FIG. 10A being a plan view, FIG. 10B a cross-sectional view taken along line X–X' of FIG. 10A, and FIG. 10C a cross-sectional view taken along line Y–Y' of FIG. 10A.
Figure 10B:
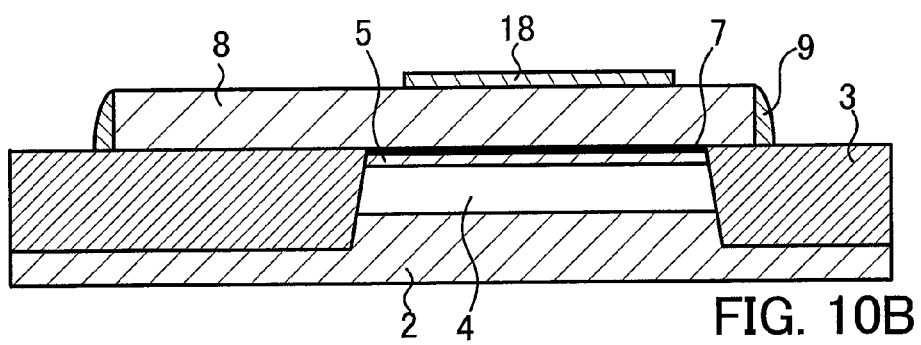
Figure 10C:
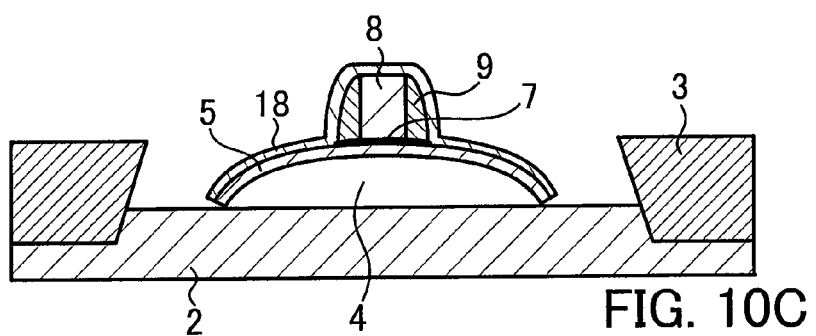

The process which utilizes a thermally elongatable film will be described below with reference to FIGS. 9A through 9C and 10A through 10C. FIGS. 9A through 9C are first views illustrative of a step of curving a thin-film Si layer using a thermally elongatable film, FIG. 9A being a plan view, FIG. 9B a cross-sectional view taken along line X–X' of FIG. 9A, and FIG. 9C a cross-sectional view taken along line Y–Y' of FIG. 9A. FIGS. 10A through 10C are second views illustrative of the step of curving the thin-film Si layer using the thermally elongatable film, FIG. 10A being a plan view, FIG. 10B a cross-sectional view taken along line X–X' of FIG. 10A, and FIG. 10C a cross-sectional view taken along line Y–Y' of FIG. 10A.

According to this process, the thin-film Si layer 5 is curved using an SiN film 18 shown in FIGS. 9A, 9B, and 9C as a thermally elongatable film, developing strains in the thin-film Si layer 5. Specifically, after the gate electrode 8 and the side wall 9 are formed and the gate insulating film 7 is partly removed in the fourth manufacturing step, the SiN film 18 is formed as a protective film on the entire surface of the assembly. The gate insulating film 7 may not necessarily be removed at this time, but may be removed at least until plugs will be formed. The SiN film 18 is formed so as to have tensile stresses by adjusting a film growing gas, a gas pressure, a gas mixture ratio, a film growing temperature, an applied voltage, etc. For example, an SiN film 18 having a film thickness of 30 nm and a tensile stress ranging from 12 dyn/cm$^2$ to 18 dyn/cm$^2$ (1 dyn=0.1 N) is formed from a film growing gas of silane (SiH$_4$) and ammonia (NH$_3$) at 900° C. under 760 Torr (1 Torr=133 Pa). Such a film growing process is referred to as a high-temperature CVD process. An SiN film 18 having a tensile stress may also be formed under optimized conditions according to a plasma CVD process, an optical CVD process, a laser CVD process, or the like.

After the SiN film 18 is formed, the assembly is processed in a manner similar to the fifth and sixth manufacturing steps. Specifically, after the SiN film 18 is formed, a resist pattern 16 is formed on the SiN film 18. Using the resist pattern 16 as a mask, the SiN film 18 and the thin-film Si layer 5 are etched to form an opening 17 through which the SiGe layer 14 is exposed. Then, the SiGe layer 14 is selectively removed by wet etching, thus forming a cavity 4 beneath the thin-film Si layer 5 as shown in FIGS. 9A, 9B, and 9C. Thereafter, the assembly is heated at 1000° C. for about 1 second, for example. As a result, as shown in FIGS. 10A, 10B, and 10C, the SiN film 18 is thermally elongated, bending the thin-film Si layer 5 under its stresses thereby to strain the thin-film Si layer 5. Thereafter, the processing goes to an eighth manufacturing step to be described later on.

Figure 11A:
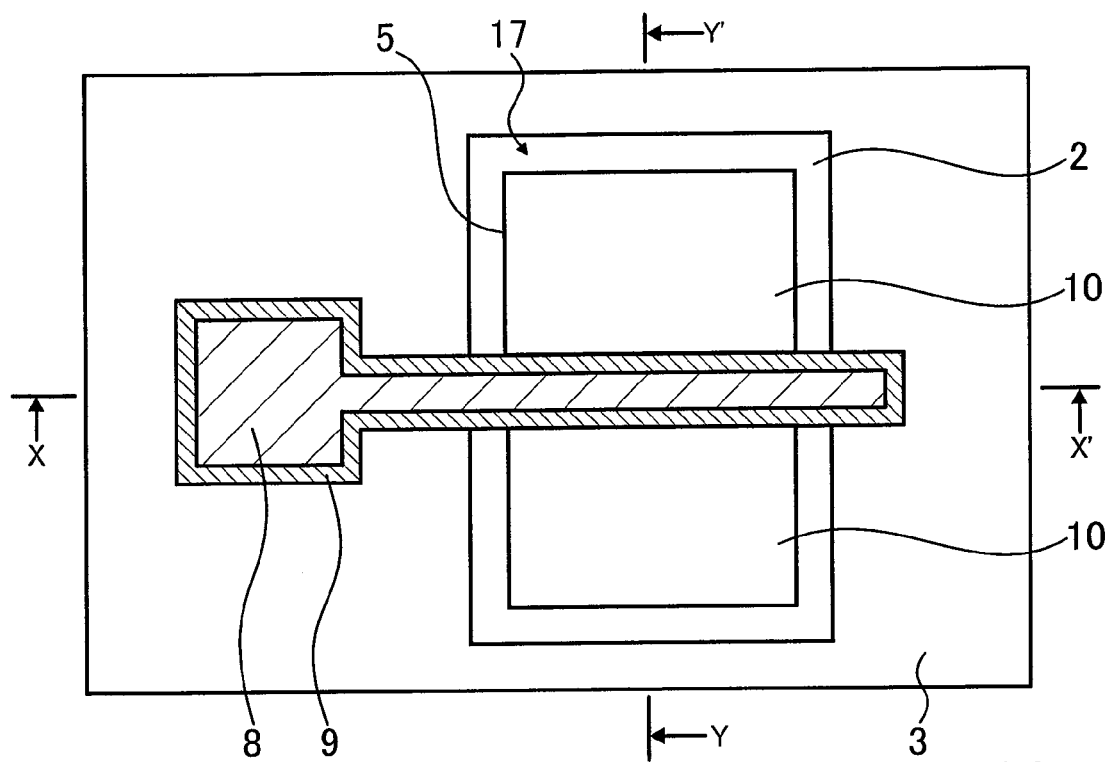
FIGS. 11A through 11C are first views illustrative of a step of curving a thin-film Si layer using ion implantation, FIG. 11A being a plan view, FIG. 11B a cross-sectional view taken along line X–X' of FIG. 11A, and FIG. 11C a cross-sectional view taken along line Y–Y' of FIG. 11A.
Figure 11B:
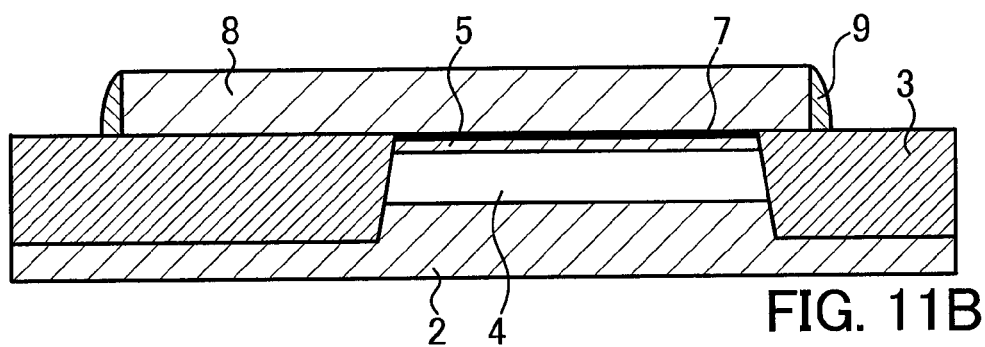
Figure 11C:
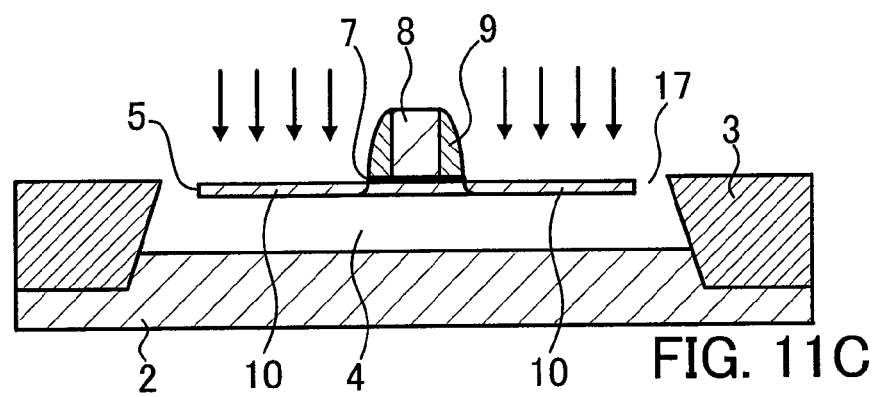
Figure 12A:
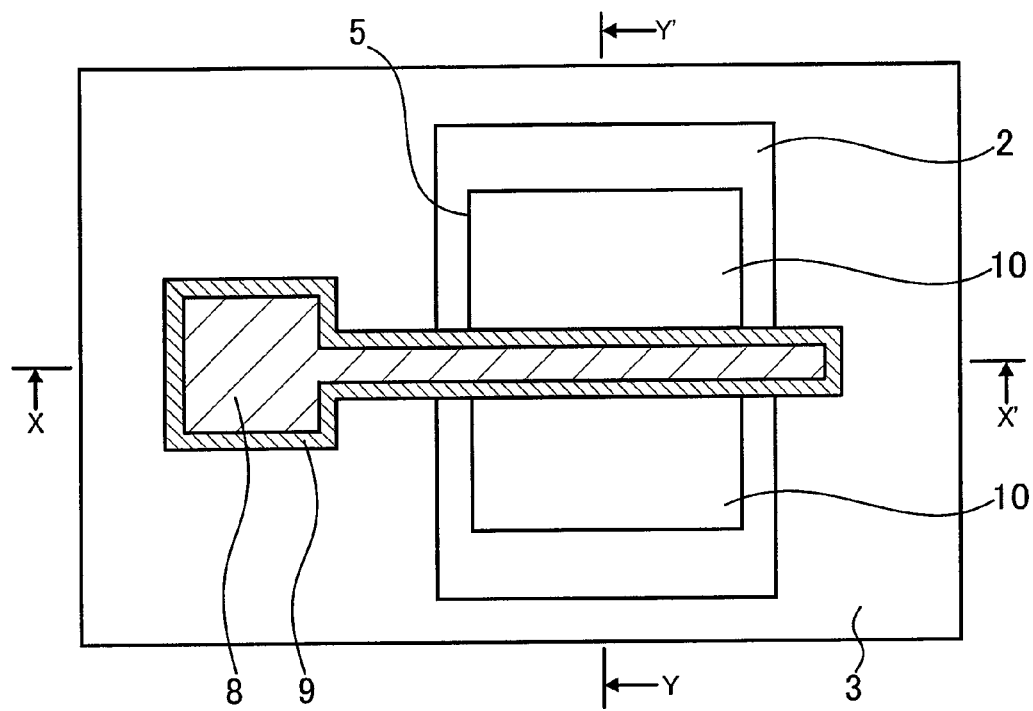
FIGS. 12A through 12C are second views illustrative of the step of curving the thin-film Si layer using ion implantation, FIG. 12A being a plan view, FIG. 12B a cross-sectional view taken along line X–X' of FIG. 12A, and FIG. 12C a cross-sectional view taken along line Y–Y' of FIG. 12A.
Figure 12B:
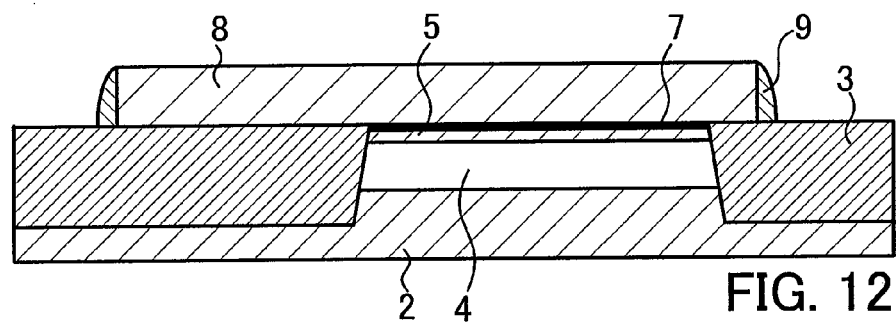
Figure 12C:
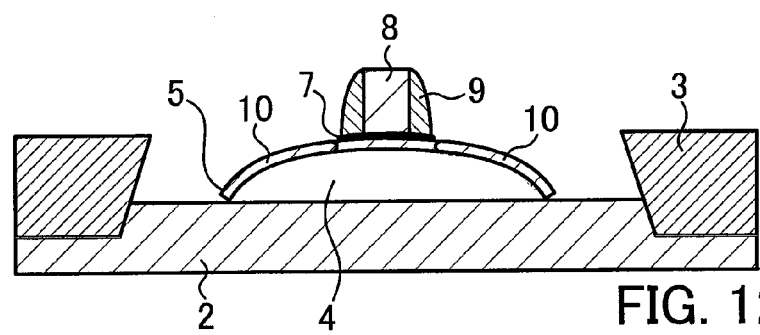

A process which utilizes ion implantation will be described below with reference to FIGS. 11A through 11C and 12A through 12C. FIGS. 11A through 11C are first views illustrative of a step of curving a thin-film Si layer using ion implantation, FIG. 11A being a plan view, FIG. 11B a cross-sectional view taken along line X–X' of FIG. 11A, and FIG. 11C a cross-sectional view taken along line Y–Y' of FIG. 11A. FIGS. 12A through 12C are second views illustrative of the step of curving the thin-film Si layer using ion implantation, FIG. 12A being a plan view, FIG. 12B a cross-sectional view taken along line X–X' of FIG. 12A, and FIG. 12C a cross-sectional view taken along line Y–Y' of FIG. 12A.

According to this process, the thin-film Si layer 5 is curved to develop strains therein by utilizing ion implantation for forming the source/drain 10. Specifically, after ions are introduced to form the LDD region, the side wall 9 is formed, and the gate insulating film 7 is partly removed in the fourth manufacturing step, ions are introduced to form the source/drain 10. For forming the source/drain 10, boron ions (B$^+$) or phosphorus ions (P$^+$) are introduced under the conditions of an acceleration energy of 20 keV and a dose of 5×10$^{15}$ cm$^{-2}$. The thin-film Si layer 5 and the SiGe layer 14 in the region where the ions are introduced have their crystal fully or partly broken (amorphous state) depending on the dose. This crystal state has a crystal defect distribution in the direction of the depth of the Si substrate 2 and the thin-film Si layer 5. Generally, the Si substrate 2 and the thin-film Si layer 5 have such a crystal defect distribution that there are more crystal defects in a shallow region of the thin-film Si layer 5 near the surface thereof, progressively fewer crystal defects in a deeper region of the thin-film Si layer 5, more crystal defects in a shallow region of the SiGe layer 14 beneath the thin-film Si layer 5, and fewer crystal defects in a deeper region of the SiGe layer 14. Usually, after the ion implantation, the assembly is heated to remove crystal defects and activate impurities. In this example, the SiGe layer 14 is removed before the assembly is heated.

Specifically, after the ion implantation for forming the source/drain 10, a resist pattern 16 is formed in a manner similar to the fifth and sixth manufacturing steps, and using the resist pattern 16 as a mask, an opening 17 is formed through which the SiGe layer 14 is exposed. The SiGe layer 14 is selectively removed by wet etching, thus forming a cavity 4 beneath the thin-film Si layer 5 as shown in FIGS. 11A, 11B, and 11C. At this time, the crystal defects in the thin-film Si layer 5 have such a distribution that there are more crystal defects in a shallow region of the thin-film Si layer 5 near the surface thereof and progressively fewer in a deeper region of the thin-film Si layer 5 which is closer to the Si substrate 2.

Then, the assembly is heated at 1030° C. for 1 second, for example, primarily for the purpose of removing crystal defects and activating impurities. As a result, the thin-film Si layer 5 whose crystal has been broken by the ion implantation is recrystallized. At this time, the thin-film Si layer 5 has its volume changed. The volume change depends on the crystal state before the assembly is heated, such that the volume is expanded greatly particularly near the surface where the crystal is broken to a large extent. Therefore, as shown in FIGS. 12A, 12B, and 12C, the thin-film Si layer 5 is curved to develop strains therein. Thereafter, the processing goes to an eighth manufacturing step to be described later on.

While ions are introduced to form the source/drain 10 prior to the removal of the SiGe layer 14 in the above process, the ions may be introduced after the SiGe layer 14 is removed to form the cavity 4 (after the sixth manufacturing step). Specifically, after the ion implantation, the assembly may be heated to curve the thin-film Si layer 5 and activate impurities to form the source/drain 10.

In the above process, the thin-film Si layer 5 is curved by using the ion implantation process for forming the source/drain 10. However, the thin-film Si layer 5 may be curved by an ion implantation process which is separate from the ion implantation process for forming the source/drain 10. Specifically, ions as of Argon (Ar), nitrogen (N), or the like are introduced into the thin-film Si layer 5 before or after the removal of the SiGe layer 14. With these ions introduced, the thin-film Si layer 5 in the region where the ions are introduced has its crystal partly or fully broken. After the ion implantation, the SiGe layer 14 is removed, and the assembly is heated to curve the thin-film Si layer 5.

The process which utilizes a laser beam application will be described below. According to this process, a laser beam is applied to the thin-film Si layer 5 to quickly heat the surface thereof to thermally expand the surface for thereby curving the thin-film Si layer 5 to develop strains therein. The surface of the thin-film Si layer 5 is quickly heated and thermally expanded. As a result, the thin-film Si layer 5 is curved to develop strains therein. Thereafter, the processing goes to an eighth manufacturing step to be described later on.

If the thin-film Si layer 5 is curved by a laser beam application, then ions may be introduced for forming the LDD region after the gate electrode 8 is formed in the fourth manufacturing step, the side wall 9 may be formed, and the gate insulating film 7 may be partly removed, all after the thin-film Si layer 5 is curved. Specifically, after the gate electrode 8 is formed in the fourth manufacturing step, the cavity 4 may be formed according to the fifth and sixth manufacturing steps, a laser beam may be applied to the surface of the thin-film Si layer 5 to curve the thin-film Si layer 5, and thereafter ions may be introduced for forming the LDD region, the side wall 9 may be formed, and the gate insulating film 7 may be partly removed.

The process which utilizes a fluid will be described below. According to this process, an $N_2$ gas or pure water is ejected to the thin-film Si layer 5 to curve the thin-film Si layer 5 under the pressure of the applied fluid to develop strains in the thin-film Si layer 5. First, after the sixth manufacturing step, a gas or a liquid is ejected to the surface of the thin-film Si layer 5. If a gas is used, then an $N_2$ gas, for example, is ejected to the surface of the thin-film Si layer 5 from a position that is spaced 10 cm to 30 cm from the surface of the thin-film Si layer 5 under a pressure of 0.5 kg/cm² at a rate ranging from 1 L/min. to 2 L/min. If a liquid is used, pure water, for example, is ejected to the surface of the thin-film Si layer 5 at a speed ranging from 1 km/h to 60 km/h. The thin-film Si layer 5 is curved under the pressure of the ejected $N_2$ gas or pure water to develop strains in the thin-film Si layer 5. Thereafter, the processing goes to an eighth manufacturing step to be described later on.

If a gas or a liquid is used, then when the thin-film Si layer 5 is curved to have its ends brought into contact with the surface of the Si substrate 2, the ends of the thin-film Si layer 5 are bonded to the Si substrate 2 under interatomic forces provided the surface of the Si substrate 2 is clean. As a result, the curved thin-film Si layer 5 does not easily restore its original shape even after the gas or liquid pressure is removed. If a gas is used, then when the gas is ejected to the thin-film Si layer 5 while it is being wet, such as after the assembly is immersed in pure water, the ends of the thin-film Si layer 5 and the Si substrate 2 are bonded to each other more strongly than when the gas is ejected to the thin-film Si layer 5 while it is being dry. In view of a path through which the gas or the liquid escapes, the flow rate and pressure of the gas and the shape of a nozzle for ejecting the gas need to be optimized. It is also effective to eject the gas or the liquid locally and scan the ejection of the gas or the liquid, rather than to eject the gas or the liquid all over the entire surface at once, in order to increase the uniformity in the wafer.

If the thin-film Si layer 5 is curved by a gas or a liquid, then ions may be introduced for forming the LDD region after the gate electrode 8 is formed in the fourth manufacturing step, the side wall 9 may be formed, and the gate insulating film 7 may be partly removed, all after the thin-film Si layer 5 is curved. Specifically, after the gate electrode 8 is formed in the fourth manufacturing step, the cavity 4 may be formed according to the fifth and sixth manufacturing steps, a gas or a liquid may be ejected to the surface of the thin-film Si layer 5 to curve the thin-film Si layer 5, and thereafter ions may be introduced for forming the LDD region, the side wall 9 may be formed, and the gate insulating film 7 may be partly removed. The gate insulating film 7 may not necessarily be removed at this time, but may be removed at least until plugs will be formed.

The thin-film Si layer 5 may thus be curved according to any of the various processes typically described above to develop strains in the thin-film Si layer 5.

Figure 13A:
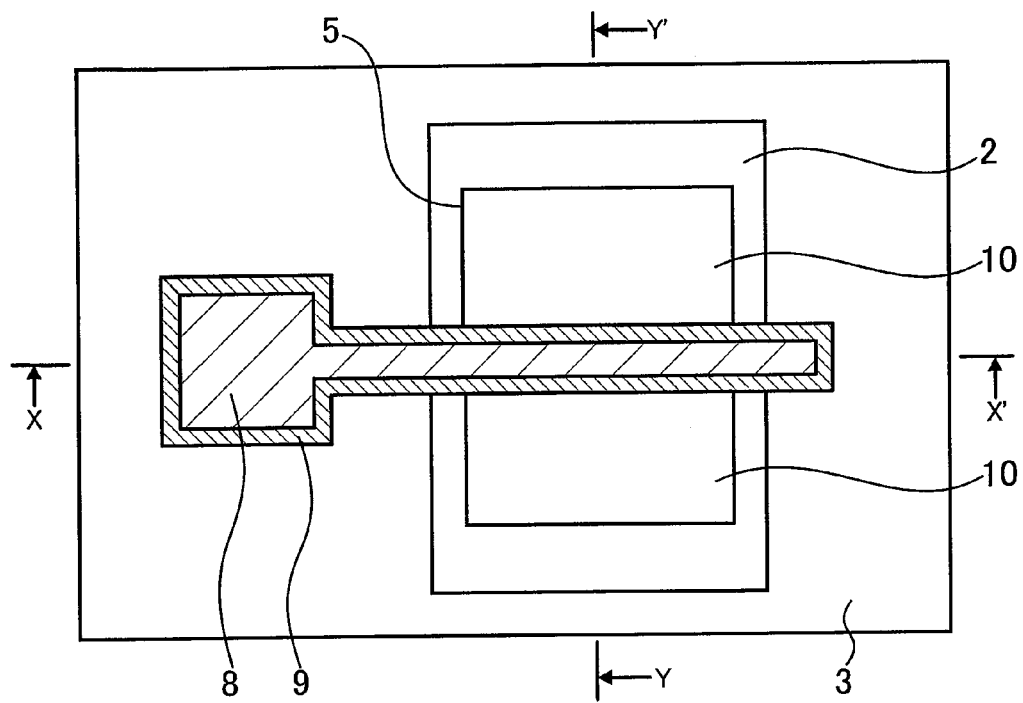
FIGS. 13A through 13C are views showing an eighth manufacturing step of manufacturing the semiconductor device according to the first example of the first embodiment of the present invention, FIG. 13A being a plan view, FIG. 13B a cross-sectional view taken along line X–X' of FIG. 13A, and FIG. 13C a cross-sectional view taken along line Y–Y' of FIG. 13A.
Figure 13B:
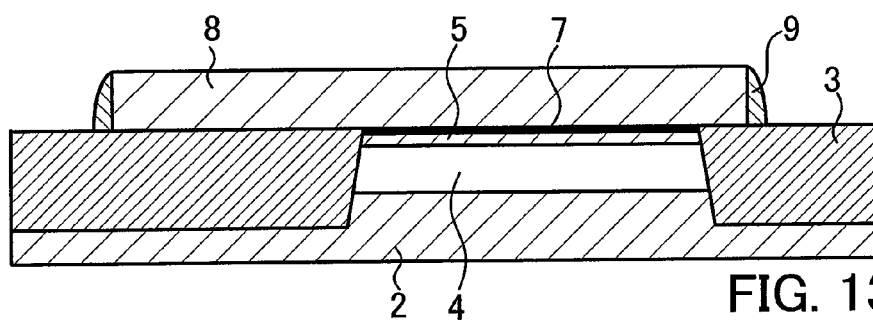
Figure 13C:
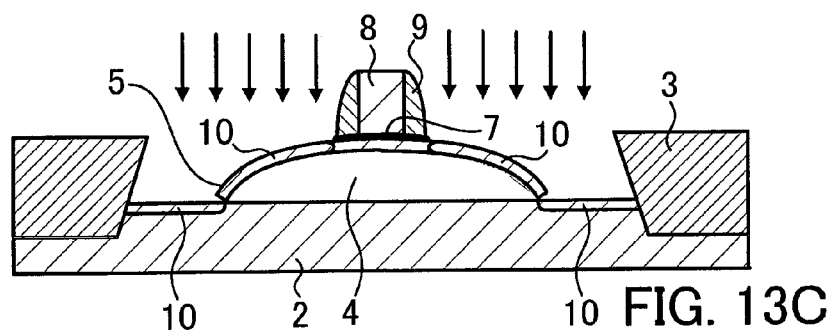

FIGS. 13A through 13C are views showing an eighth manufacturing step of manufacturing the semiconductor device according to the first example of the first embodiment of the present invention, FIG. 13A being a plan view, FIG. 13B a cross-sectional view taken along line X–X' of FIG. 13A, and FIG. 13C a cross-sectional view taken along line Y–Y' of FIG. 13A.

In the eighth manufacturing step, if ions have not been introduced to form the source/drain 10 in the previous manufacturing steps, then ions are introduced to form the source/drain 10 as shown in FIGS. 13A, 13B, and 13C. For example, boron ions ($B^+$) or phosphorus ions ($P^+$) are introduced into the Si substrate 2 and the thin-film Si layer 5 under the conditions of an acceleration energy of 20 keV and a dose of $5 \times 10^{15}$ cm$^{-2}$. After the ion implantation, the assembly is heated at 1030° C. for 1 second, for example, thus, activating impurities. In this manner, the source/drain 10 is formed on the Si substrate 2 and the thin-film Si layer 5.

Figure 14A:
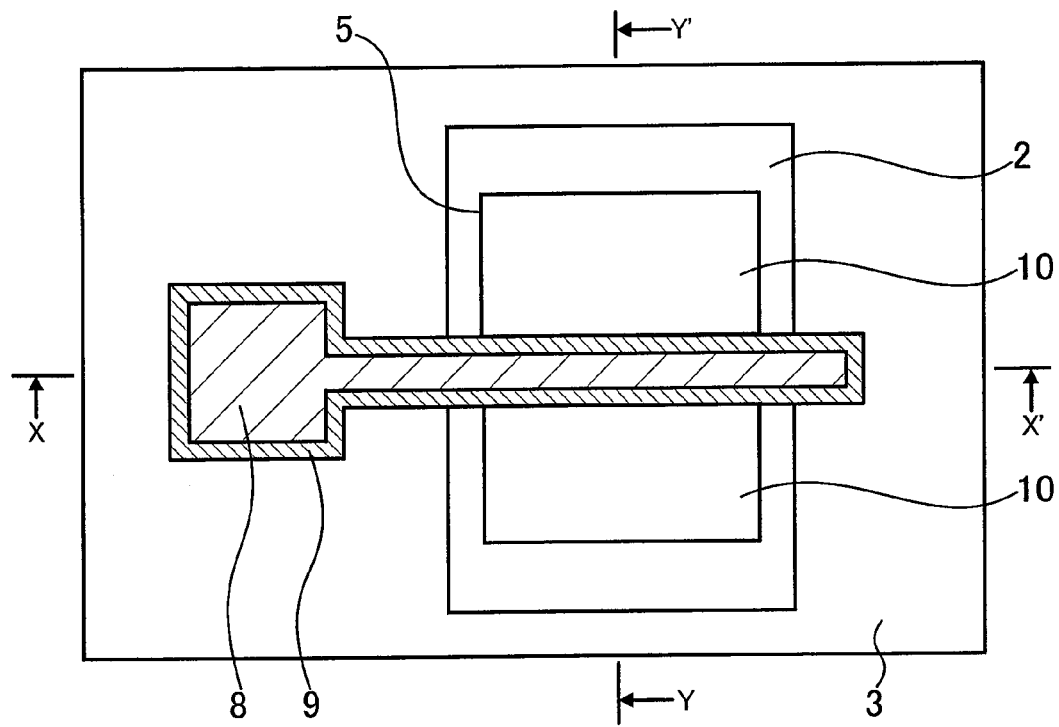
FIGS. 14A through 14C are views showing a ninth manufacturing step of manufacturing the semiconductor device according to the first example of the first embodiment of the present invention, FIG. 14A being a plan view, FIG. 14B a cross-sectional view taken along line X–X' of FIG. 14A, and FIG. 14C a cross-sectional view taken along line Y–Y' of FIG. 14A.
Figure 14B:
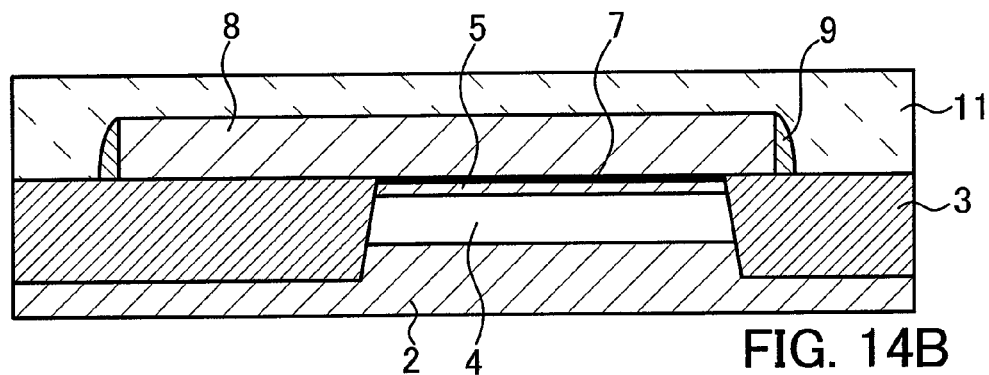
Figure 14C:
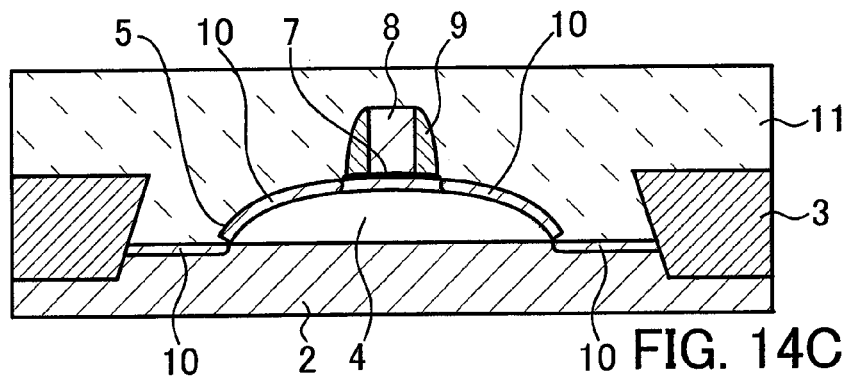

FIGS. 14A through 14C are views showing a ninth manufacturing step of manufacturing the semiconductor device according to the first example of the first embodiment of the present invention, FIG. 14A being a plan view, FIG. 14B a cross-sectional view taken along line X–X' of FIG. 14A, and FIG. 14C a cross-sectional view taken along line Y–Y' of FIG. 14A.

In the ninth manufacturing step, an interlayer insulating film 11 of $SiO_2$ or the like is formed on the entire surface, as shown in FIGS. 14B and 14C. The interlayer insulating film 11 is omitted from illustration in FIG. 14A.

Figure 15A:
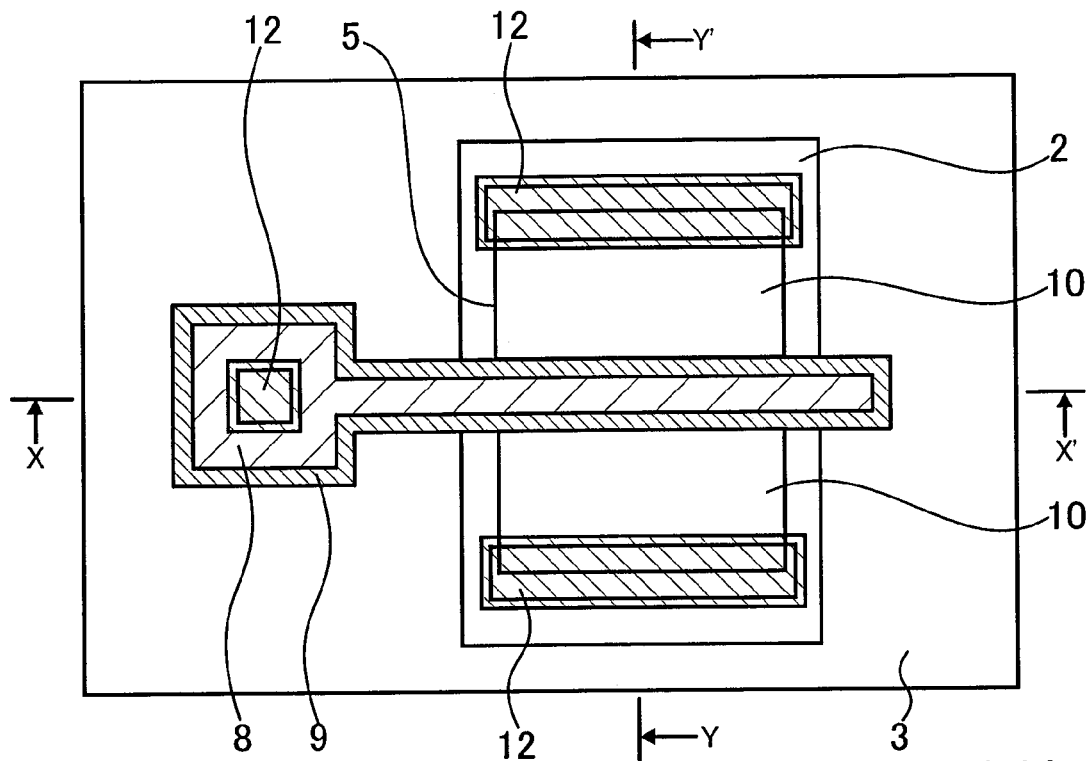
FIGS. 15A through 15C are views showing a tenth manufacturing step of manufacturing the semiconductor device according to the first example of the first embodiment of the present invention, FIG. 15A being a plan view, FIG. 15B a cross-sectional view taken along line X–X' of FIG. 15A, and FIG. 15C a cross-sectional view taken along line Y–Y' of FIG. 15A.
Figure 15B:
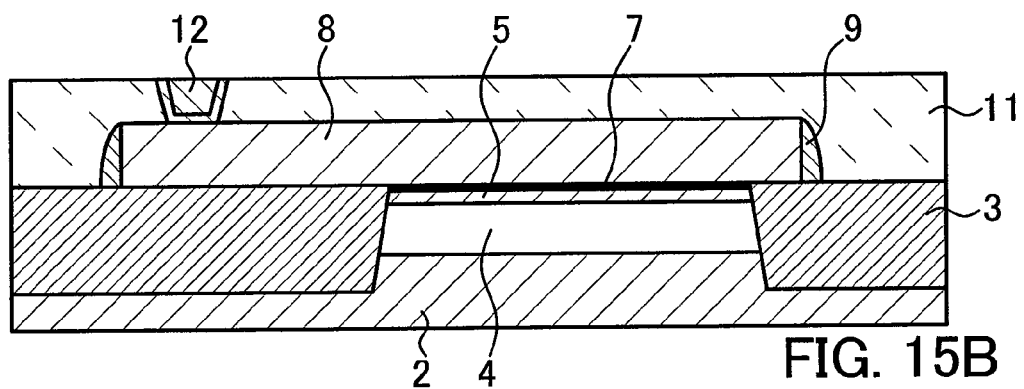
Figure 15C:
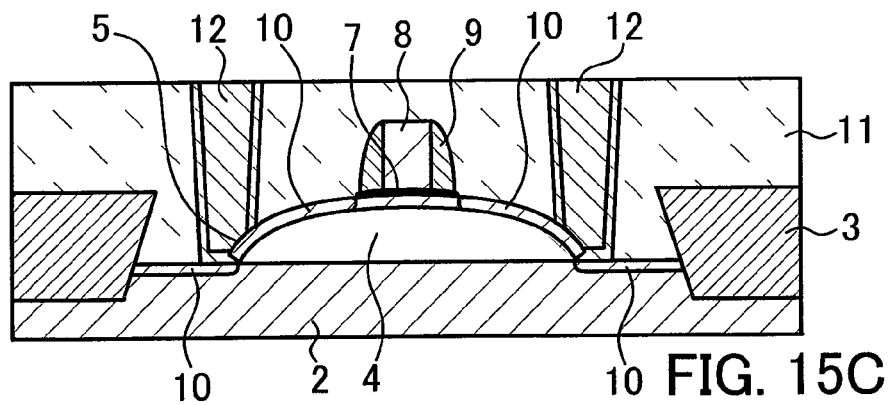

FIGS. 15A through 15C are views showing a tenth manufacturing step of manufacturing the semiconductor device according to the first example of the first embodiment of the present invention, FIG. 15A being a plan view, FIG. 15B a cross-sectional view taken along line X–X' of FIG. 15A, and FIG. 15C a cross-sectional view taken along line Y–Y' of FIG. 15A.

In the tenth manufacturing step, as shown in FIGS. 15A, 15B, and 15C, an electrically conductive film is formed in contact holes that extent to the gate electrode 8 and the source/drain 10 according to sputtering or CVD to form plugs 12. The electrically conductive film may be made of any of various materials. As shown in FIGS. 15A, 15B, and 15C, plugs 12 may be formed of a laminated structure of two or more electrically conductive films by first depositing a barrier metal layer and then depositing a low-resistance metal layer. The source/drain 10 to which the plugs 12 are connected may be formed over the Si substrate 2 and the thin-film Si layer 5 as shown in FIG. 15C, or may be formed only on the thin-film Si layer 5 or may be formed on the Si substrate 2. Finally, an interconnection layer 13 is formed of a low-resistance metal, thus completing the semiconductor device 1 shown in FIGS. 1A, 1B, and 1C. The interlayer insulating film 11 is omitted from illustration in FIG. 15A.

Figure 16A:
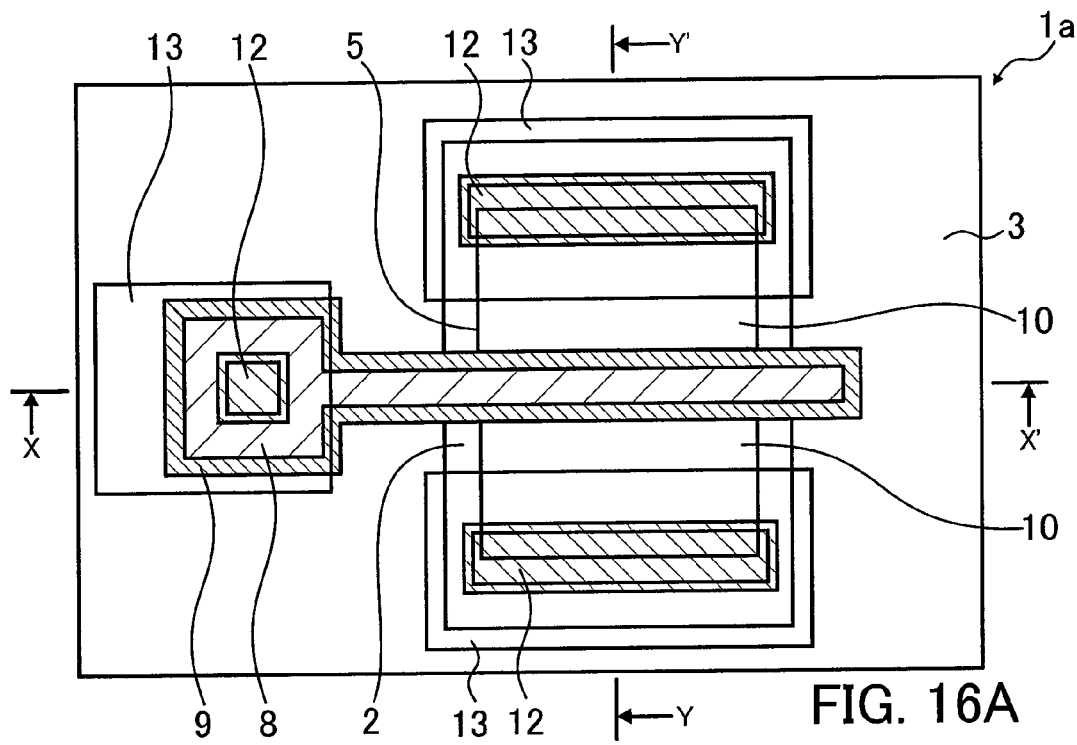
FIGS. 16A through 16C are views showing a semiconductor device according to a second example of the first embodiment of the present invention, FIG. 16A being a plan view of the semiconductor device, FIG. 16B a cross-sectional view taken along line X–X' of FIG. 16A, and FIG. 16C a cross-sectional view taken along line Y–Y' of FIG. 16A.
Figure 16B:
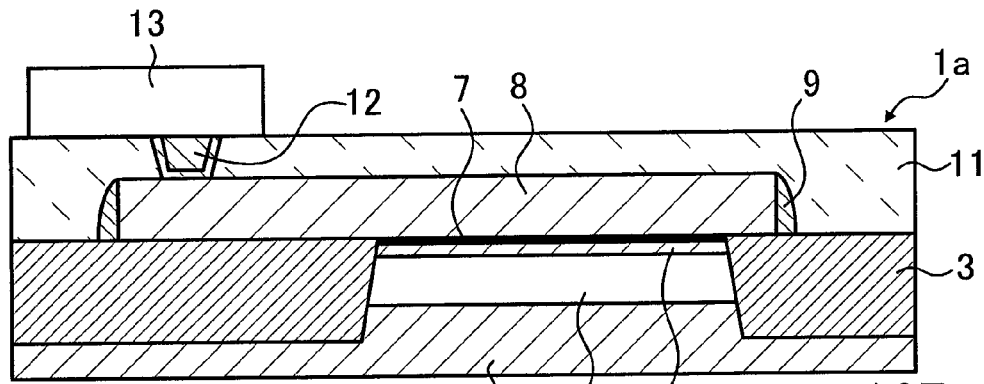
Figure 16C:
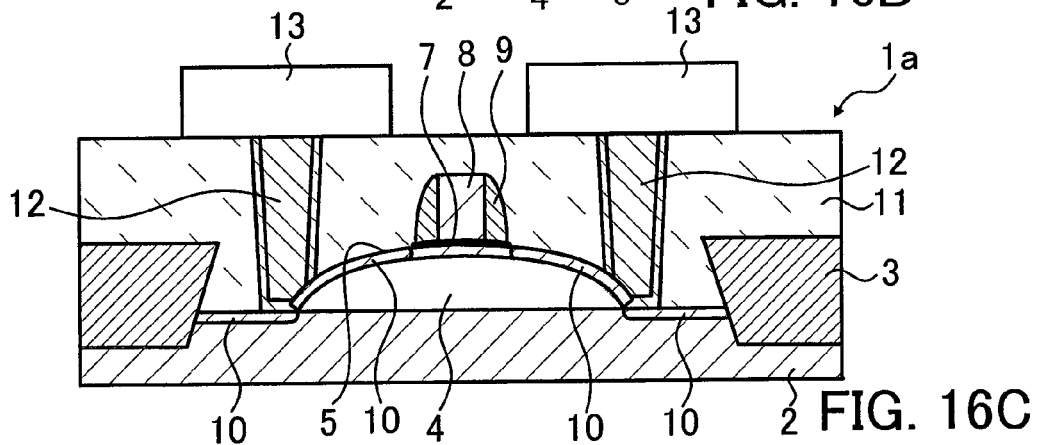

FIGS. 16A through 16C are views showing a semiconductor device according to a second example of the first embodiment of the present invention, FIG. 16A being a plan view of the semiconductor device, FIG. 16B a cross-sectional view taken along line X–X' of FIG. 16A, and FIG. 16C a cross-sectional view taken along line Y–Y' of FIG. 16A.

A semiconductor device 1a shown in FIGS. 16A, 16B, and 16C has a substrate of SOI structure which is a laminated structure of the Si substrate 2, a BOX layer, and the thin-film Si layer 5. The cavity 4 is formed by removing the BOX layer. The semiconductor device 1a thus constructed may be manufactured according to the process of manufacturing the semiconductor device 1 according to the first example except that the SiGe layer 14 is replaced with the BOX layer. The semiconductor device 1a has a final structure which is the same as the final structure of the semiconductor device 1.

Figure 17A:
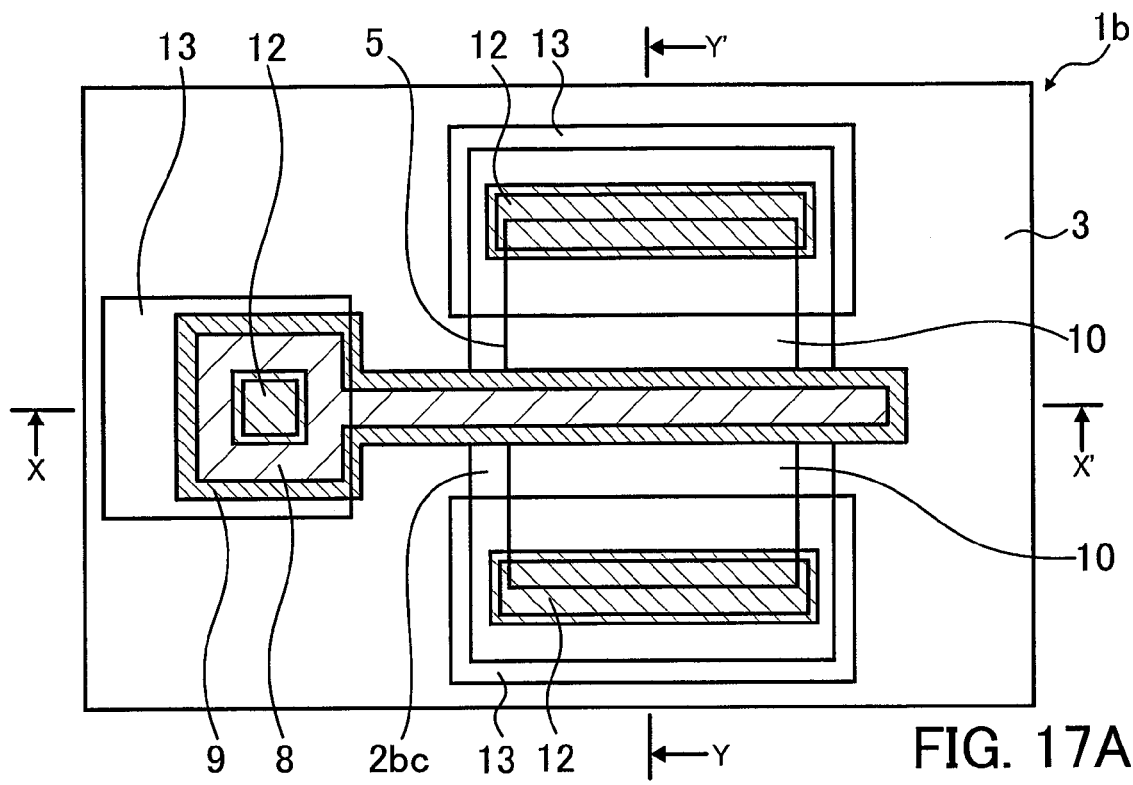
FIGS. 17A through 17C are views showing a semiconductor device according to a third example of the first embodiment of the present invention, FIG. 17A being a plan view of the semiconductor device, FIG. 17B a cross-sectional view taken along line X–X' of FIG. 17A, and FIG. 17C a cross-sectional view taken along line Y–Y' of FIG. 17A.
Figure 17B:
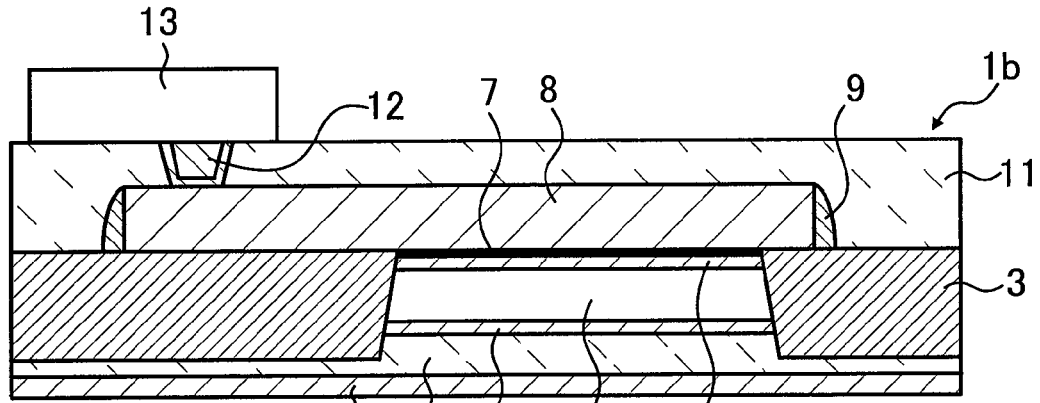
Figure 17C:
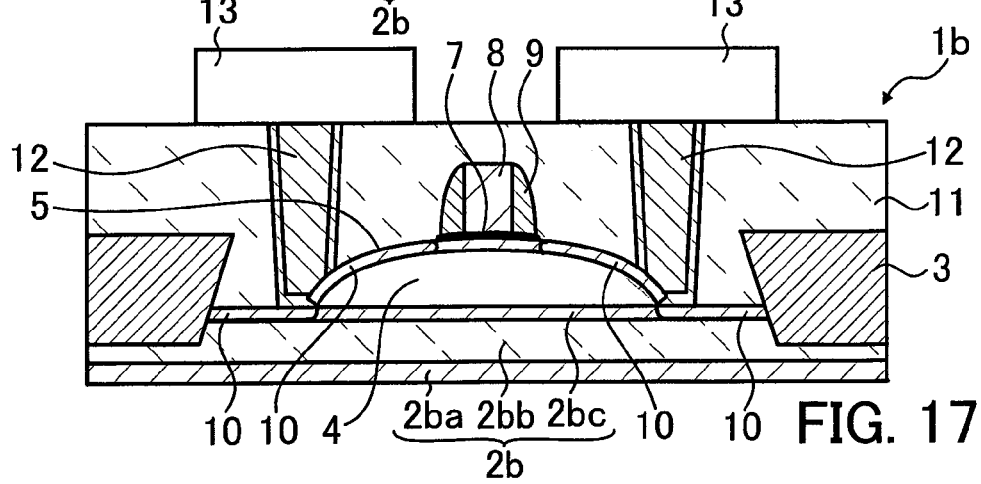

FIGS. 17A through 17C are views showing a semiconductor device according to a third example of the first embodiment of the present invention, FIG. 17A being a plan view of the semiconductor device, FIG. 17B a cross-sectional view taken along line X–X' of FIG. 17A, and FIG. 17C a cross-sectional view taken along line Y–Y' of FIG. 17A.

A semiconductor device 1b shown in FIGS. 17A, 17B, and 17C is different from the semiconductor device 1 according to the first example in that the Si substrate 2 is replaced with an SOI substrate 2b, and has other structural details identical to those of the semiconductor device 1 according to the first example. Specifically, the SiGe layer 14 and the thin-film Si layer 5 are successively formed on the SOI substrate 2b, and the SiGe layer 14 is selectively removed to form the cavity 4 in a subsequent step. With the semiconductor device 1b, therefore, the SOI substrate 2b which is of a laminated structure of a substrate 2ba, a BOX layer 2bb, and an Si layer 2bc is left below the cavity 4.

If an SOI substrate is used in such an application, then it is possible to form an Si layer and an SiGe layer successively on the SOI structure, and removing the Si layer as an uppermost layer on the SOI substrate and an Si layer formed thereon by way of wet etching, thus forming a transistor with the SiGe layer serving as a channel.

Figure 18A:
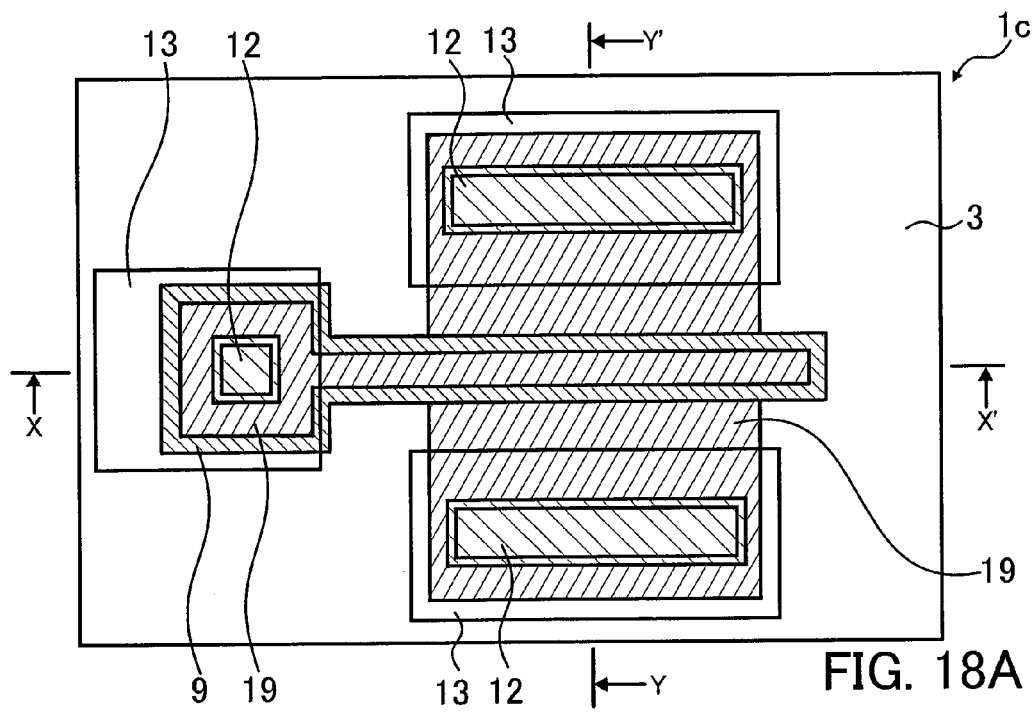
FIGS. 18A through 18C are views showing a semiconductor device according to a fourth example of the first embodiment of the present invention, FIG. 18A being a plan view of the semiconductor device, FIG. 18B a cross-sectional view taken along line X–X' of FIG. 18A, and FIG. 18C a cross-sectional view taken along line Y–Y' of FIG. 18A.
Figure 18B:
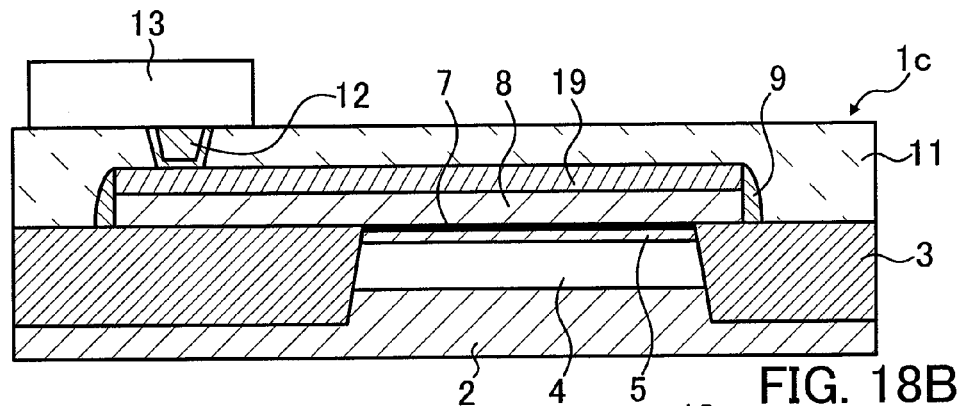
Figure 18C:
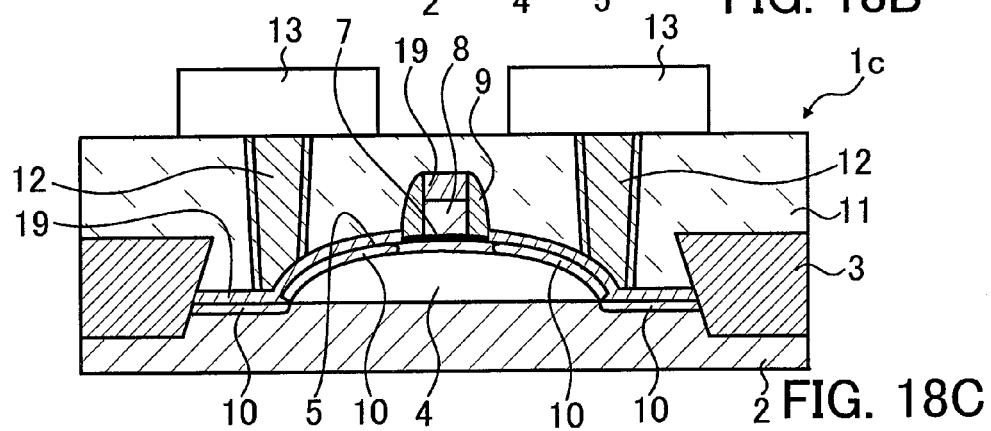

FIGS. 18A through 18C are views showing a semiconductor device according to a fourth example of the first embodiment of the present invention, FIG. 18A being a plan view of the semiconductor device, FIG. 18B a cross-sectional view taken along line X–X' of FIG. 18A, and FIG. 18C a cross-sectional view taken along line Y–Y' of FIG. 18A. In FIGS. 18A through 18C, those elements which are identical to those shown in FIGS. 1A through 1C are denoted by identical reference numerals.

A semiconductor device 1c shown in FIGS. 18A, 18B, and 18C is different from the semiconductor device 1 according to the first example in that a silicide layer 19 is formed on the surfaces of the gate electrode 8 and the source/drain 10, and has other structural details identical to those of the semiconductor device 1 according to the first example. The interlayer insulating film 11 is omitted from illustration in FIG. 18A. A silicide structure having the silicide layer 19 makes it possible to achieve a low-resistance electric connection between the gate electrode 8, the source/drain 10, and the plugs 12. The silicide layer 19 may be formed by forming a thin film of cobalt (Co), nickel, titanium, platinum, or the like on the entire surface before the interlayer insulating film 11 is formed, after the source/drain 10 is formed, heating the thin film into a cobalt silicide, a nickel silicide, a titanium silicide, a platinum silicide, or the like, and dissolving the silicide with sulfuric acid or the like to leave the cobalt silicide on the surfaces of the gate electrode 8 and the source/drain 10.

The semiconductor device 1c may employ a substrate of SOI structure of the Si substrate 2, the BOX layer, and the thin-film Si layer 5, with the cavity 4 formed by removing the BOX layer. Alternatively, the SOI substrate 2b may be employed instead of the Si substrate 2, and the SiGe layer 14 and the thin-film Si layer 5 may be formed on the SOI substrate 2b with the cavity 4 formed by removing the SiGe layer 14. While the surfaces of the gate electrode 8 and the source/drain 10 are silicidized in the above example, the source/drain 10 formed on the thin-film Si layer 5 may be silicidized in its entirety. If the thin-film Si layer 5 is silicidized in its entirety, then a lower-resistance electric connection can be achieved between the gate electrode 8 and the plugs 12 and between the source/drain 10 and the plugs 12.

A second embodiment of the present invention will be described below.

Figure 19A:
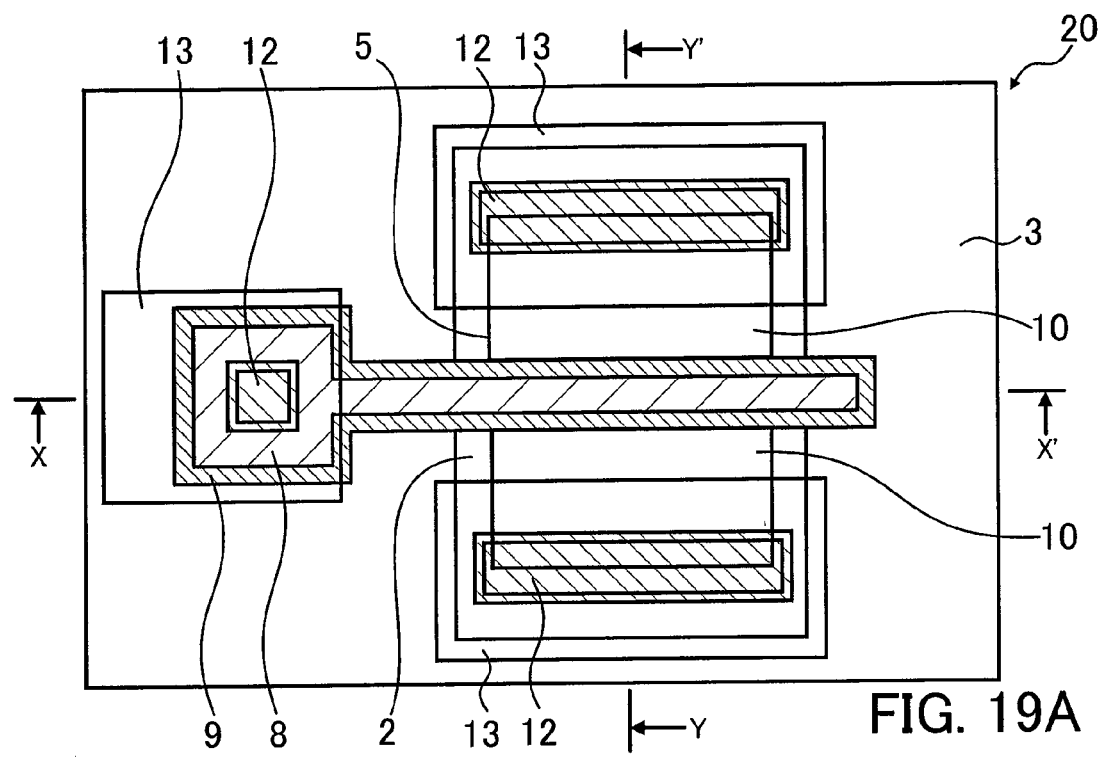
FIGS. 19A through 19C are views showing a semiconductor device according to a first example of a second embodiment of the present invention, FIG. 19A being a plan view of the semiconductor device, FIG. 19B a cross-sectional view taken along line X–X' of FIG. 19A, and FIG. 19C a cross-sectional view taken along line Y–Y' of FIG. 19A.
Figure 19B:
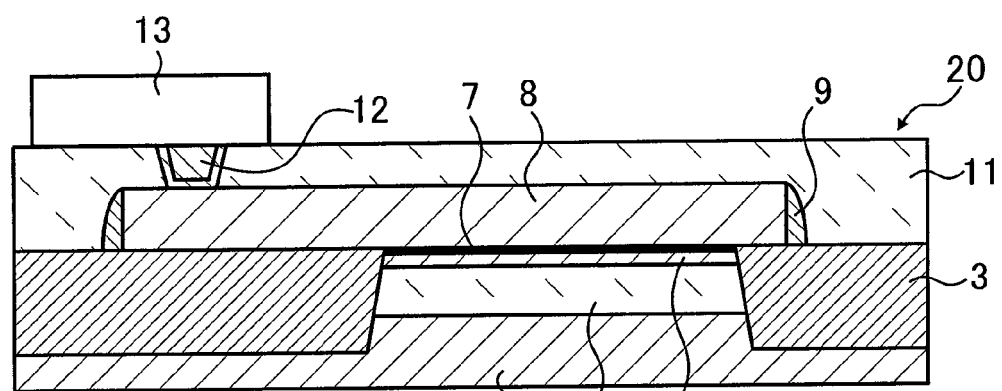
Figure 19C:
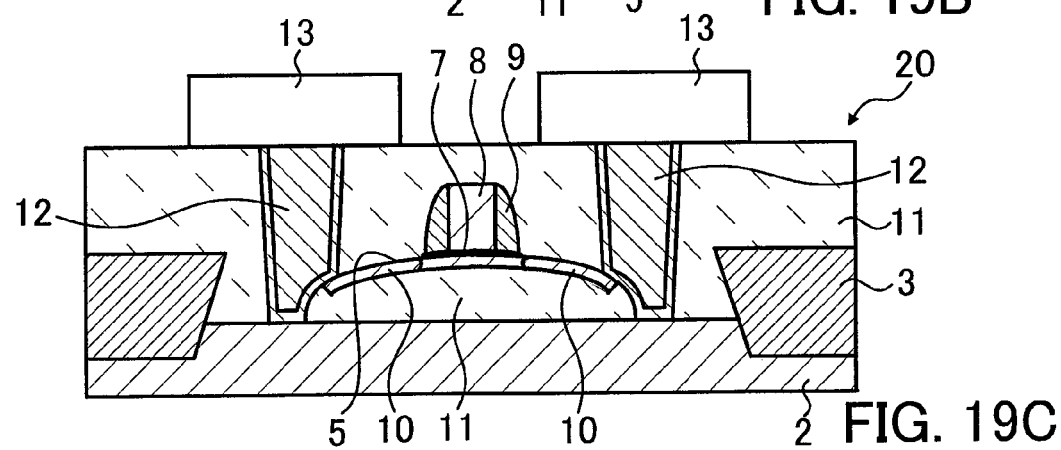

FIGS. 19A through 19C are views showing a semiconductor device according to a first example of a second embodiment of the present invention, FIG. 19A being a plan view of the semiconductor device, FIG. 19B a cross-sectional view taken along line X–X' of FIG. 19A, and FIG. 19C a cross-sectional view taken along line Y–Y' of FIG. 19A. In FIGS. 19A through 19C, those elements which are identical to those shown in FIGS. 1A through 1C are denoted by identical reference numerals.

A semiconductor device 20 shown in FIGS. 19A, 19B, and 19C is different from the semiconductor device 1 according to the first example in that the ends of the curved thin-film Si layer 5 are held out of contact with the Si substrate 2, and has other structural details identical to those of the semiconductor device 1 according to the first example. The interlayer insulating film 11 is omitted from illustration in FIG. 19A.

The thin-film Si layer 5 may be held out of contact with the Si substrate 2 as follows: If the thin-film Si layer 5 is curved by a surface tension, then pure water that is used to wash away the etching liquid may be mixed with a surface-active agent to reduce the surface tension that acts between the thin-film Si layer 5 and the Si substrate 2 when the assembly is lifted out of the pure water. If the thin-film Si layer 5 is curved by tensile stresses of the SiN film 18, then the SiN film 18 may be formed under such film growing conditions and head under such heating conditions as to reduce tensile stresses of the SiN film 18. If the thin-film Si layer 5 is curved by ion implantation and heat treatment, then ions may be introduced under such conditions as to break the crystal of the thin-film Si layer 5 to a smaller extent. If the thin-film Si layer 5 is curved by a laser beam application, then the energy of the applied laser beam may be adjusted to reduce a temperature rise of the thin-film Si layer 5. If the thin-film Si layer 5 is curved by ejecting a gas or a liquid, then the gas or the liquid may be ejected under such conditions as to reduce the pressure applied to the thin-film Si layer 5. The thin-film Si layer 5 may be of an increased thickness to make itself hard to be curved. Other details of the manufacturing process are identical to those of the process of manufacturing the semiconductor device 1 according to the first embodiment.

In the semiconductor device 20, the cavity 4 shown in FIGS. 1B and 1C may be left below the thin-film Si layer 5 or the space below the thin-film Si layer 5 may be filled with the interlayer insulating film 11 as shown in FIGS. 19B and 19C. The space below the thin-film Si layer 5 may be partly filled with the interlayer insulating film 11. Even with the interlayer insulating film 11 being present in the cavity, since the thin-film Si layer 5 is largely curved compared with the conventional arrangement, it is possible to achieve a high-speed carrier mobility for better transistor performance.

The semiconductor device 20 may employ a structure of SOI structure of the Si substrate 2, the Box layer, and the thin-film Si layer 5, with the cavity 4 formed by removing the BOX layer and the ends of the curved thin-film Si layer 5 may be held out of contact with the Si substrate 2. According to such a modification, the semiconductor device has a final structure which is the same as the structure shown in FIGS. 19A through 19C.

Figure 20A:
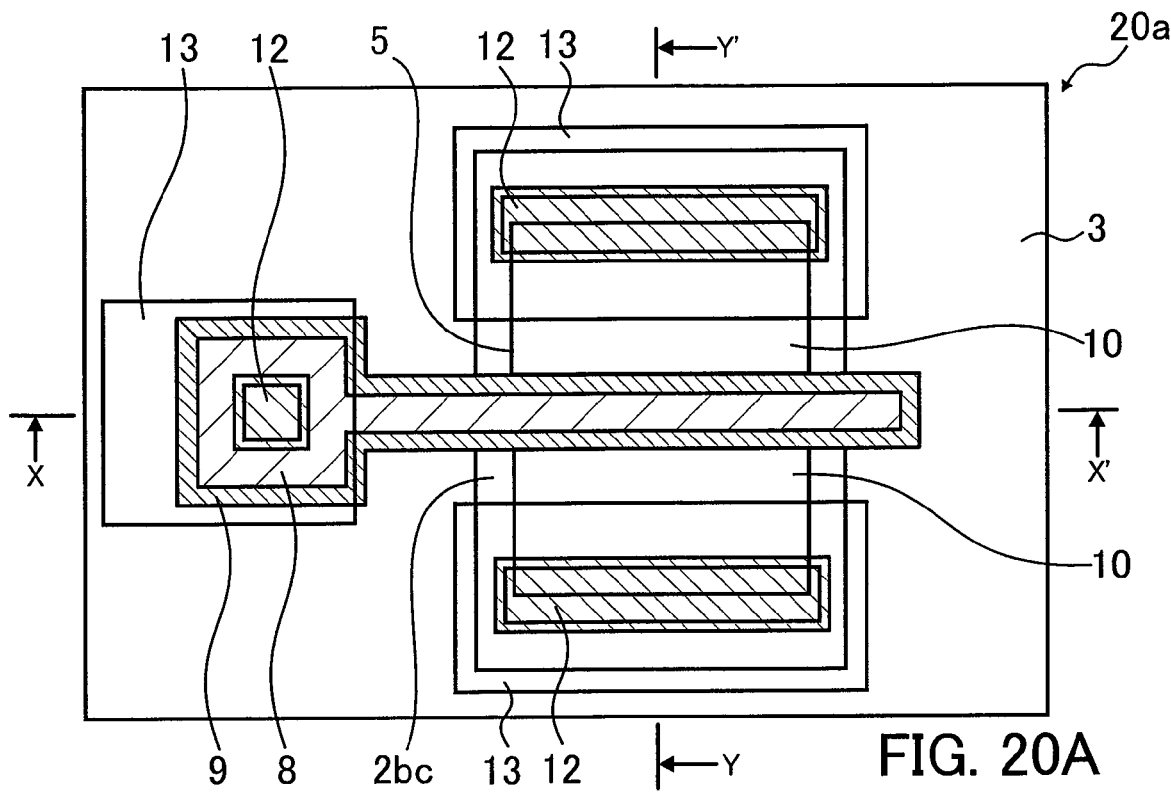
FIGS. 20A through 20C are views showing a semiconductor device according to a second example of the second embodiment of the present invention, FIG. 20A being a plan view of the semiconductor device, FIG. 20B a cross-sectional view taken along line X–X' of FIG. 20A, and FIG. 20C a cross-sectional view taken along line Y–Y' of FIG. 20A.
Figure 20B:
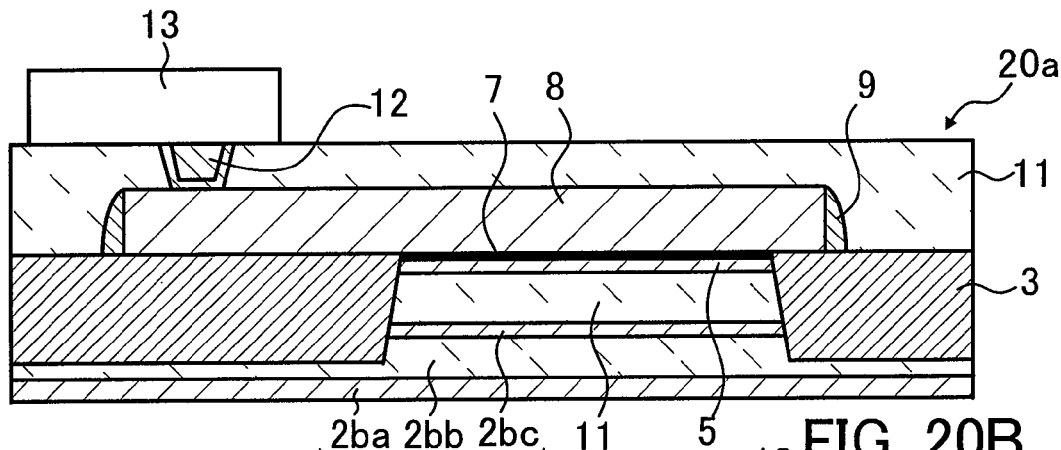
Figure 20C:
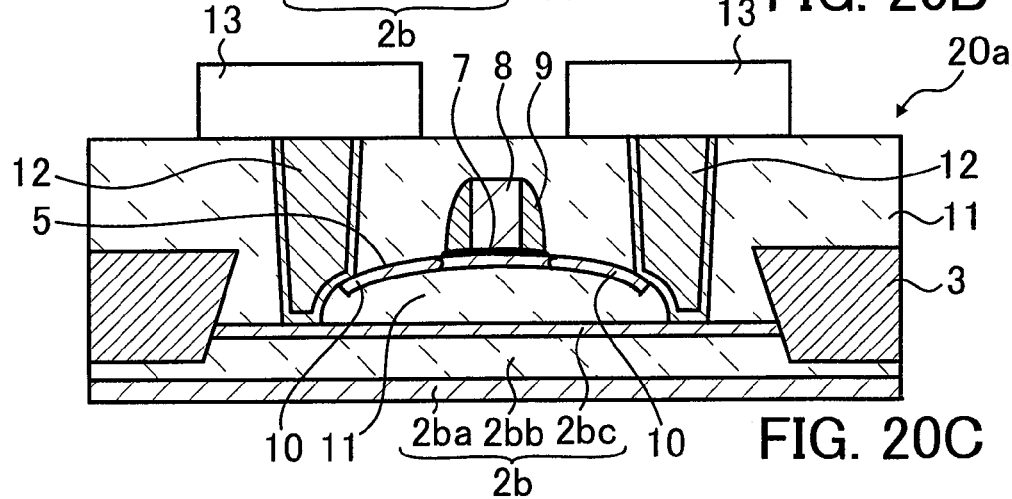

FIGS. 20A through 20C are views showing a semiconductor device according to a second example of the second embodiment of the present invention, FIG. 20A being a plan view of the semiconductor device, FIG. 20B a cross-sectional view taken along line X–X' of FIG. 20A, and FIG. 20C a cross-sectional view taken along line Y–Y' of FIG. 20A. In FIGS. 20A through 20C, those elements which are identical to those shown in FIGS. 1A through 1C, 17A through 17C, and 19A through 19C are denoted by identical reference numerals.

A semiconductor device 20a shown in FIGS. 20A, 20B, and 20C is different from the semiconductor device 20 according to the first example in that the SOI substrate 2b is employed instead of the Si substrate 2, and has other structural details identical to those of the semiconductor device 20 according to the first example.

FIGS. 21A through 21C are views showing a semiconductor device according to a third example of the second embodiment of the present invention, FIG. 21A being a plan view of the semiconductor device, FIG. 21B a cross-sectional view taken along line X–X' of FIG. 21A, and FIG. 21C a cross-sectional view taken along line Y–Y' of FIG. 21A. In FIGS. 21A through 21C, those elements which are identical to those shown in FIGS. 1A through 1C, 18A through 18C, and 19A through 19C are denoted by identical reference numerals.

A semiconductor device 20b shown in FIGS. 21A, 21B, and 21C is different from the semiconductor device 20 according to the first example in that the silicide layer 19 for achieving a low resistance is formed on the surfaces of the gate electrode 8 and the source/drain 10, and has other structural details identical to those of the semiconductor device 20 according to the first example. The interlayer insulating film 11 is omitted from illustration in FIG. 21A.

In the semiconductor device 20, a substrate of SOI structure which is a laminated structure of the Si substrate 2, the BOX layer, and the thin-film Si layer 5 may be employed, or the Si substrate 2 may be replaced with the SOI substrate 2b. The source/drain 10 formed on the thin-film Si layer 5 may be silicidized in its entirety.

A third embodiment of the present invention will be described below.

Figure 22A:
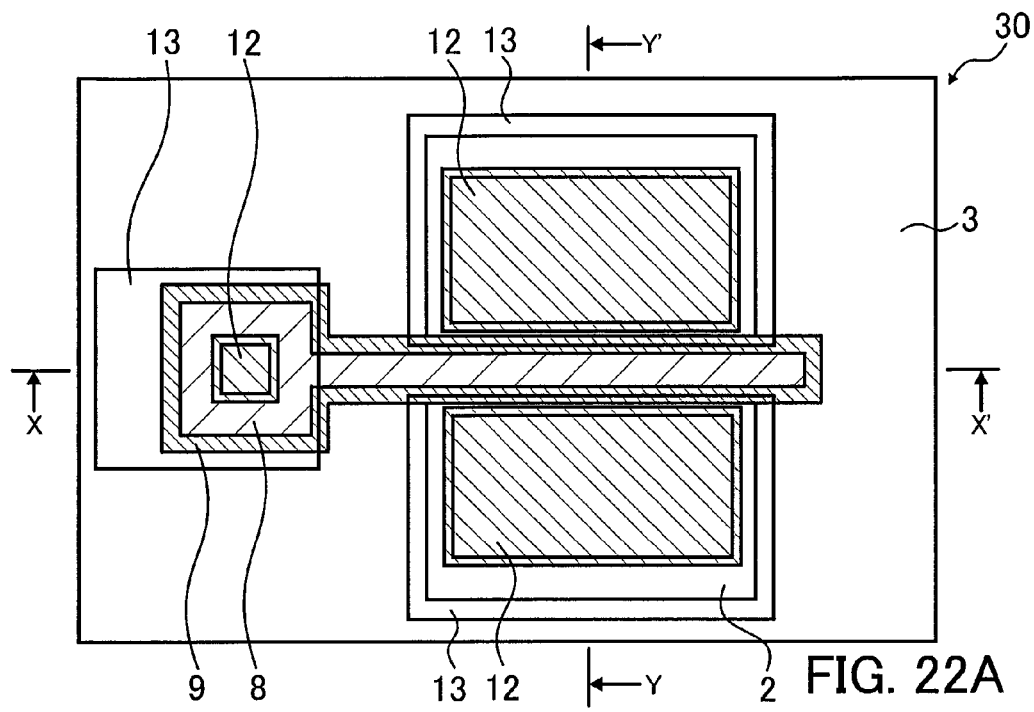
FIGS. 22A through 22C are views showing a semiconductor device according to a first example of a third embodiment of the present invention, FIG. 22A being a plan view of the semiconductor device, FIG. 22B a cross-sectional view taken along line X–X' of FIG. 22A, and FIG. 22C a cross-sectional view taken along line Y–Y' of FIG. 22A.
Figure 22B:
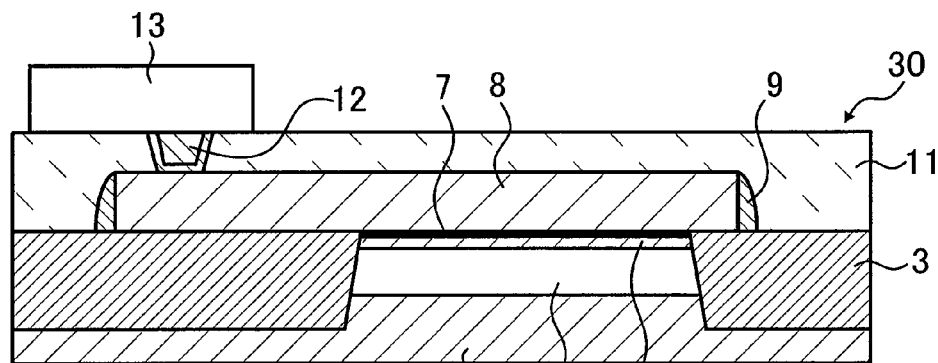
Figure 22C:
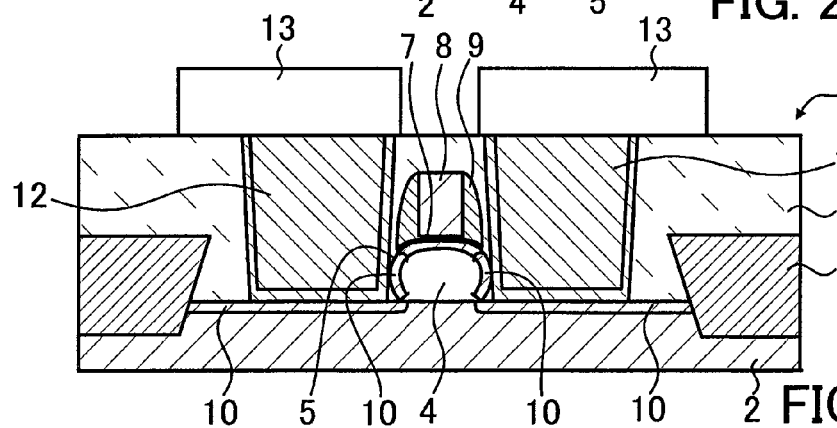

FIGS. 22A through 22C are views showing a semiconductor device according to a first example of a third embodiment of the present invention, FIG. 22A being a plan view of the semiconductor device, FIG. 22B a cross-sectional view taken along line X–X' of FIG. 22A, and FIG. 22C a cross-sectional view taken along line Y–Y' of FIG. 22A. In FIGS. 22A through 22C, those elements which are identical to those shown in FIGS. 1A through 1C are denoted by identical reference numerals.

A semiconductor device 30 shown in FIGS. 22A, 22B, and 22C is different from the semiconductor device 1 according to the first embodiment in that the thin-film Si layer 5 is greatly curved into a substantially cylindrical shape directly below the gate electrode 8, and has other structural details identical to those of the semiconductor device 1 according to the first embodiment. The interlayer insulating film 11 is omitted from illustration in FIG. 22A.

The thin-film Si layer 5 of substantially cylindrical shape may be formed as follows: If the thin-film Si layer 5 is curved by a surface tension, then pure water that is used to wash away the etching liquid may not be mixed with a surface-active agent, and the cavity 4 may be of such a thickness as to allow the thin-film Si layer 5 to be greatly curved into a substantially cylindrical shape. If the thin-film Si layer 5 is curved by tensile stresses of the SiN film 18, then the thickness of the cavity 4 may be taken into account, and the SiN film 18 may be formed under such film growing conditions and head under such heating conditions as to increase tensile stresses of the SiN film 18. If the thin-film Si layer 5 is curved by ion implantation and heat treatment, then the thickness of the cavity 4 may be taken into account, and ions may be introduced under such conditions as to break the crystal of the thin-film Si layer 5 to a greater extent. If the thin-film Si layer 5 is curved by a laser beam application, then the thickness of the cavity 4 may be taken into account, and the energy of the applied laser beam may be adjusted to increase a temperature rise of the thin-film Si layer 5. If the thin-film Si layer 5 is curved by ejecting a gas or a liquid, then the thickness of the cavity 4 may be taken into account, and the gas or the liquid may be ejected under such conditions as to increase the pressure applied to the thin-film Si layer 5. The thin-film Si layer 5 may be of a reduced thickness to make itself easy to be curved. Other details of the manufacturing process are identical to those of the process of manufacturing the semiconductor device 1 according to the first embodiment.

In the semiconductor device 30, the plugs 12 is connected to both the source/drain 10 formed on the side walls of the largely curved thin-film Si layer 5 and the source/drain 10 formed on the Si substrate 2. If the ends of the thin-film Si layer 5 are held in contact with the Si substrate 2, then the plugs 12 may be connected to only the source/drain 10 formed on the Si substrate 2.

The semiconductor device 30 may employ a substrate of SOI structure which is a laminated structure of the Si substrate 2, the BOX layer, and the thin-film Si layer 5, with the cavity 4 being formed by removing the BOX layer. According to such a modification, the semiconductor device has a final structure which is the same as the structure shown in FIGS. 22A, 22B, and 22C.

FIGS. 23A through 23C are views showing a semiconductor device according to a second example of the third embodiment of the present invention, FIG. 23A being a plan view of the semiconductor device, FIG. 23B a cross-sectional view taken along line X–X' of FIG. 23A, and FIG. 23C a cross-sectional view taken along line Y–Y' of FIG. 23A. In FIGS. 23A through 23C, those elements which are identical to those shown in FIGS. 1A through 1C, FIGS. 17A through 17C, and FIGS. 22A through 22C are denoted by identical reference numerals.

A semiconductor device 30a shown in FIGS. 23A, 23B, and 23C is different from the semiconductor device 30 according to the first example in that the SOI substrate 2b is employed instead of the Si substrate 2, and has other structural details identical to those of the semiconductor device 30 according to the first example.

Figure 24A:
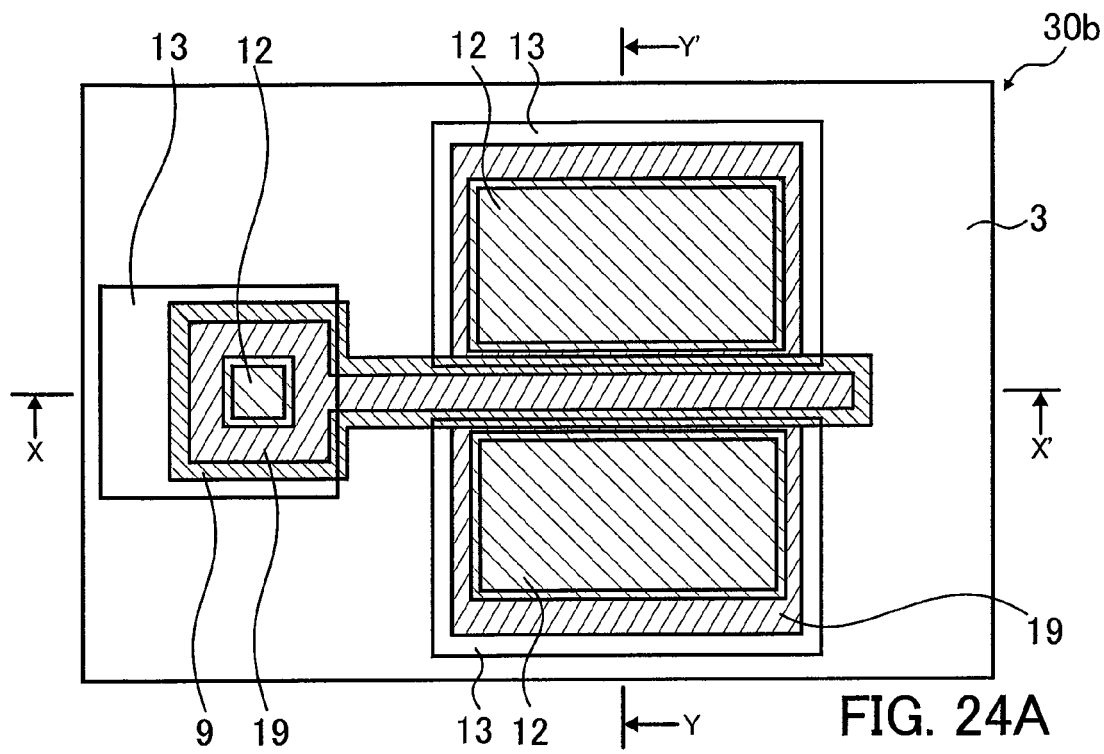
FIGS. 24A through 24C are views showing a semiconductor device according to a third example of the third embodiment of the present invention, FIG. 24A being a plan view of the semiconductor device, FIG. 24B a cross-sectional view taken along line X–X' of FIG. 24A, and FIG. 24C a cross-sectional view taken along line Y–Y' of FIG. 24A.
Figure 24B:
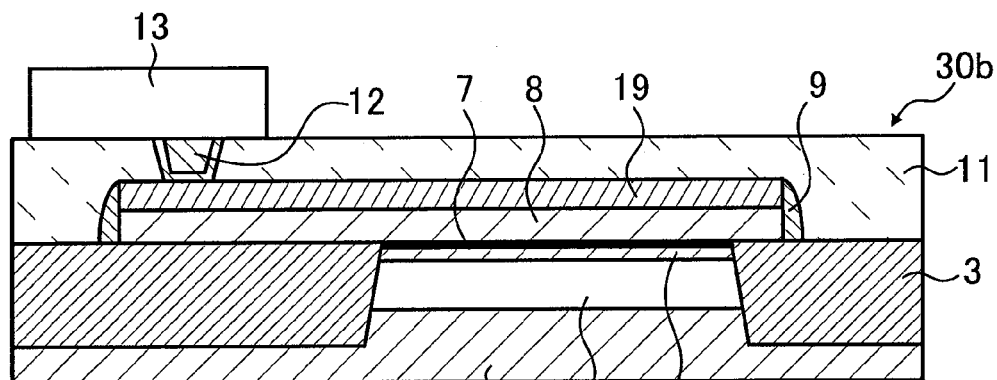
Figure 24C:
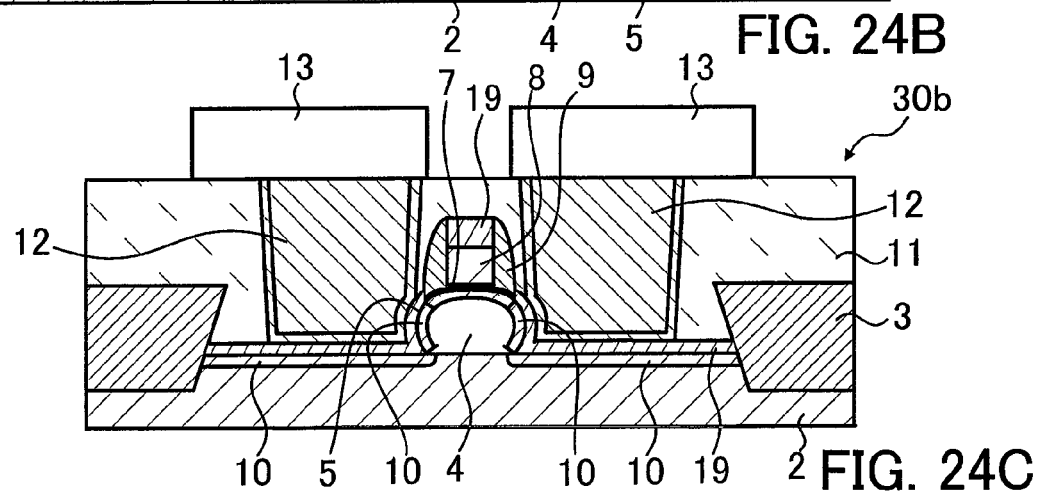

FIGS. 24A through 24C are views showing a semiconductor device according to a third example of the third embodiment of the present invention, FIG. 24A being a plan view of the semiconductor device, FIG. 24B a cross-sectional view taken along line X–X' of FIG. 24A, and FIG. 24C a cross-sectional view taken along line Y–Y' of FIG. 24A. In FIGS. 24A through 24C, those elements which are identical to those shown in FIGS. 1A through 1C, 18A through 18C, and 22A through 22C are denoted by identical reference numerals.

A semiconductor device 30b shown in FIGS. 24A, 24B, and 24C is different from the semiconductor device 30 according to the first example in that the suicide layer 19 for achieving a low resistance is formed on the surfaces of the gate electrode 8 and the source/drain 10, and has other structural details identical to those of the semiconductor device 30 according to the first example. The interlayer insulating film 11 is omitted from illustration in FIG. 24A. As shown in FIG. 24C, the plugs 12 are connected to both the silicide layer 19 formed on the surface of the source/drain 10 on the side walls of the thin-film Si layer 5 and the silicide layer 19 formed on the surface of the source/drain 10 on the Si substrate 2.

The semiconductor device may be of such a structure that only the source/drain 10 is silicidized, with the gate electrode 8 being not silicidized. To prevent the gate electrode 8 from being silicidized, an insulating film may be formed beforehand on the gate electrode 8.

In the semiconductor device 30b, a substrate of SOI structure which is a laminated structure of the Si substrate 2, the BOX layer, and the thin-film Si layer 5 may be employed, or the Si substrate 2 may be replaced with the SOI substrate 2b. The source/drain 10 formed on the thin-film Si layer 5 may be silicidized in its entirety.

Figure 25A:
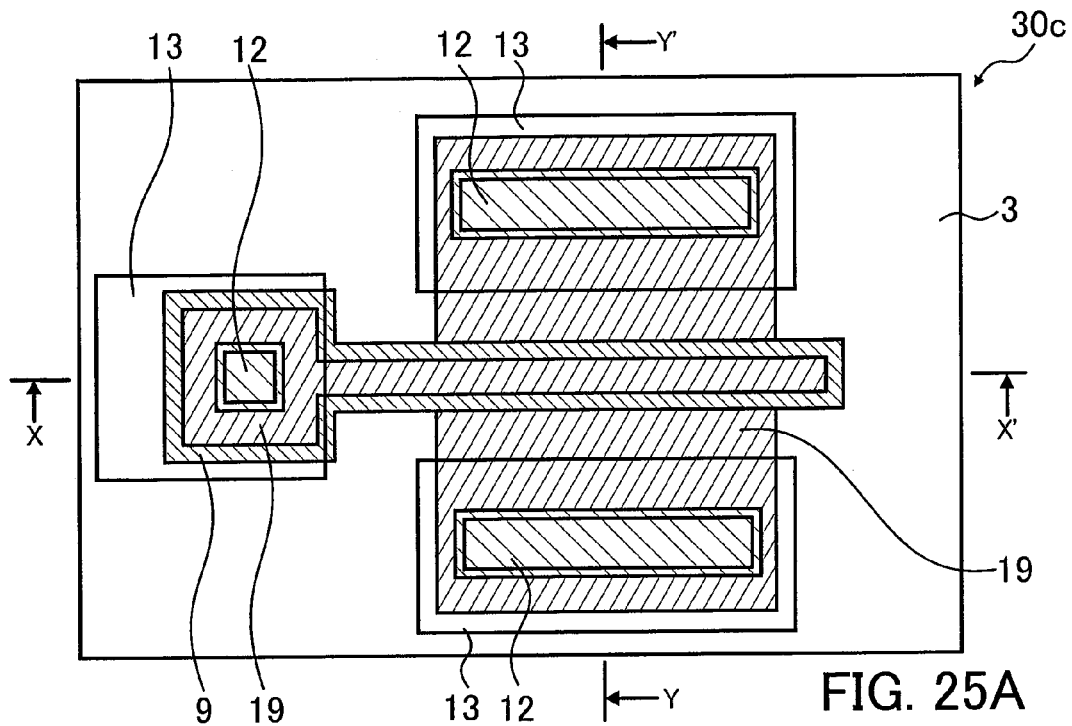
FIGS. 25A through 25C are views showing a semiconductor device according to a fourth example of the third embodiment of the present invention, FIG. 25A being a plan view of the semiconductor device, FIG. 25B a cross-sectional view taken along line X–X' of FIG. 25A, and FIG. 25C a cross-sectional view taken along line Y–Y' of FIG. 25A.
Figure 25B:
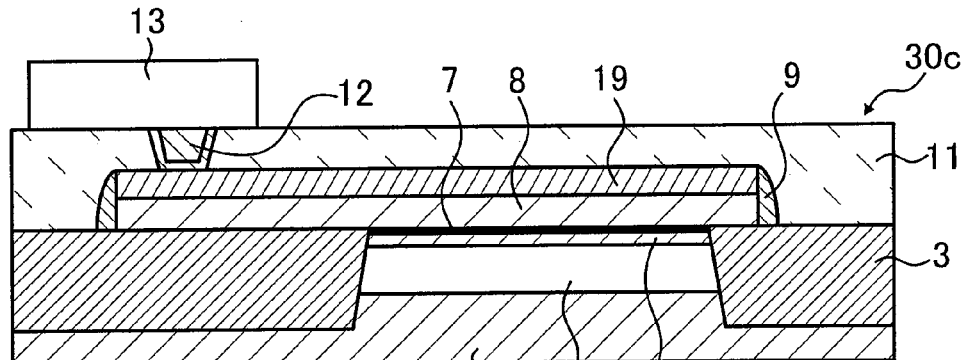
Figure 25C:
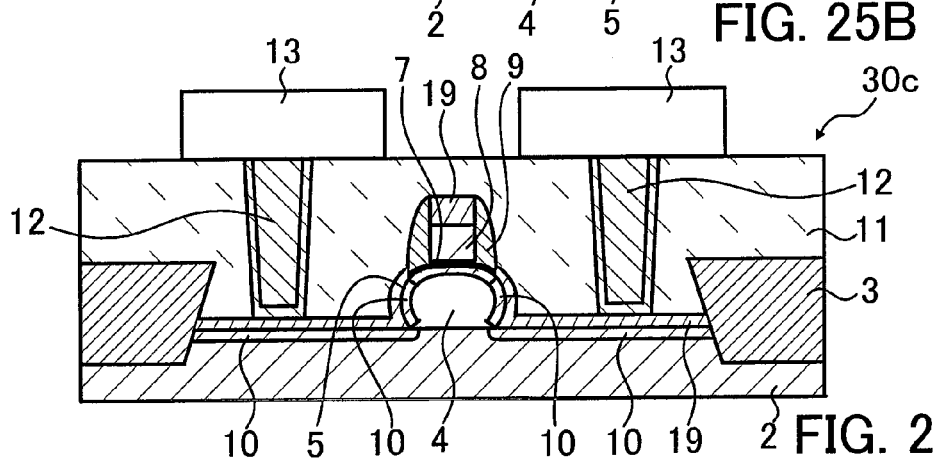

FIGS. 25A through 25C are views showing a semiconductor device according to a fourth example of the third embodiment of the present invention, FIG. 25A being a plan view of the semiconductor device, FIG. 25B a cross-sectional view taken along line X–X' of FIG. 25A, and FIG. 25C a cross-sectional view taken along line Y–Y' of FIG. 25A.

A semiconductor device 30c shown in FIGS. 25A, 25B, and 25C is different from the semiconductor device 30b according to the third example in that the plugs 12 are connected to only the silicide layer 19 formed on the surface of the source/drain 10 on the Si substrate 2, and has other structural details identical to those of the semiconductor device 30b according to the third example. The interlayer insulating film 11 is omitted from illustration in FIG. 25A. The silicide layer 19 thus formed is effective to achieve a low-resistance electric connection, allow the plugs 12 to be formed in desired positions with greater freedom, increase the transistor performance, and increase a yield of transistors. The source/drain 10 formed on the thin-film Si layer 5 may be silicidized in its entirety.

As described above with respect to the first through third embodiments, strains in the thin-film Si layer 5 can be increased for drastically increasing the carrier mobility by curving the thin-film Si layer 5. By forming the cavity 4 below the curved thin-film Si layer 5 or filling the region below the curved thin-film Si layer 5 with the interlayer insulating film 11, the channel and the source/drain 10 can be of a SON structure or a SOI structure. Thus, it is possible to realize a high-speed, low-power-consumption semiconductor device having a transistor structure with a high carrier mobility and a low parasitic capacitance.

When the thin-film Si layer 5 is to be curved, the thin-film Si layer 5 may not necessarily be curved symmetrically with respect to a vertical axis as viewed in a cross section taken along line Y–Y'. This is because even if the thin-film Si layer 5 is curved asymmetrically with respect to a vertical axis, since the channel is formed in a region directly below the gate electrode 8, it is possible to produce greater strains in this region than possible with the conventional arrangement. In the first through third embodiments, at least one of the ends of the thin-film Si layer 5 that is curved from the region directly below the gate electrode 8 toward the source/drain 10 should preferably be curved closer to the Si substrate 2 by a length which is at least one-third of the thickness of the thin-film Si layer 5 from the region directly below the gate electrode 8. Alternatively, the ends of the thin-film Si layer 5 that is curved from the region directly below the gate electrode 8 toward the source/drain 10 should preferably be curved so as to be close to each other at a distance which is at most twice the radius of curvature of the curved thin-film Si layer 5.

In the above embodiments, the thin-film Si layer 5 is curved. An arrangement in which the performance of a transistor is increased without intentionally curving the thin-film Si layer 5 will be described below with respect to a fourth embodiment of the present invention.

Figure 26A:
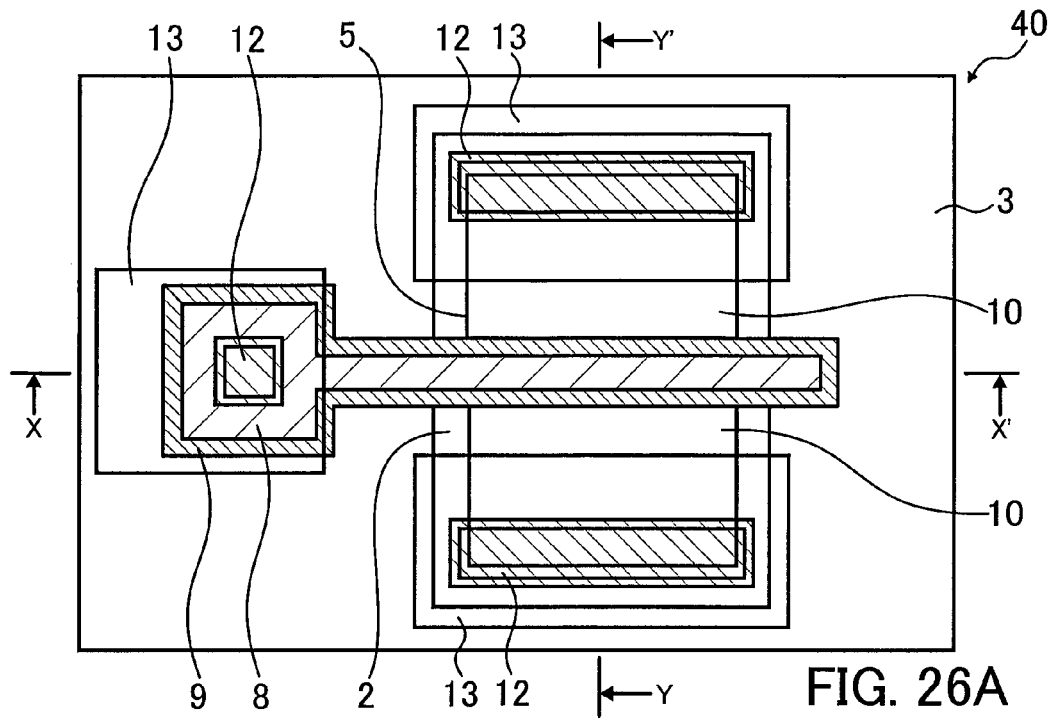
FIGS. 26A through 26C are views showing a semiconductor device according to a first example of a fourth embodiment of the present invention, FIG. 26A being a plan view of the semiconductor device, FIG. 26B a cross-sectional view taken along line X–X' of FIG. 26A, and FIG. 26C a cross-sectional view taken along line Y–Y' of FIG. 26A.
Figure 26B:
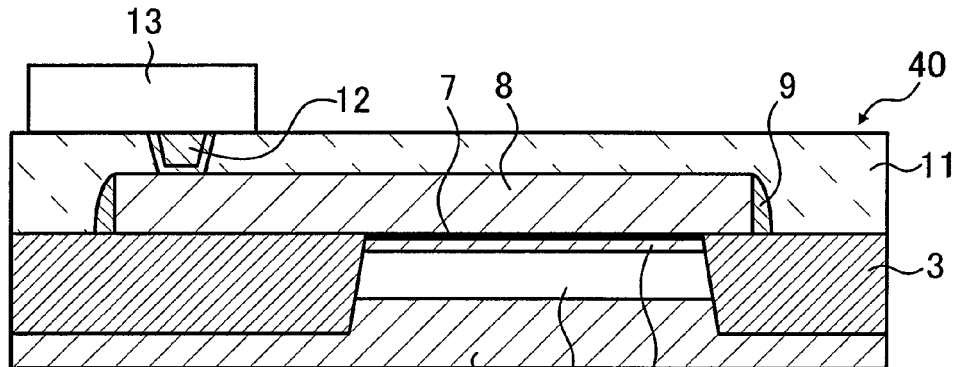
Figure 26C:
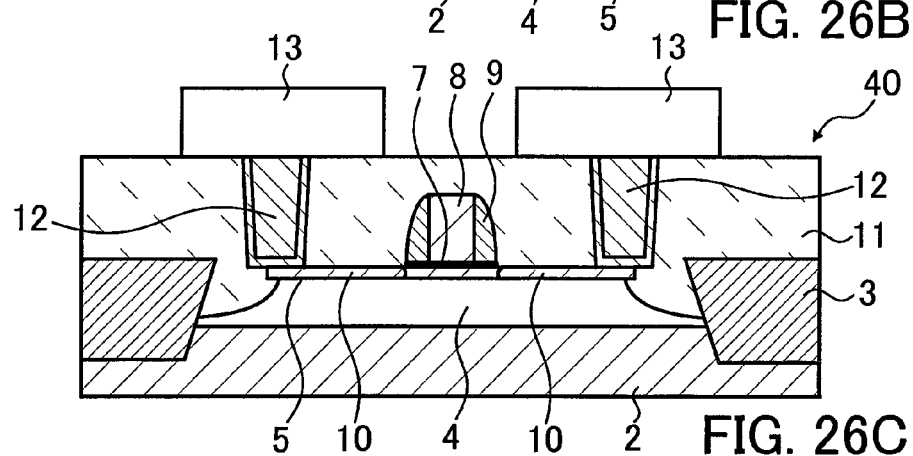

FIGS. 26A through 26C are views showing a semiconductor device according to a first example of a fourth embodiment of the present invention, FIG. 26A being a plan view of the semiconductor device, FIG. 26B a cross-sectional view taken along line X–X' of FIG. 26A, and FIG. 26C a cross-sectional view taken along line Y–Y' of FIG. 26A.

A semiconductor device 40 shown in FIGS. 26A, 26B, and 26C is different from the semiconductor device 1 according to the first embodiment in that the source/drain 10 is formed on the thin-film Si layer 5 that is not intentionally curved to form a channel region directly below the gate electrode 8, and the plugs 12 have lower ends connected to the thin-film Si layer 5, and has other structural details identical to those of the semiconductor device 1 according to the first embodiment. The interlayer insulating film 11 is omitted from illustration in FIG. 26A.

A process for manufacturing a semiconductor device 40 according to the fourth embodiment will be described below.

FIGS. 27A through 27C are views showing a manufacturing process for manufacturing the semiconductor device according to the first example of the fourth embodiment of the present invention, FIG. 27A being a plan view, FIG. 27B a cross-sectional view taken along line X–X' of FIG. 27A, and FIG. 27C a cross-sectional view taken along line Y–Y' of FIG. 27A. In FIGS. 27A through 27C, those elements which are identical to those shown in FIGS. 1A through 1C are denoted by identical reference numerals. The interlayer insulating film 11 is omitted from illustration in FIG. 27A.

The process for manufacturing the semiconductor device 40 has manufacturing steps identical to the first through sixth manufacturing steps which are described above with respect to the first embodiment. After the sixth manufacturing step, ions are introduced into the thin-film Si layer 5 with the cavity 4 formed therebelow, and the assembly is heated to form the source/drain 10. Then, the interlayer insulating film 11 is formed on the entire surface.

The interlayer insulating film 11 thus formed closes the opening of the cavity 4. After the interlayer insulating film 11 is formed, the plugs 12 extending to the gate electrode 8 and the source/drain 10 are formed, and finally the interconnection layer 13 is formed, completing the semiconductor device 40 shown in FIGS. 26A, 26B, and 26C. The ion implantation for forming the source/drain 10 may be performed before the cavity 4 is formed below the thin-film Si layer 5.

When ions are introduced into the thin-film Si layer 5 with the cavity 4 formed therebelow, and the assembly is heated to form the source/drain 10 in the production of the semiconductor device 40, the thin-film Si layer 5 may possible be curved under certain processing conditions. To prevent the thin-film Si layer 5 from being thus curved, conditions for the ion implantation and the heat treatment may be appropriately established, or the film thickness of the thin-film Si layer 5 may be increased to prevent the thin-film Si layer 5 from being curved by the ion implantation, or ions may be introduced before the cavity 4 is formed. Furthermore, the thin-film Si layer 5 may possibly be curved under a surface tension upon wet etching for forming the cavity 4. To prevent the thin-film Si layer 5 from being thus curved, the pure water used to wash away the etching liquid may be mixed with a surface-active agent to reduce the surface tension, or the film thickness of the thin-film Si layer 5 may be increased to prevent the thin-film Si layer 5 from being curved under the surface tension. To prevent the thin-film Si layer 5 from being curved, the thin-film Si layer 5 and the device separating region 3 may be connected to each other in a region other than the region directly below the gate electrode 8. For example, in the fifth manufacturing step, resist patterns 16a, 16b shown in FIGS. 33 and 35 may be formed instead of the resist pattern 16 shown in FIGS. 6A through 6C, and the assembly may be etched to form openings 17a, 17b.

The semiconductor device 40 has the cavity 4 formed below the source/drain 10 formed on the thin-film Si layer 5. Therefore, the parasitic capacitance can be reduced for increased high-speed transistor performance.

The semiconductor device 40 may employ a substrate of SOI structure of the Si substrate 2, the BOX layer, and the thin-film Si layer 5, with the cavity 4 formed by removing the BOX layer. Alternatively, the SOI substrate 2b may be employed instead of the Si substrate 2.

Figure 28A:
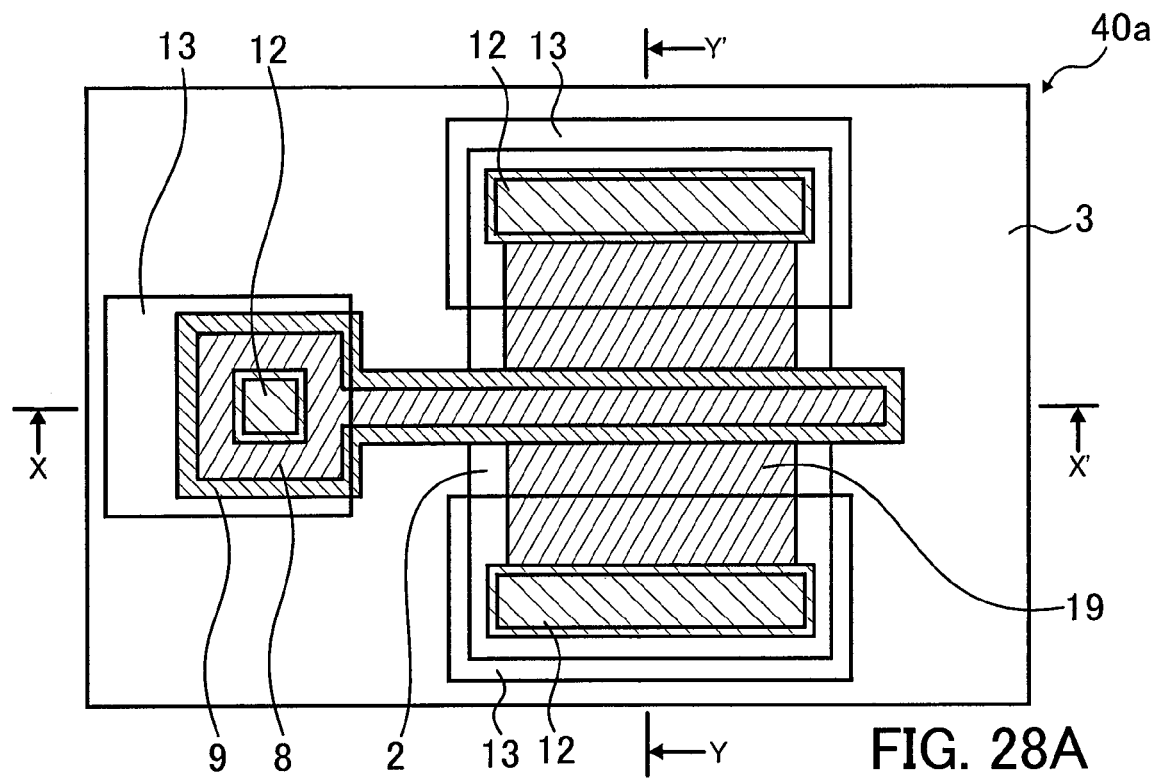
FIGS. 28A through 28C are views showing a semiconductor device according to a second example of the fourth embodiment of the present invention, FIG. 28A being a plan view of the semiconductor device, FIG. 28B a cross-sectional view taken along line X–X' of FIG. 28A, and FIG. 28C a cross-sectional view taken along line Y–Y' of FIG. 28A.
Figure 28B:
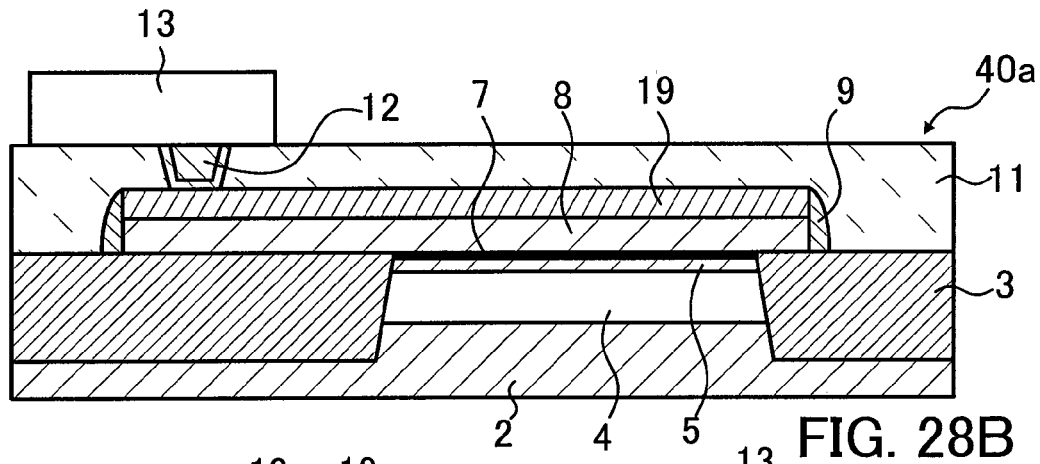
Figure 28C:
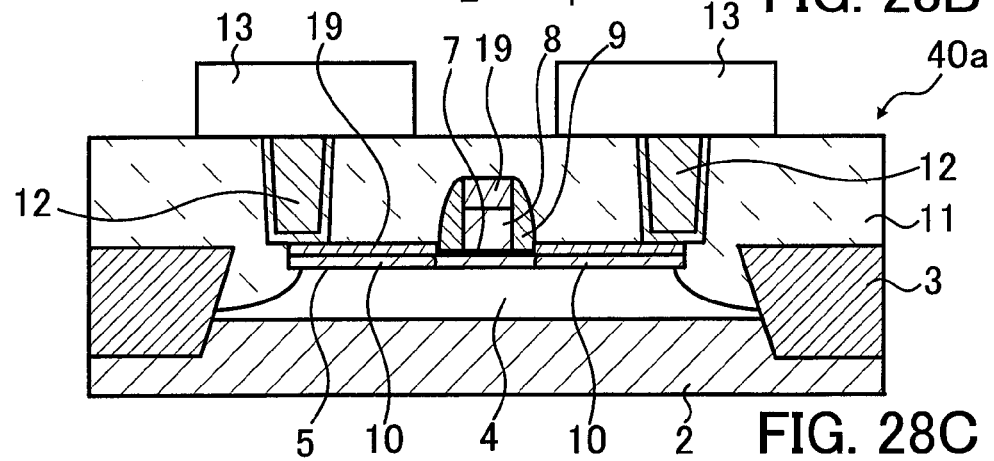

FIGS. 28A through 28C are views showing a semiconductor device according to a second example of the fourth embodiment of the present invention, FIG. 28A being a plan view of the semiconductor device, FIG. 28B a cross-sectional view taken along line X–X' of FIG. 28A, and FIG. 28C a cross-sectional view taken along line Y–Y' of FIG. 28A. In FIGS. 28A through 28C, those elements which are identical to those shown in FIGS. 18A through 18C and FIGS. 26A through 26C are denoted by identical reference numerals.

A semiconductor device 40a shown in FIGS. 28A, 28B, and 28C is different from the semiconductor device 40 according to the first example in that the silicide layer 19 is formed on the surfaces of the gate electrode 8 and the source/drain 10, and has other structural details identical to those of the semiconductor device 40 according to the first example. The interlayer insulating film 11 is omitted from illustration in FIG. 28A. The plugs 12 have lower ends connected to the silicide layer 19 formed on the surface of the source/drain 10 on the thin-film Si layer 5.

The semiconductor device 40a may employ a substrate of SOI structure of the Si substrate 2, the BOX layer, and the thin-film Si layer 5, with the cavity 4 formed by removing the BOX layer. Alternatively, the SOI substrate 2b may be employed instead of the Si substrate 2.

FIGS. 29A through 32C are views showing a manufacturing process for manufacturing a semiconductor device according to a third example of the fourth embodiment of the present invention, FIGS. 29A through 32A being plan views, FIGS. 29B through 32B cross-sectional views taken along line X–X' of FIGS. 29A through 32A, and FIGS. 29C through 32C cross-sectional views taken along line Y–Y' of FIGS. 29A through 32A. In FIGS. 29A through 32C, those elements which are identical to those shown in FIGS. 18A through 18C and FIGS. 26A through 26C are denoted by identical reference numerals.

Figure 29A:
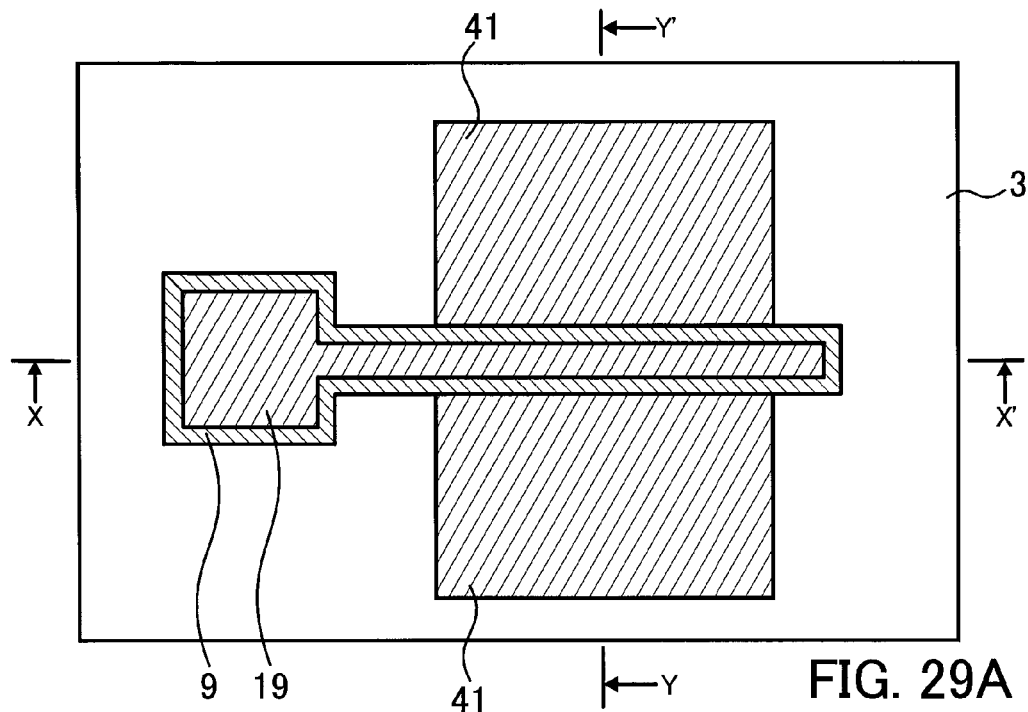
FIGS. 29A through 29C are views showing a manufacturing process (1) for manufacturing a semiconductor device according to a third example of the fourth embodiment of the present invention, FIG. 29A being a plan view, FIG. 29B a cross-sectional view taken along line X–X' of FIG. 29A, and FIG. 29C a cross-sectional view taken along line Y–Y' of FIG. 29A.
Figure 29B:
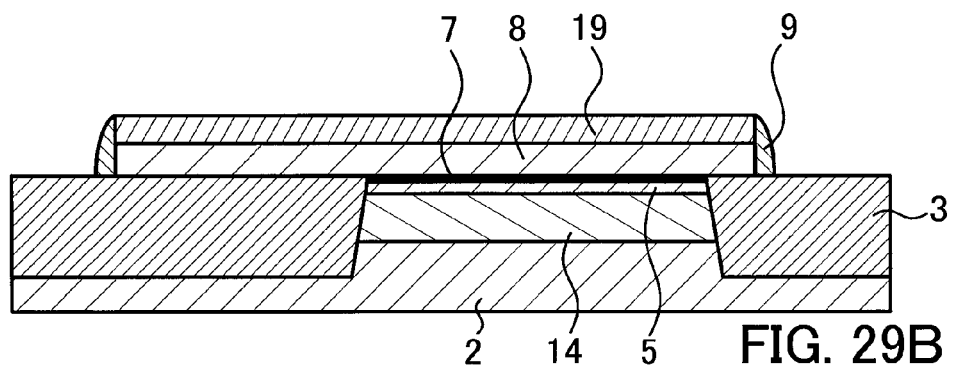
Figure 29C:
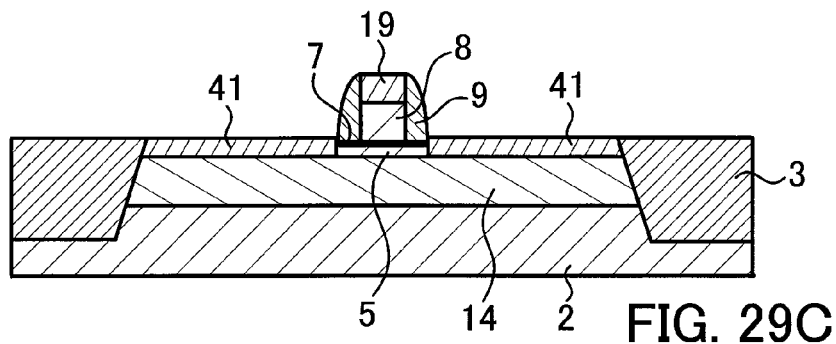
Figure 30A:
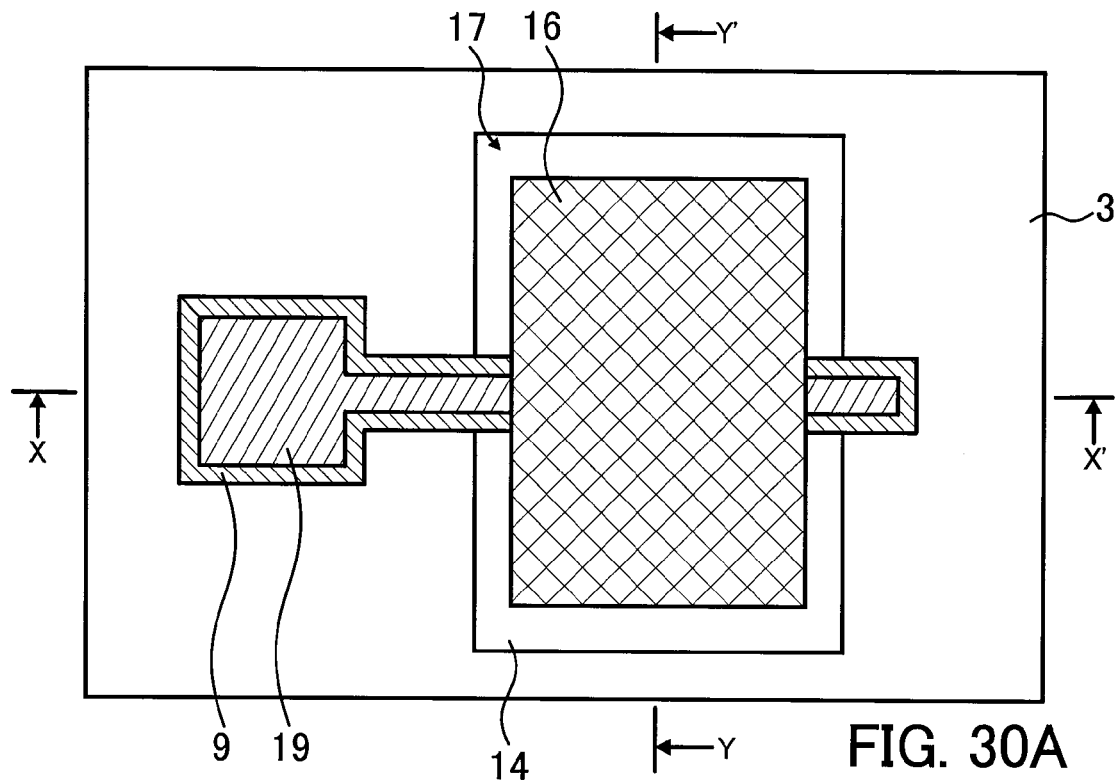
FIGS. 30A through 30C are views showing a manufacturing process (2) for manufacturing the semiconductor device according to the third example of the fourth embodiment of the present invention, FIG. 30A being a plan view, FIG. 30B a cross-sectional view taken along line X–X' of FIG. 30A, and FIG. 30C a cross-sectional view taken along line Y–Y' of FIG. 30A.
Figure 30B:
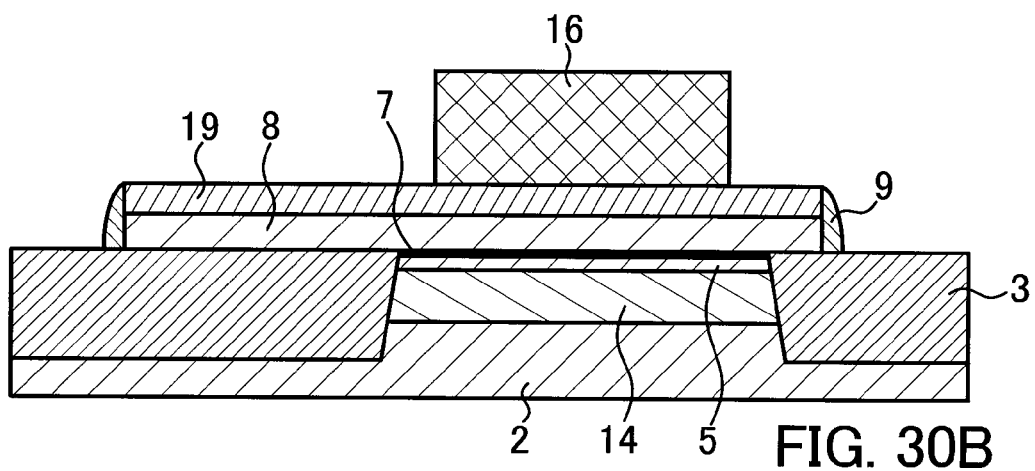
Figure 30C:
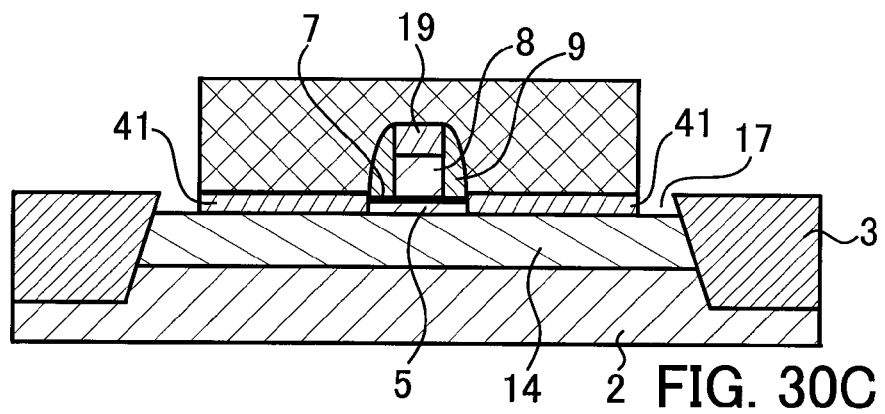

A semiconductor device 40b according to a third example is different from the semiconductor device 40 according to the first example in that the silicide layer 19 is formed on the surface of the gate electrode 8 and a source/drain 41 is silicidized in its entirety. The semiconductor device 40b is manufactured as follows: Before the cavity 4 is formed below the thin-film Si layer 5, ions are introduced to form the source/drain 41. As shown in FIGS. 29A, 29B, and 29C, the surface of the entire source/drain 41 within the transistor forming region surrounded by the device separating region 3 and the surface of the gate electrode 8 are silicidized. Then, as shown in FIGS. 30A, 30B, and 30C, a resist pattern 16 is formed, and the assembly is etched using the resist pattern 16 as a mask, forming an opening 17 between the device separating region 3 and the source/drain 41. Then, as shown in FIGS. 31A, 31B, and 31C, the SiGe layer 14 is removed to form the cavity 4 by wet etching. Then, as shown in FIGS. 32A, 32B, and 32C, the resist pattern 16 is removed. Rather than the wet etching, isotropic etching such as isotropic dry etching may be employed insofar as it can remove the SiGe layer 14 via a turnaround path. Subsequently, as with the semiconductor device 40 according to the first example, the interlayer insulating film 11 is formed on the entire surface to close the opening 17 of the cavity 4, the plugs 12 extending to the gate electrode 8 and the source/drain 41 are formed, and the interconnection layer 13 is formed. The source/drain 41 is silicidized in its entirety to achieve a low-resistance electric connection between the gate electrode 8 and the plugs 12 and between the source/drain 41 and the plugs 12.

According to the fourth embodiment, the cavity 4 is formed by forming the resist pattern 16 as shown in FIGS. 6A through 6C, etching the thin-film Si layer 5 using the resist pattern 16 as a mask, forming the opening 17 between the thin-film Si layer 5 and the device separating region 3, and introducing an etching liquid from the opening 17 to remove the SiGe layer 14 below the thin-film Si layer 5. The shape and position of the opening for removing the sacrificial layer therethrough are determined by the shape of the resist pattern that is formed.

Figure 33:
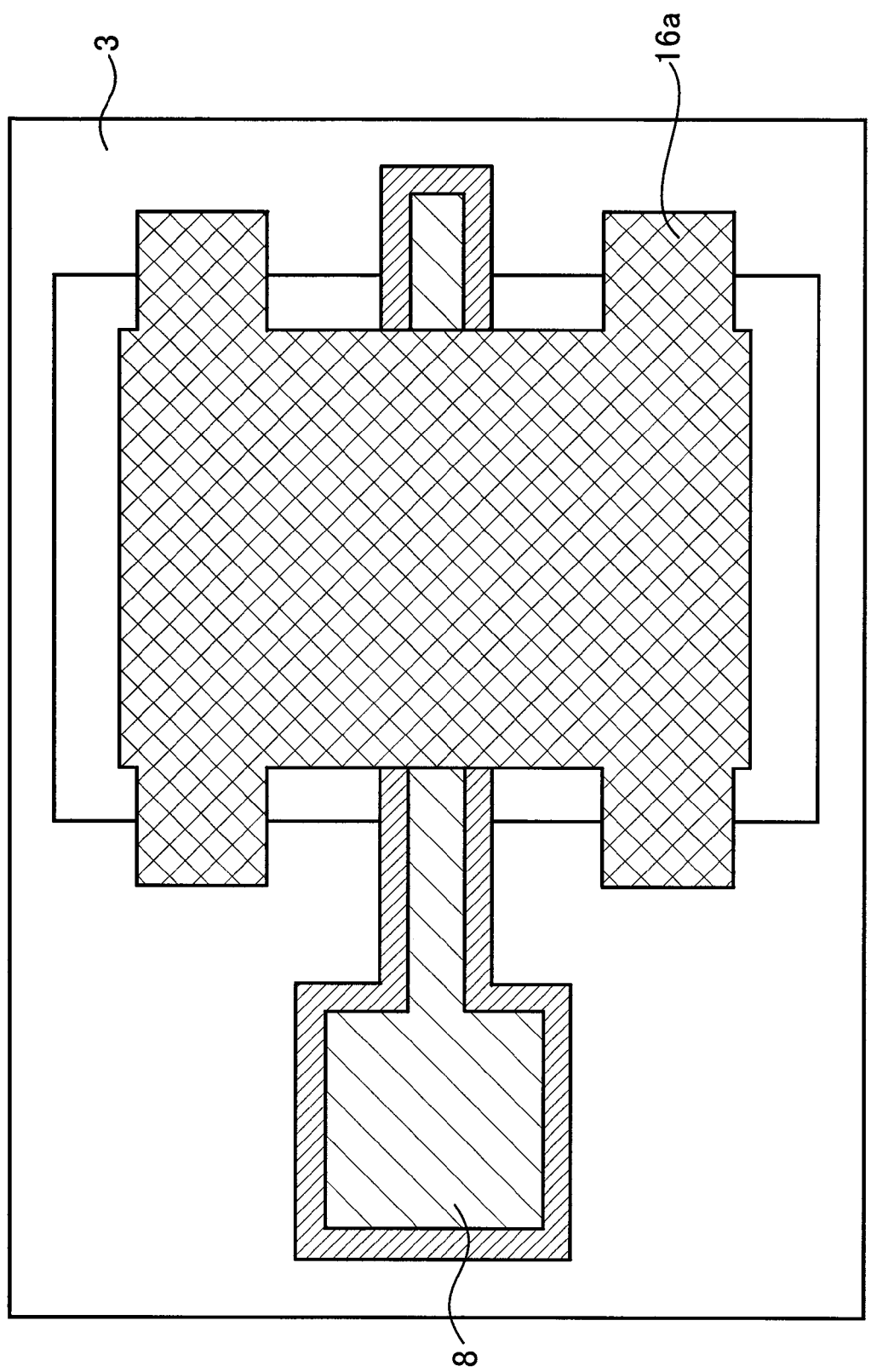
FIG. 33 is a plan view of a resist pattern according to a first example.
Figure 34:
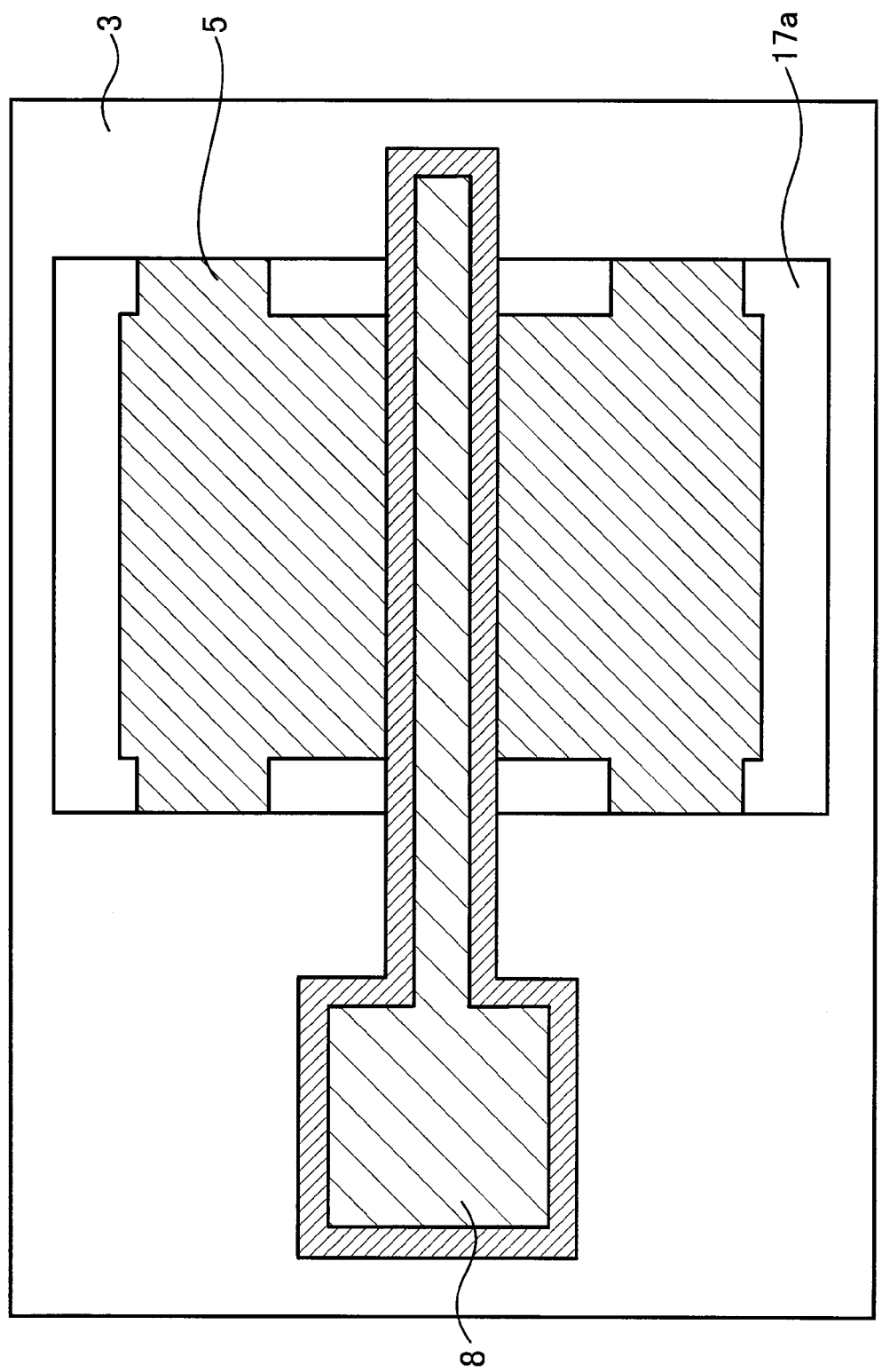
FIG. 34 is a plan view of an opening which is formed by the resist pattern according to the first example.

FIG. 33 is a plan view of a resist pattern according to a first example, and FIG. 34 is a plan view of an opening which is formed by the resist pattern according to the first example. In FIGS. 33 and 34, those elements which are identical to those shown in FIGS. 6A through 6C are denoted by identical reference numerals.

A resist pattern 16a shown in FIG. 33 is different from the resist pattern 16 shown in FIGS. 6A through 6C in that the resist pattern 16a is formed partly on the device separating region 3. The illustrated resist pattern 16a has four portions formed on the device separating region 3. When the resist pattern 16a thus shaped is removed, the thin-film Si layer 5 is shaped as shown in FIG. 34, with the region between the thin-film Si layer 5 and the device separating region 3 serving as an opening 17a. With the resist pattern 16a, the thin-film Si layer 5 is connected to the device separating region 3 through a total of six portions including the one directly below the gate electrode 8.

Figure 35:
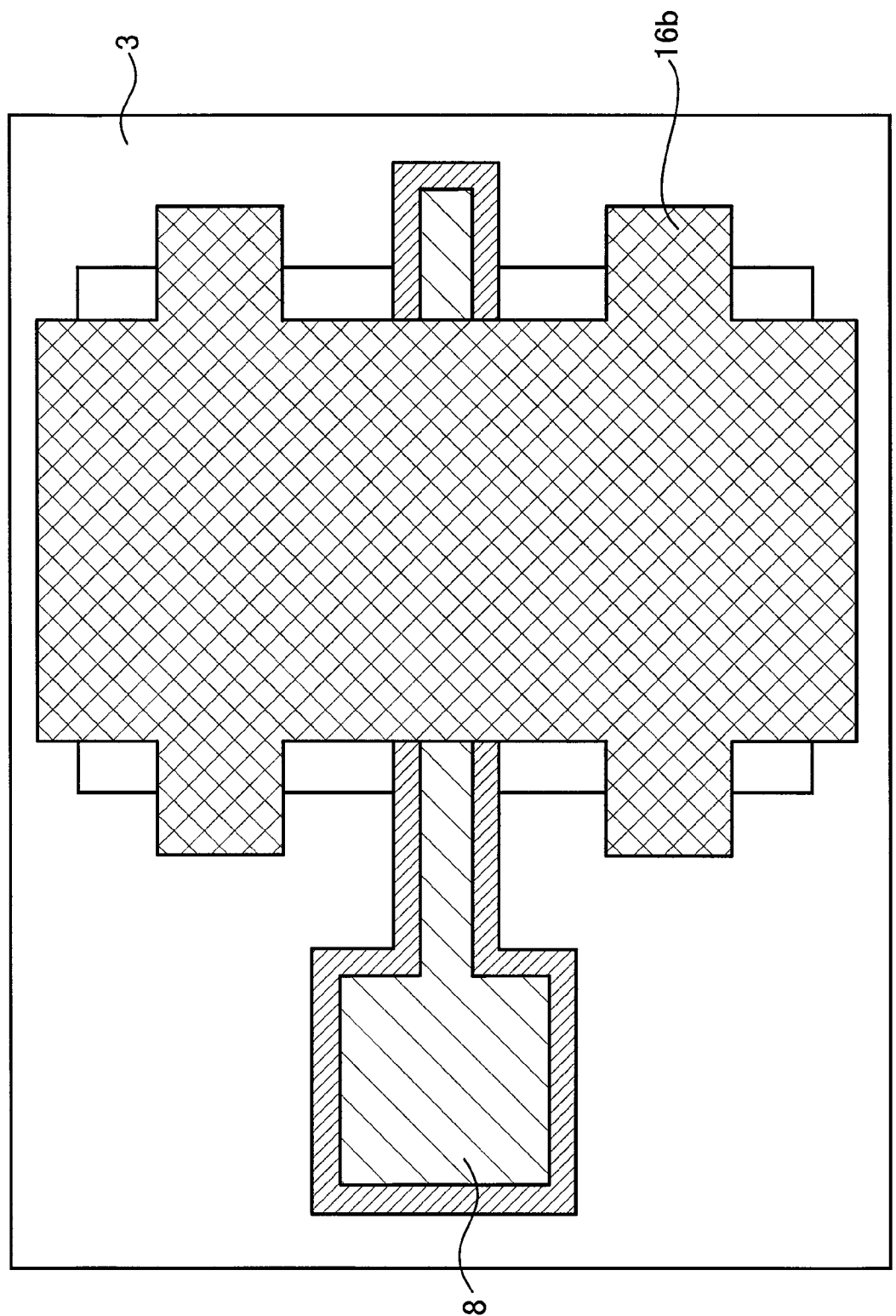
FIG. 35 is a plan view of a resist pattern according to a second example.
Figure 36:
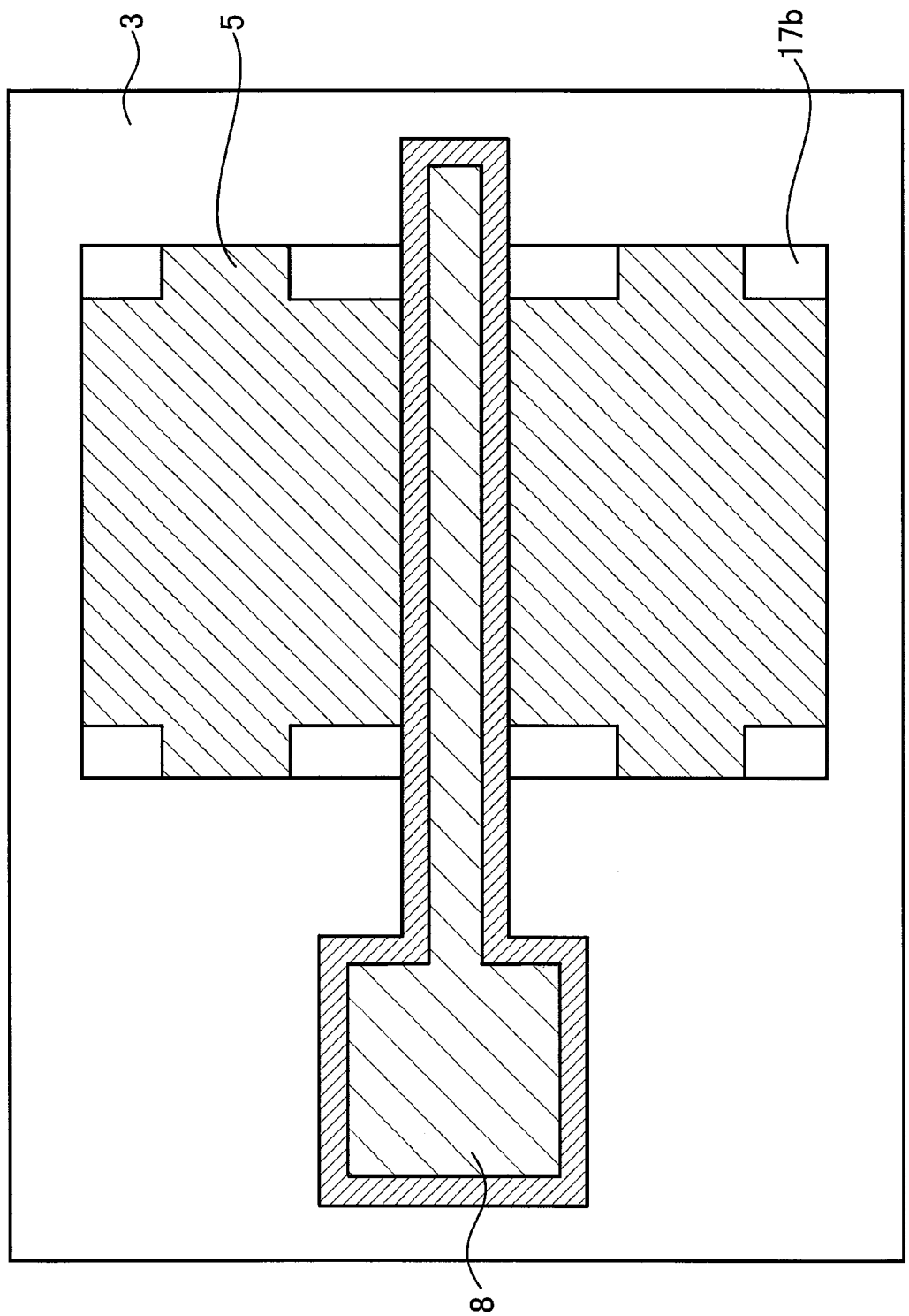
FIG. 36 is a plan view of an opening which is formed by the resist pattern according to the second example.

FIG. 35 is a plan view of a resist pattern according to a second example, and FIG. 36 is a plan view of an opening which is formed by the resist pattern according to the second example. In FIGS. 35 and 36, those elements which are identical to those shown in FIGS. 6A through 6C and 7A through 7C are denoted by identical reference numerals.

A resist pattern 16b shown in FIG. 35 has six portions formed on the device separating region 3. When the resist pattern 16b thus shaped is removed, the thin-film Si layer 5 is shaped as shown in FIG. 35, with the region between the thin-film Si layer 5 and the device separating region 3 serving as an opening 17b. With the resist pattern 16b, the thin-film Si layer 5 is connected to the device separating region 3 through a total of eight portions including the one directly below the gate electrode 8.

By forming the resist patterns 16a, 16b as shown in FIGS. 33 and 35, the thin-film Si layer 5 can be connected to the device separating region 3 at more locations to prevent the thin-film Si layer 5 from falling off, as shown in FIGS. 34 and 36. The illustrated resist patterns 16a, 16b are shaped such that the positions where the thin-film Si layer 5 is connected to the device separating region 3 are intermittently located. Therefore, the SiGe layer 4 can sufficiently be removed by wet etching, and the thin-film Si layer 5 is prevented from being curved by the surface tension, the ion implantation, etc.

The illustrated resist patterns 16a, 16b are given by way of example only, and may be of other shapes. For example, though the resist patterns 16a, 16b provide a plurality of openings 17a, 17b, they may be shaped to provide a single opening. The resist patterns may be shaped to provide an opening only in the region between the ends of the source/drain 10 in the direction of the gate length of the gate electrode 8 and the device separating region 3. Alternatively, the resist patterns may be shaped to provide an opening only in the region between the region directly below the gate electrode 8 and a region except between the ends of the source/drain 10 in the direction of the gate length of the gate electrode 8 and the device separating region 3.

Since the shape and position of the opening can be determined by the shape of the resist that is formed, it is possible to form the opening in a position away from the gate electrode 8. In this case, when the opening is closed by the interlayer insulating film 11, the interlayer insulating film 11 is prevented from spreading into the cavity 4 directly below the gate electrode 8. As the cavity 4 is thicker, the ability to reduce the parasitic capacitance becomes greater. If the opening is spaced from the gate electrode 8, then the cavity 4 can be made sufficiently thick. The shape of the resist may be designed for semiconductor devices to be produced in view of the etching efficiency for forming the cavity 4, the strength of the connection between the thin-film Si layer 5 and the gate electrode 8, an the distance of the opening from the gate electrode 8, etc.

The process of forming the wet etching opening 17 using the resist pattern 16 and removing the sacrificial layer such as the SiGe layer 14 or the like through the opening 17 has been described above. However, the sacrificial layer may be removed by other processes. Other processes of removing the sacrificial layer are illustrated by way of first through third examples.

A sacrificial layer removing process according to a first example will be described below with reference to FIGS. 37 through 40. In FIGS. 37 through 40, those elements which are identical to those shown in FIGS. 1A through 1C are denoted by identical reference numerals.

Figure 37:
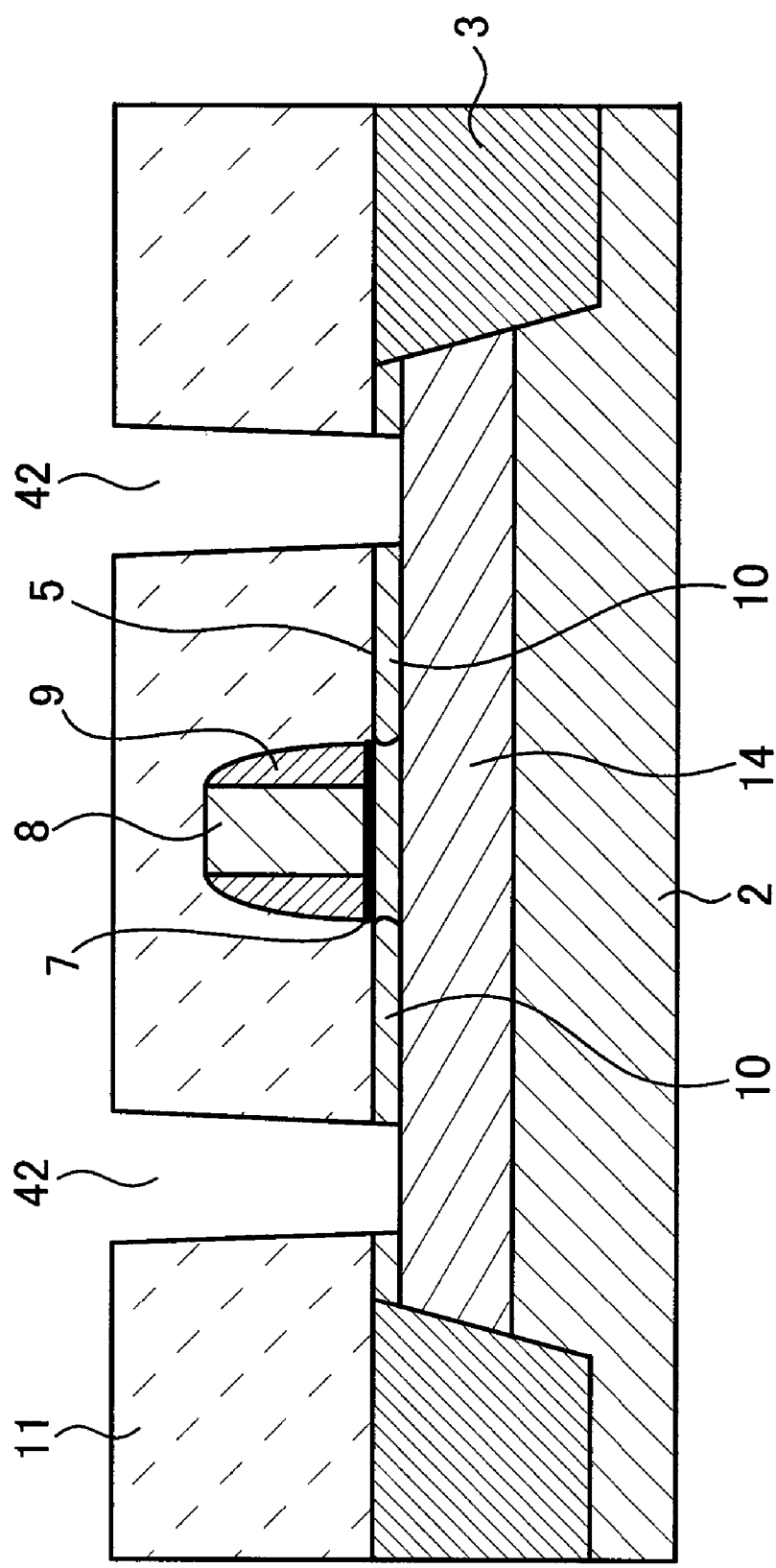
FIG. 37 is a view showing a first step of a sacrificial layer removing process according to a first example.

FIG. 37 is a view showing a first step of the sacrificial layer removing process according to the first example.

After the first through fourth manufacturing steps described above with respect to the first embodiment, the processing goes to the eighth and ninth manufacturing steps where the interlayer insulating film 11 is formed on the entire surface without removal of the SiGe layer 14. Instead of the tenth manufacturing step described above with respect to the first embodiment, contact holes 42 extending through the interlayer insulating film 11 and the thin-film Si layer 5 to the SiGe layer 14 are formed.

Figure 38:
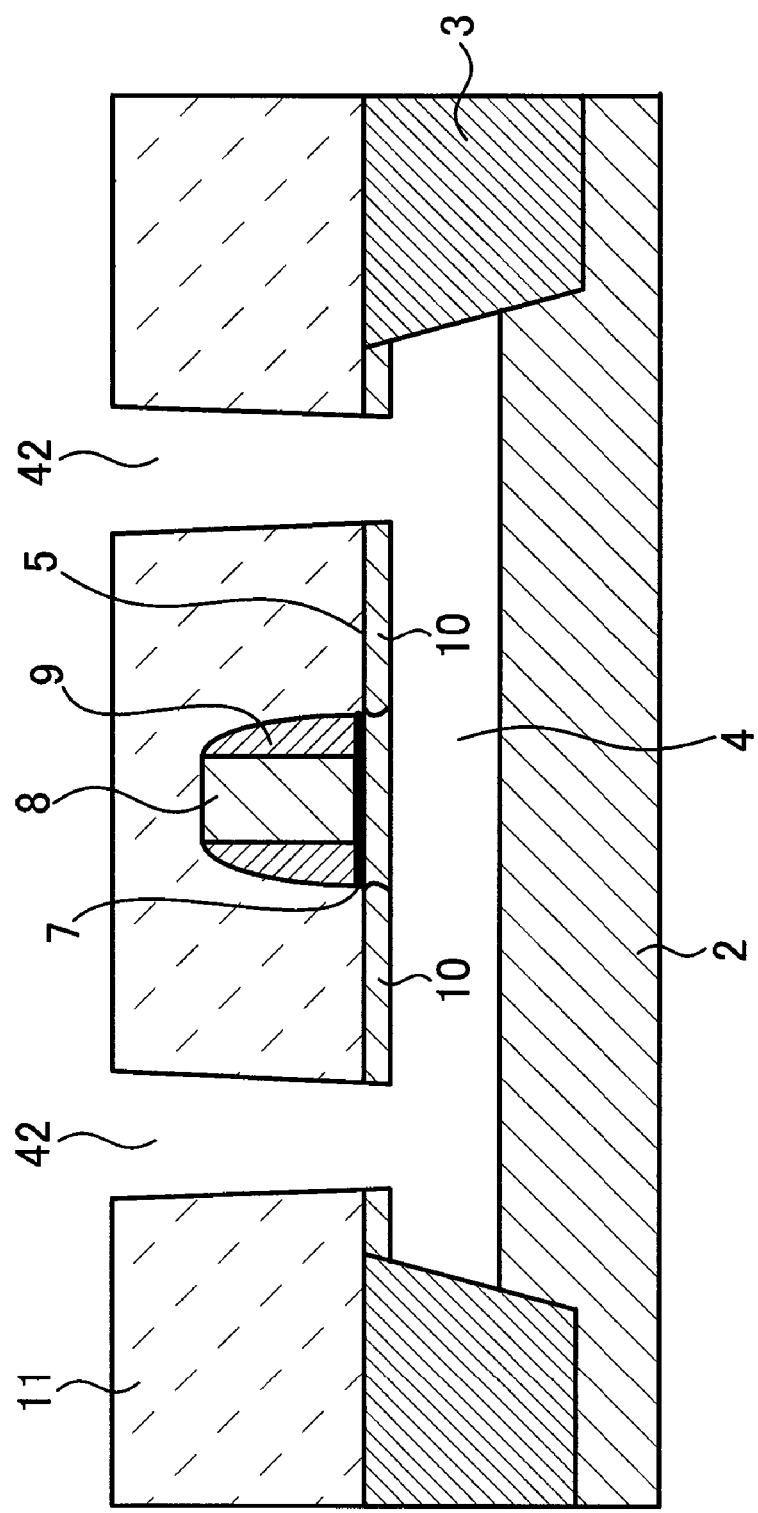
FIG. 38 is a view showing a second step of the sacrificial layer removing process according to the first example.

FIG. 38 is a view showing a second step of the sacrificial layer removing process according to the first example.

After the contact holes 42 are formed, the assembly is processed by wet etching to remove the SiGe layer 14 through the contact holes 42, forming the cavity 4 between the Si substrate 2 and the thin-film Si layer 5.

Figure 39:
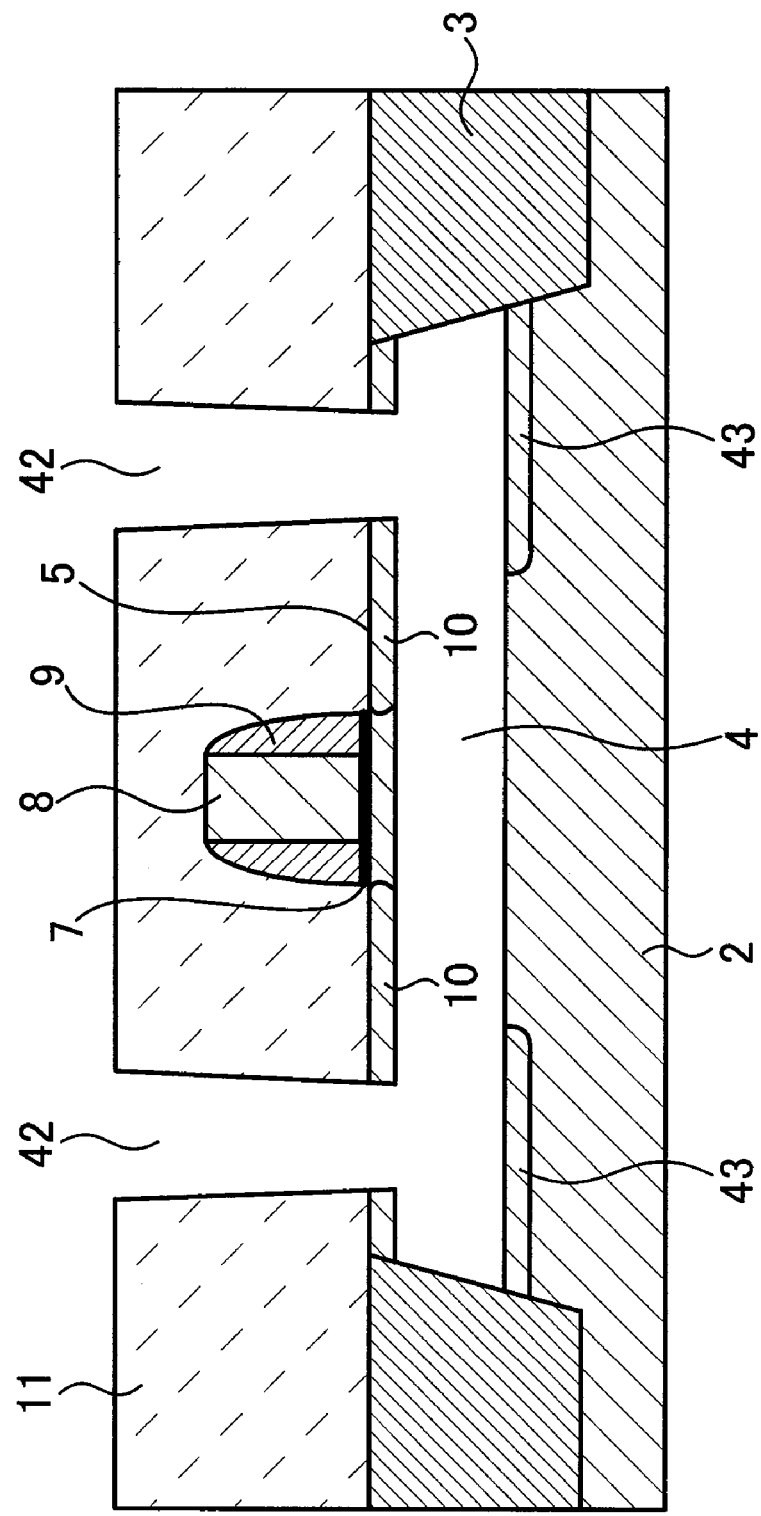
FIG. 39 is a view showing a third step of the sacrificial layer removing process according to the first example.

FIG. 39 is a view showing a third step of the sacrificial layer removing process according to the first example.

After the SiGe layer 14 is removed, ions are introduced into the Si substrate 2 through the contact holes 42. The assembly is then heated to form an impurity diffusion layer 43 which corresponds to a source/drain.

Figure 40:
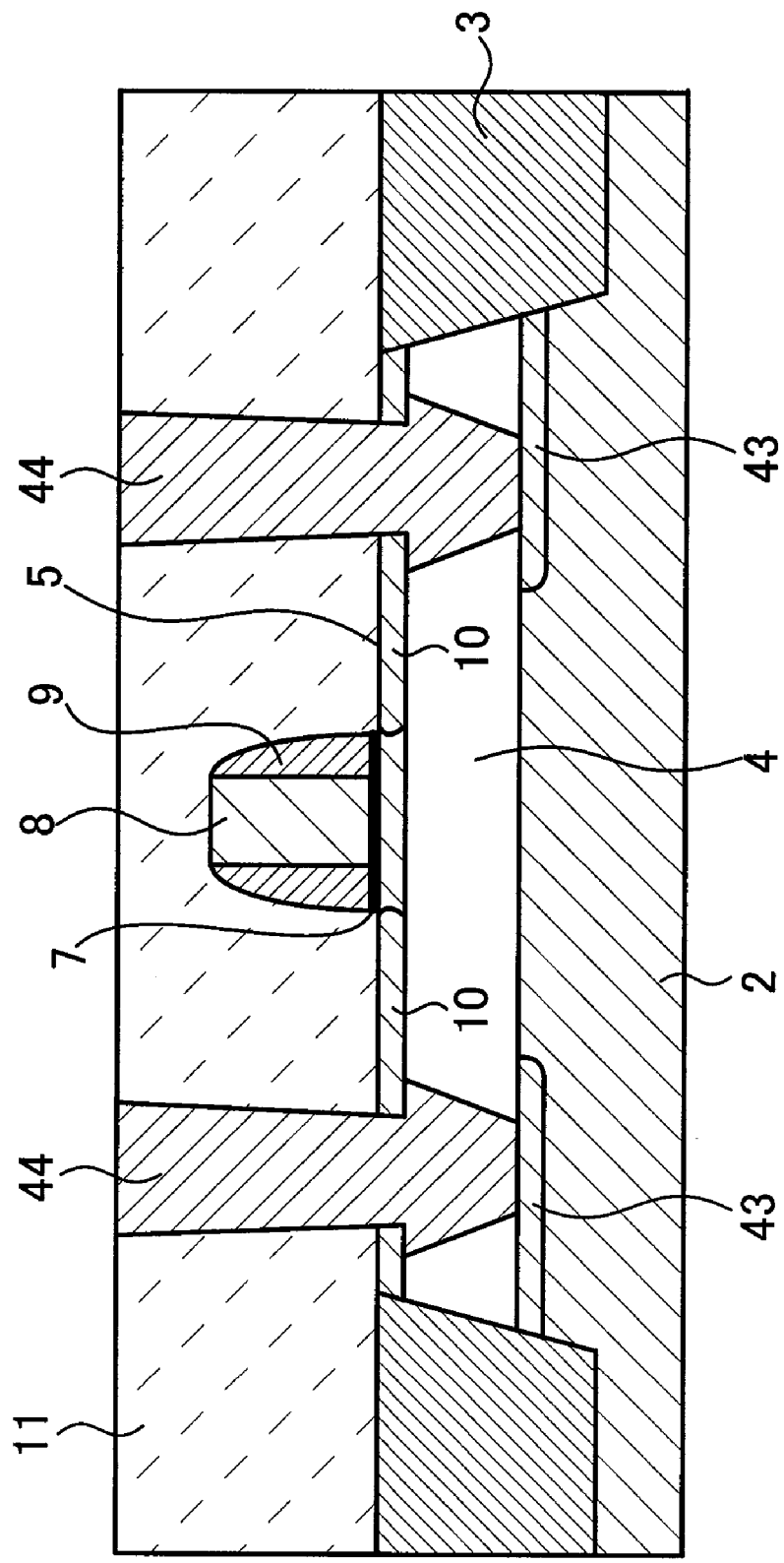
FIG. 40 is a view showing a fourth step of the sacrificial layer removing process according to the first example.

FIG. 40 is a view showing a fourth step of the sacrificial layer removing process according to the first example.

After the impurity diffusion layer 43 is formed, an electrically conductive film is deposited to form plugs 44.

With the sacrificial layer removing process according to the first example, the electrically conductive film of the plugs in the contact holes 42 is connected tot the source/ drain 10 and has its lower ends connected to the impurity diffusion layer 43. If the impurity diffusion layer 43 is not formed in the Si substrate 2, then a source-drain short circuit occurs when the electrically conductive film is connected to the Si substrate 2. However, with the impurity diffusion layer 43 formed in the Si substrate 2, even when the electrically conductive film contacts the Si substrate 2, it contacts a pn junction, providing a source-drain electric isolation. In the first example, though the ability to reduce the junction capacitance of the source/drain 10 is reduced by the impurity diffusion layer 43, it is possible to reduce the junction capacitance between the channel and the Si substrate 2.

If the SiGe layer 14 is relatively thin, the impurity diffusion layer 43 may be formed in the Si substrate 2 by introducing ions to form the source/drain 10 on the thin-film Si layer 5. If the impurity diffusion layer 43 is left after the removal of the SiGe layer 14, then ions may not be introduced through the contact holes 42 into the Si substrate 2 for forming the impurity diffusion layer 43. The sacrificial layer removing process according to the first example may be applied as it is even if the source/drain 10 has been silicidized.

A sacrificial layer removing process according to a second example will be described below with reference to FIGS. 41 through 44. In FIGS. 41 through 44, those elements which are identical to those shown in FIGS. 1A through 1C are denoted by identical reference numerals.

Figure 41:
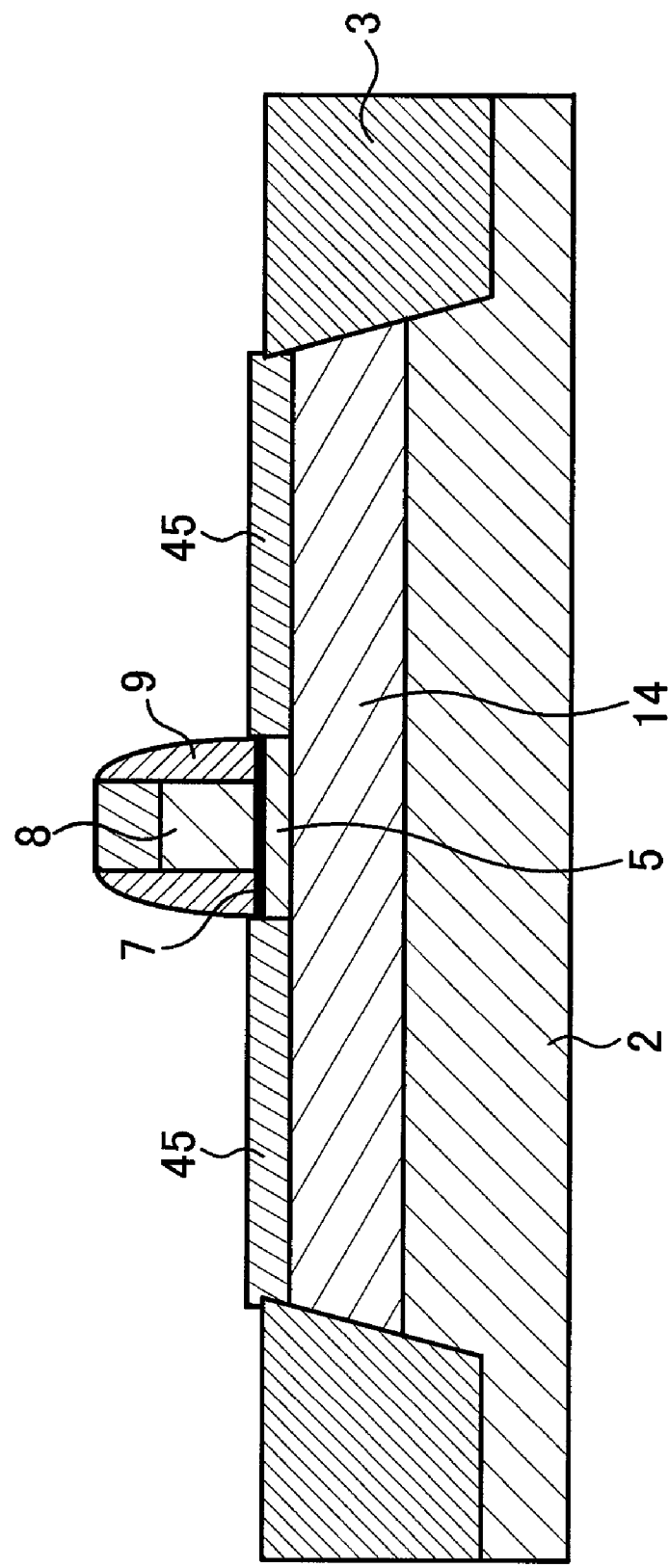
FIG. 41 is a view showing a first step of a sacrificial layer removing process according to a second example.

FIG. 41 is a view showing a first step of the sacrificial layer removing process according to the second example.

In the second example, the source/drain has been silicidized in its entirety. After the first through fourth manufacturing steps described above with respect to the first embodiment, the processing goes to the eighth manufacturing step where the source/drain, after it is formed, is silicidized to form a suicide layer 45. At this time, the silicide layer 45 is formed by forming the thin-film Si layer 5 as a thin layer in advance and silicidizing the source/drain in the thin-film Si layer 5 in its entirety.

Figure 42:
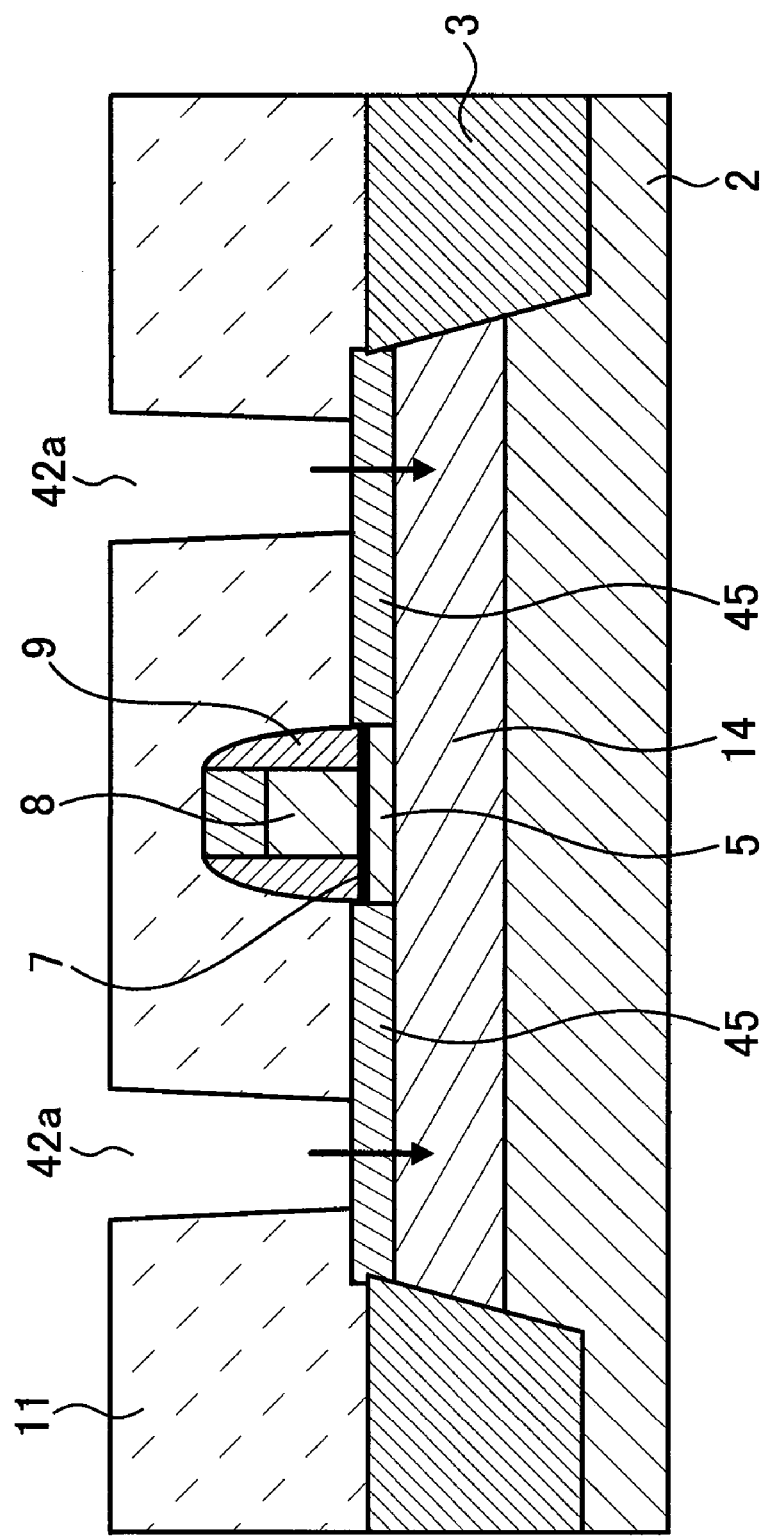
FIG. 42 is a view showing a second step of the sacrificial layer removing process according to the second example.

FIG. 42 is a view showing a second step of the sacrificial layer removing process according to the second example.

After the silicide layer 45 is formed, the interlayer insulating film 11 is formed on the entire surface, and contact holes 42 extending through the interlayer insulating film 11 to the silicide layer 45 are formed. Then, the SiGe layer 14 is subjected to wet etching. Since the silicide layer 45 has many interstices, the etching liquid enters through the contact holes 42a into the SiGe layer 14 upon the wet etching.

Figure 43:
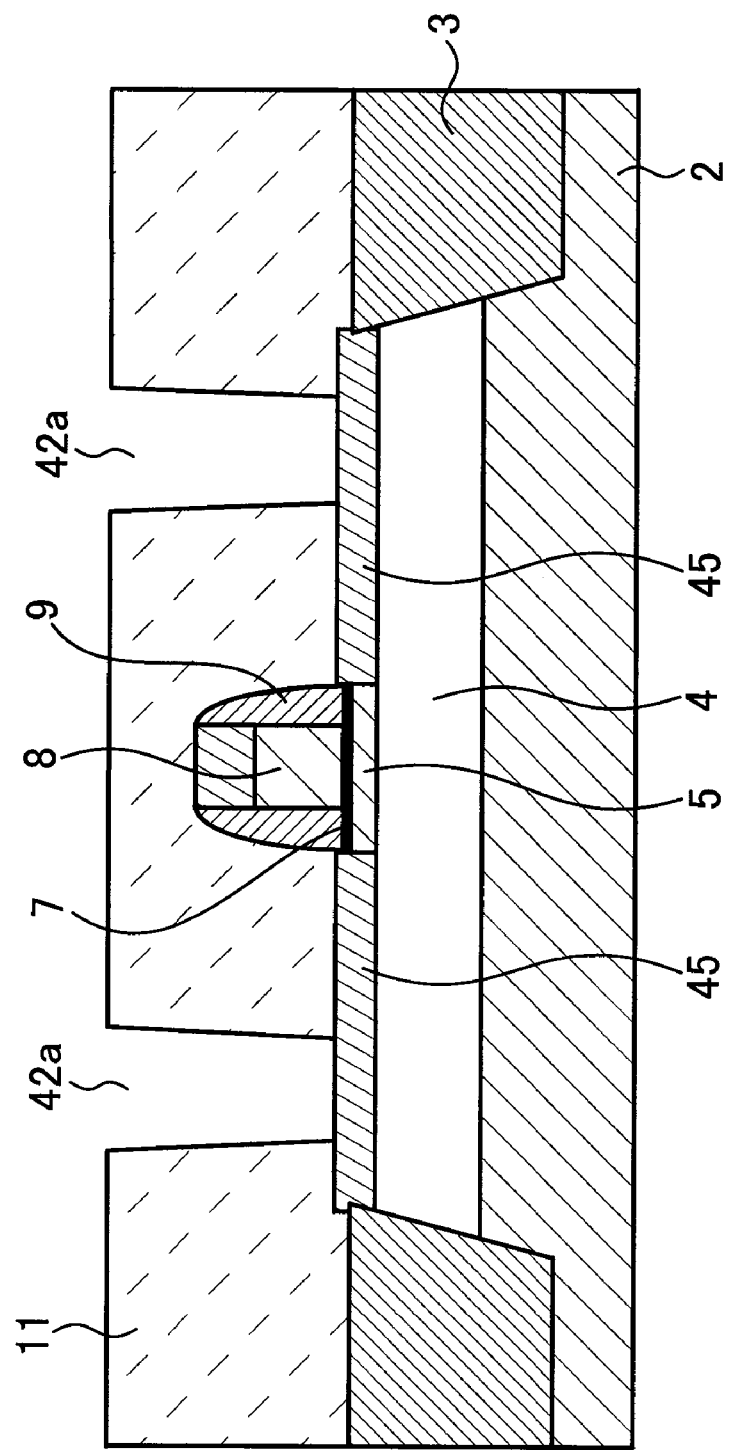
FIG. 43 is a view showing a third step of the sacrificial layer removing process according to the second example.

FIG. 43 is a view showing a third step of the sacrificial layer removing process according to the second example.

The SiGe layer 14 is removed through the silicide layer 45 and the contact holes 42a by the introduced etching liquid, forming the cavity 4 below the silicide layer 45 and the thin-film Si layer 5. The silicide layer 45 is left on the bottoms of the contact holes 42a.

Figure 44:
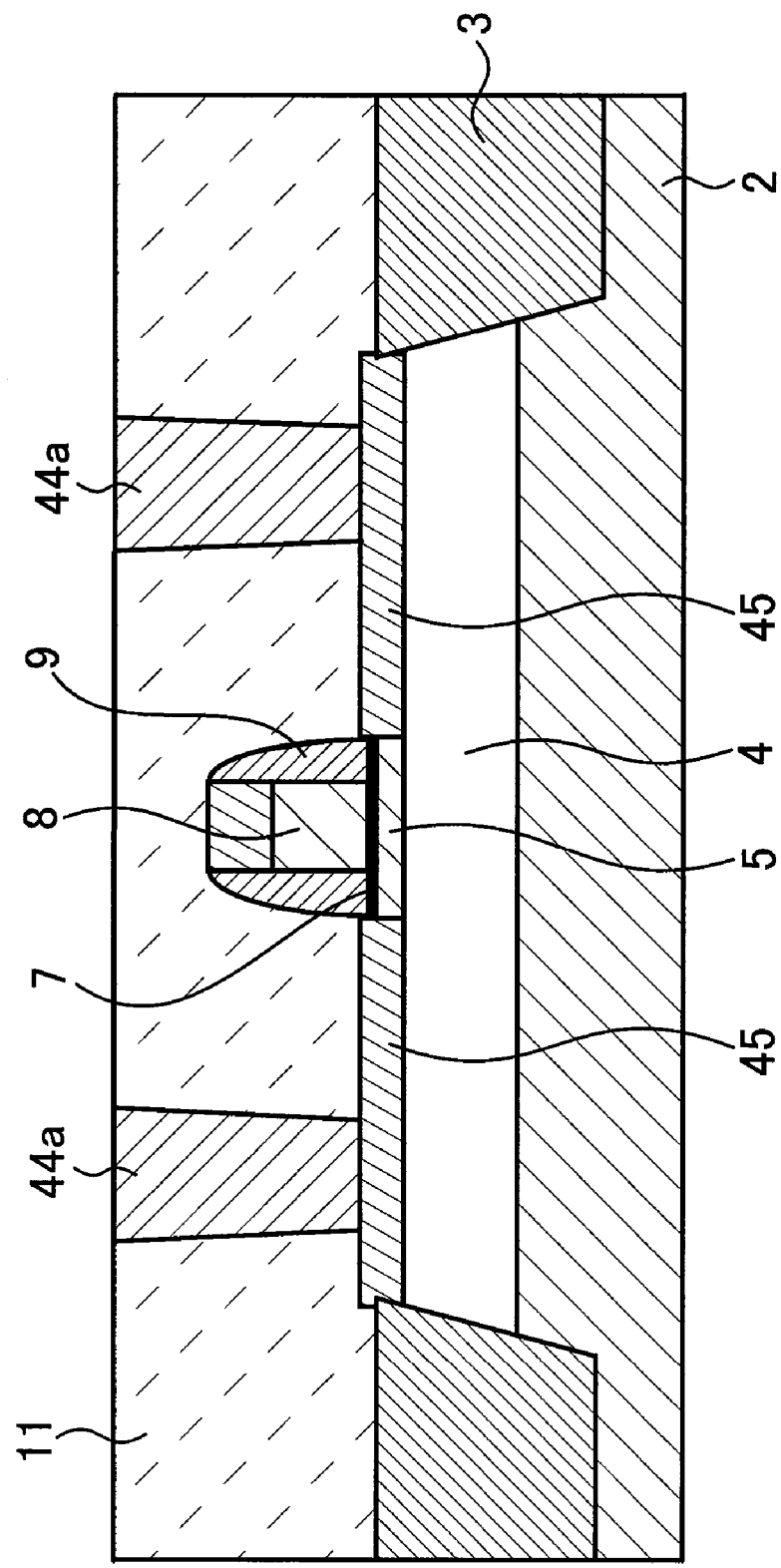
FIG. 44 is a view showing a fourth step of the sacrificial layer removing process according to the second example.

FIG. 44 is a view showing a fourth step of the sacrificial layer removing process according to the second example.

An electrically conductive film is formed in contact holes 42a to form plugs 44a. The electrically conductive film for forming the plugs 44a has poor coverage regardless of whether it is formed by sputtering or CVD, it cannot pass through the interstices of the silicide layer 45. As a result, a channel region and a region corresponding to the source/ drain are formed over the cavity 4, reducing the junction capacitance between the channel and the Si substrate 2 and the junction capacitance of the source drain 10.

Figure 45:
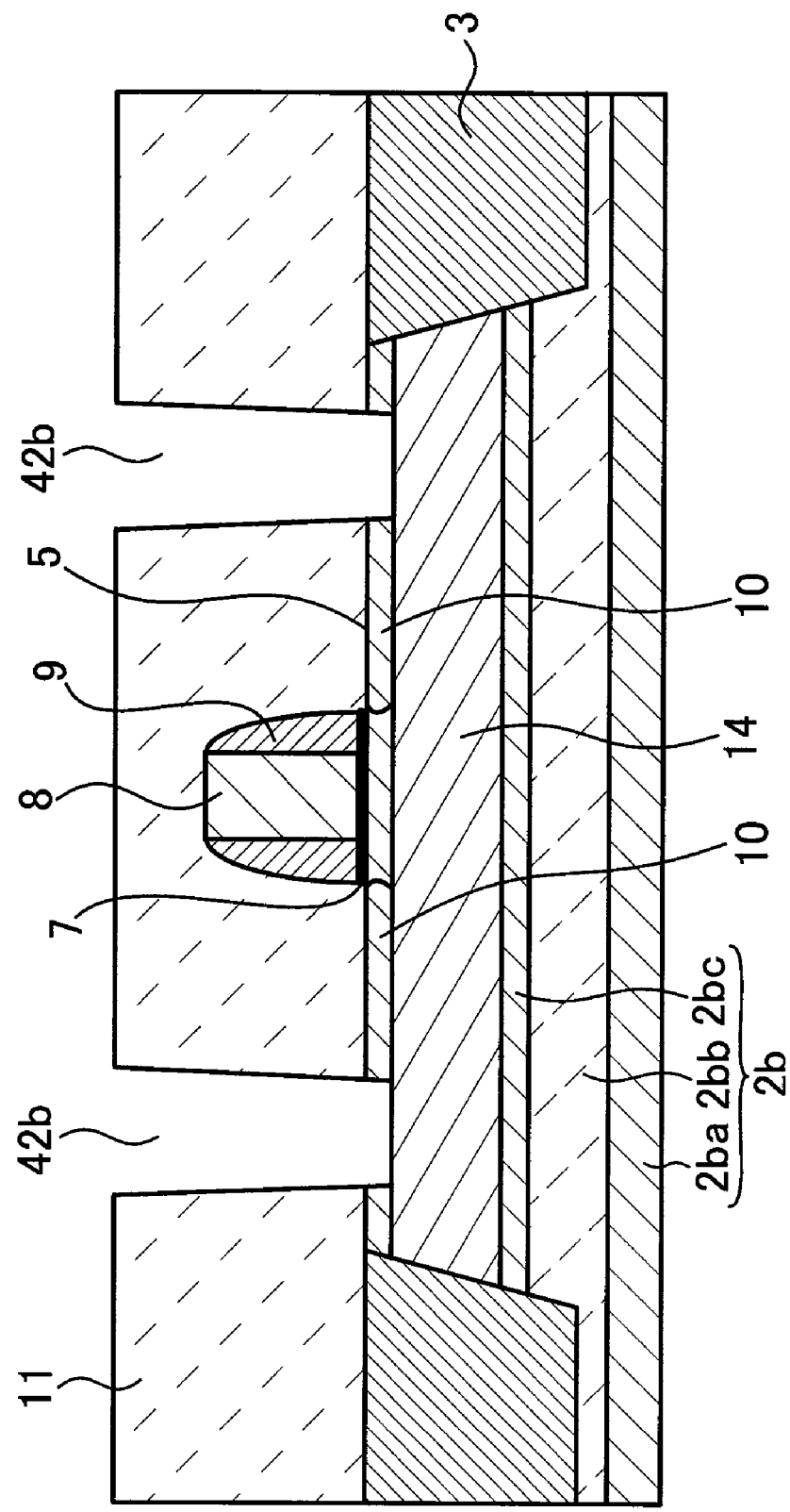
FIG. 45 is a view showing a first step of a sacrificial layer removing process according to a third example.
Figure 46:
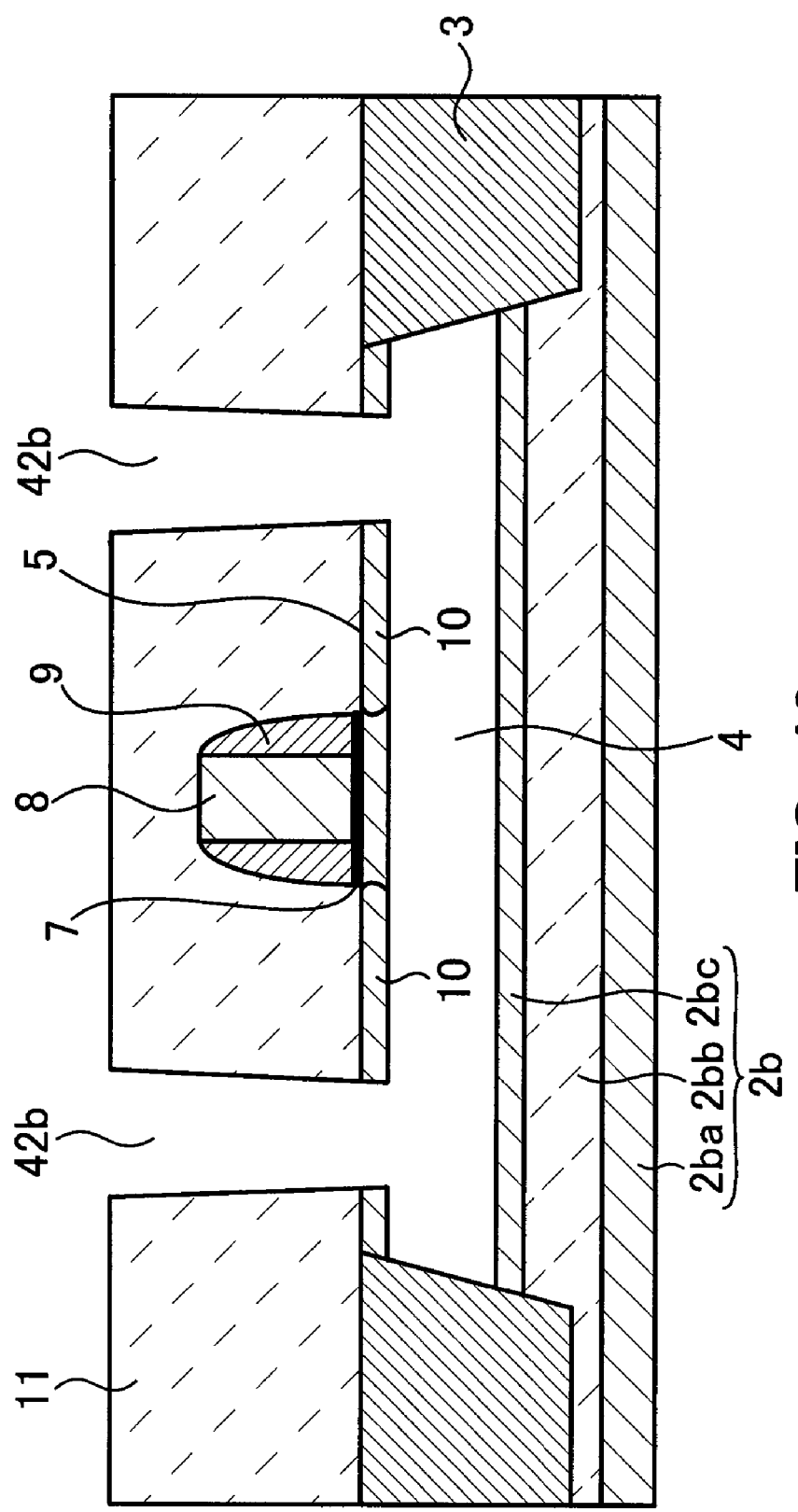
FIG. 46 is a view showing a second step of the sacrificial layer removing process according to the third example.
Figure 47:
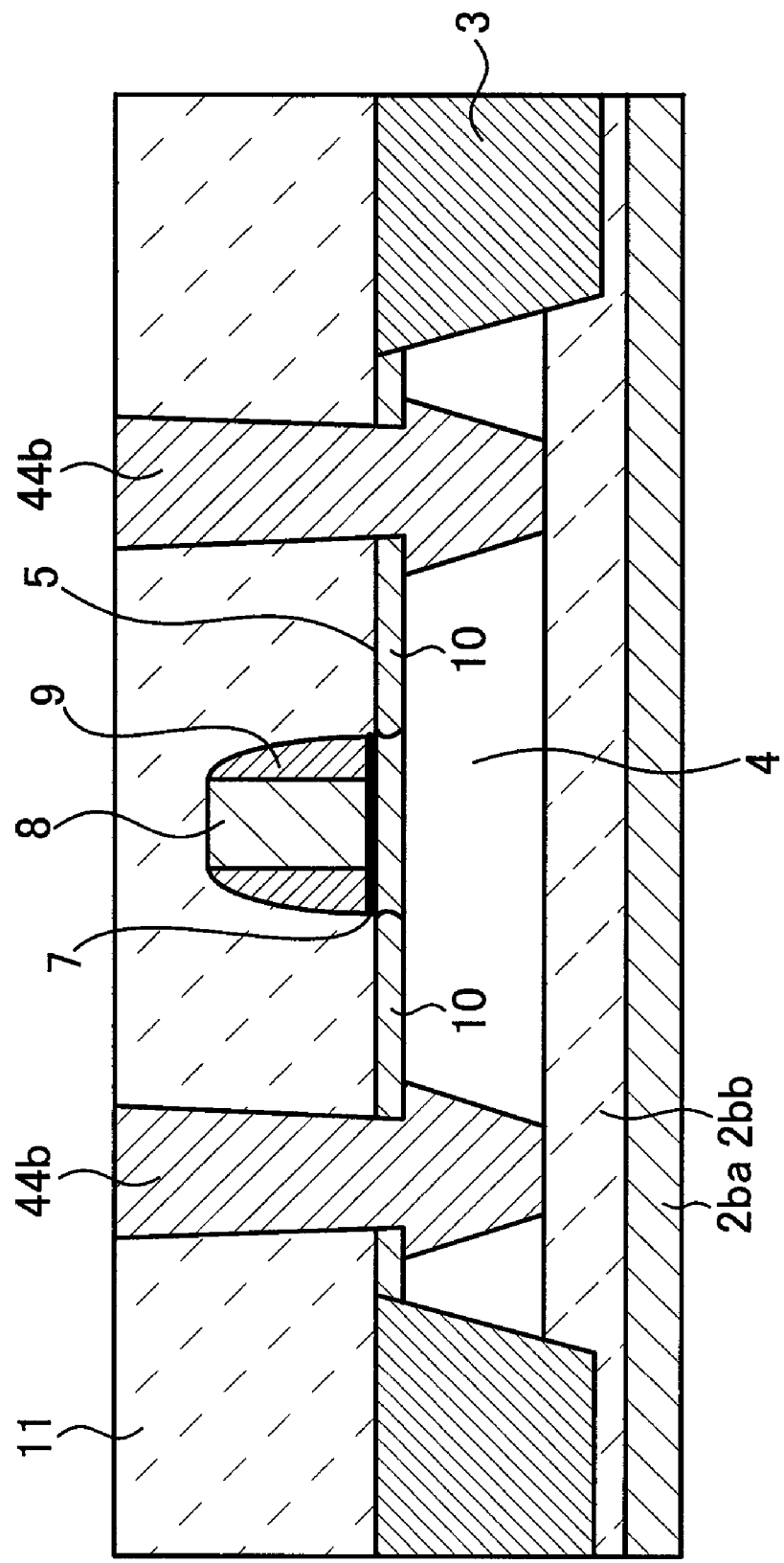
FIG. 47 is a view showing a third step of the sacrificial layer removing process according to the third example.

A sacrificial layer removing process according to a third example will be described below with reference to FIGS. 45 through 47. In FIGS. 45 through 47, those elements which are identical to those shown in FIGS. 1A through 1C are denoted by identical reference numerals.

FIG. 45 is a view showing a first step of the sacrificial layer removing process according to the third example.

In the third example, the general SOI substrate 2b which is of a laminated structure of the substrate 2ba, the BOX layer 2bb and the Si layer 2bc is employed. The SiGe layer 14 and the thin-film Si layer 5 are formed on the SOI substrate 2b. As with the first example, after the first through fourth manufacturing steps described above with respect to the first embodiment, the processing goes to the eighth and ninth manufacturing steps where the interlayer insulating film 11 is formed on the entire surface and the contact holes 42b extending to the SiGe layer 14 are formed.

FIG. 46 is a view showing a second step of the sacrificial layer removing process according to the third example.

After the contact holes 42b are formed, as with the first example, the assembly is processed by wet etching to remove the SiGe layer 14 through the contact holes 42b, forming the cavity 4 below the thin-film Si layer 5. The Si layer 2bc will be removed by wet etching before plugs 44b are formed. Since the thin-film Si layer 5 will be etched away together with the Si layer 2bc, the film thicknesses of those films are appropriately established to allow the thin-film Si layer 5 to remain unremoved after the Si layer 2bc will be removed.

FIG. 47 is a view showing a third step of the sacrificial layer removing process according to the third example.

After the removal of the Si layer 2bc, an electrically conductive film is formed in the contact holes 42b to form plugs 44b. Since the plugs 44b have lower ends connected to the BOX layer 2bb, there will be no source-drain short circuit.

By adjusting the conditions for growing the electrically conductive film to adjust the coverage, the plugs 44b may be formed with the electrically conductive film not reaching the bottoms of the contact holes. In such a modification, the Si layer 2bc shown in FIG. 46 does not need to be removed, and the impurity diffusion layer 43 shown in FIG. 40 does not need to be formed.

If the SOI substrate 2b is employed with the BOX layer 2bb thereof serving as a sacrificial layer and with the Si layer 2bc serving as source/drain and channel regions, then the impurity diffusion layer 43 shown in FIG. 39 may be formed in the substrate 2ba in the same manner as with the first example. If a substrate of SiGe-On-Insulator structure where an SiGe layer formed on a BOX layer is employed instead of the SOI substrate 2b and the SiGe layer 14 and the thin-film Si layer 5 are formed on the substrate, then the bottom of the cavity 4 becomes a BOX layer after wet etching, and the problem of a short circuit due to the formation of an electrically conductive film does not arise. If an Si layer and an SiGe layer are successively formed on the SOI substrate 2b and the Si layer as the uppermost layer on the SOI substrate and the Si layer formed thereon are removed to leave the SiGe layer, then the problem of a short circuit due to the formation of an electrically conductive film does not arise either.

As described above in the first through third examples, if the thin-film Si layer 5 is not curved, the sacrificial layer such as the SiGe layer 14 or the like can be removed through the contact holes for forming the plugs to be connected to the source/drain 10.

In the first through fourth embodiments described above, if necessary, a semiconductor layer may be formed by way of epitaxial growth on the thin-film Si layer 5, and thereafter ions may be introduced to form a stacked source/drain structure. Such a structure may be adopted to achieve a lower resistance.

A fifth embodiment of the present invention will be described below.

Figure 48A:
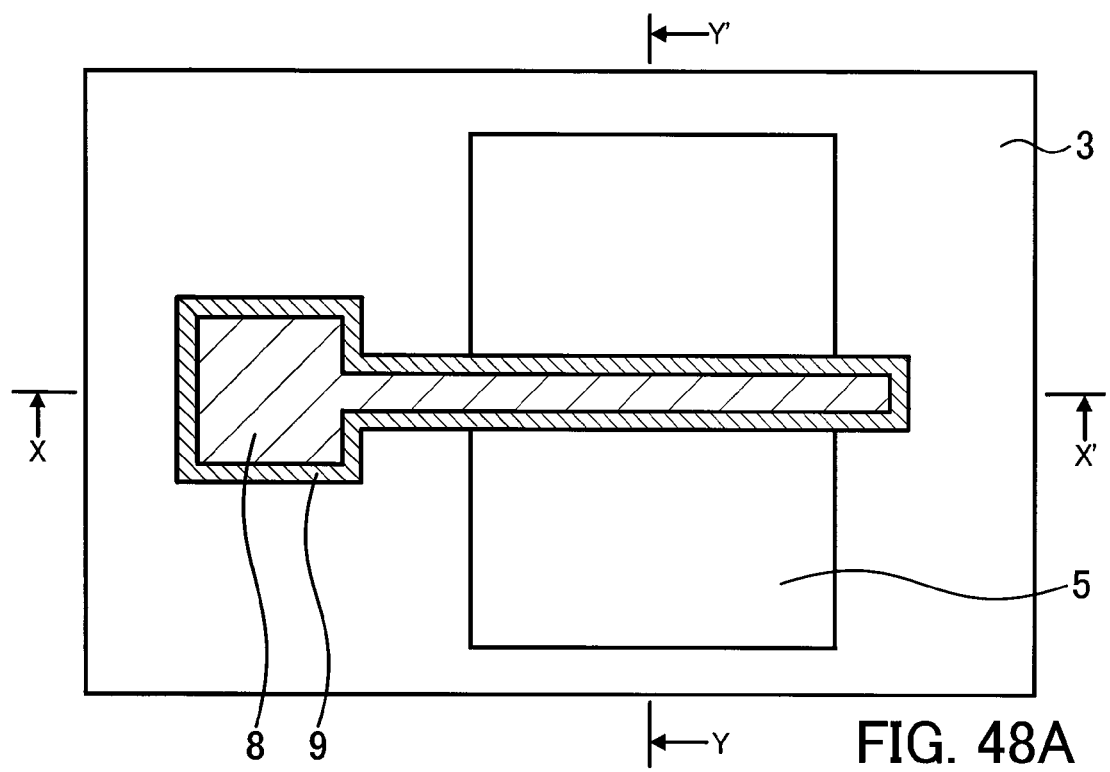
FIGS. 48A through 48C are views showing a manufacturing process (1) for manufacturing a semiconductor device according to a fifth embodiment of the present invention, FIG. 48A being a plan view, FIG. 48B a cross-sectional view taken along line X–X' of FIG. 48A, and FIG. 48C a cross-sectional view taken along line Y–Y' of FIG. 48A.
Figure 48B:
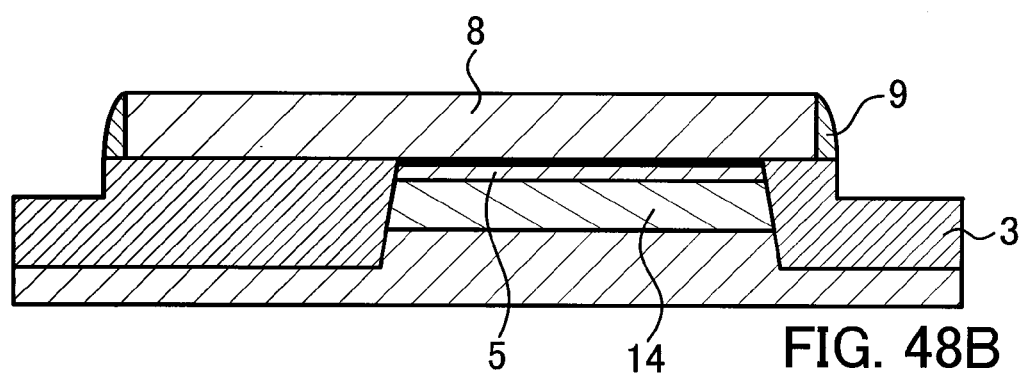
Figure 48C:
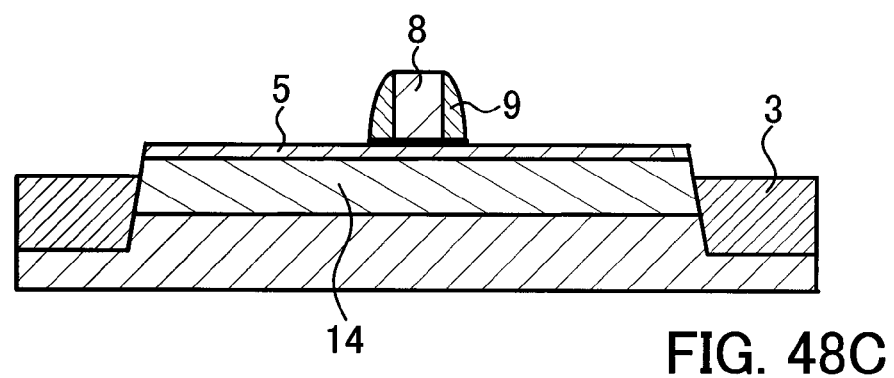
Figure 49A:
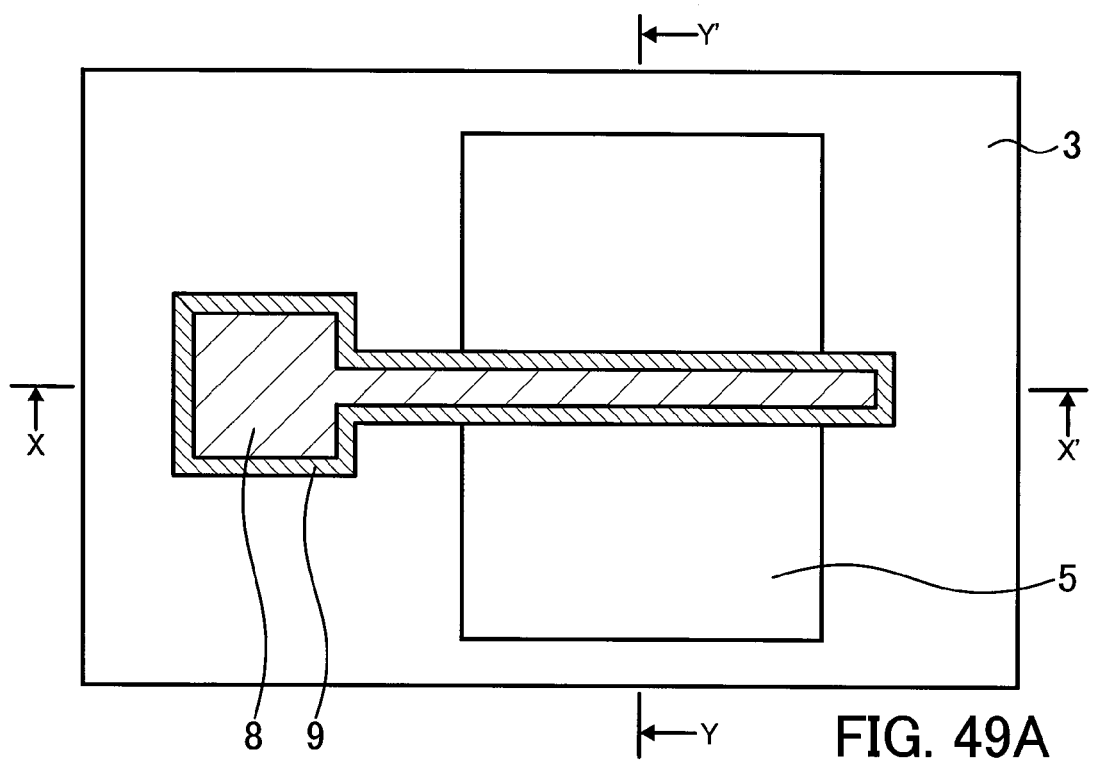
FIGS. 49A through 49C are views showing a manufacturing process (2) for manufacturing the semiconductor device according to the fifth embodiment of the present invention, FIG. 49A being a plan view, FIG. 49B a cross-sectional view taken along line X–X' of FIG. 49A, and FIG. 49C a cross-sectional view taken along line Y–Y' of FIG. 49A.
Figure 49B:
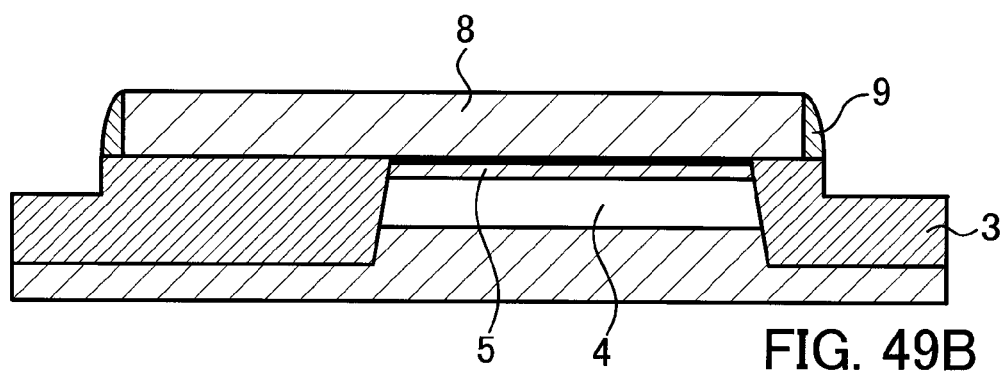
Figure 49C:
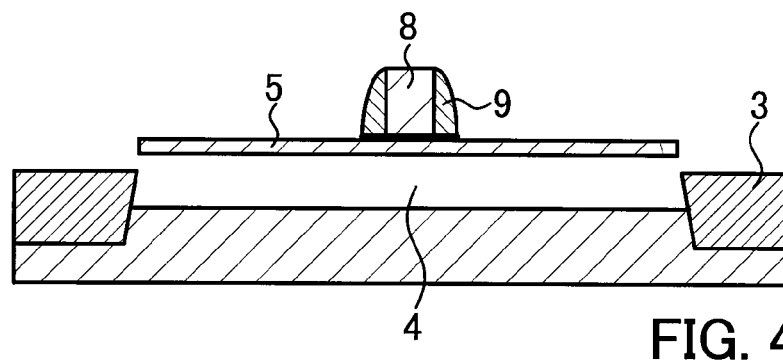

FIGS. 48A through 48C and 49A through 49C are views showing a manufacturing process for manufacturing a semiconductor device according to a fifth embodiment of the present invention, FIGS. 48A, 49A being plan views, FIGS. 48B, 49B cross-sectional views taken along line X–X' of FIGS. 48A, 48A, and FIGS. 48C, 49C cross-sectional views taken along line Y–Y' of FIGS. 48A, 49A. In FIGS. 48A through 48C and 49A through 49C, those elements which are identical to those shown in FIGS. 1A through 1C are denoted by identical reference numerals.

According to the fifth embodiment, after the gate electrode 8 and the side wall 9 have been formed in the fourth manufacturing step for manufacturing the semiconductor device 1 according to the first embodiment as shown in FIGS. 5A through 5C, the device separating region 3 is etched back as shown in FIGS. 48B, 48C, exposing the side wall of the SiGe layer 14 to form an opening. Then, as with the sixth manufacturing step for manufacturing the semiconductor device 1 according to the first embodiment as shown in FIGS. 7A through 7C, the etching liquid is introduced from the exposed portion of the SiGe layer 14 to remove the SiGe layer 14 below the thin-film Si layer 5, forming the cavity 4, as shown in FIGS. 48A, 48B, and 48C. Subsequently, the processing goes to an appropriate step depending on the form of a semiconductor device to be fabricated.

By etching the device separating region 3 to expose the SiGe layer 14, it is not necessary to form the resist patterns 16, 16b, 16b as shown in FIGS. 6A through 6C, 33, and 35, and hence the photoresist forming step may be dispensed with. The manufacturing cost can thus be lowered, and the opening can be made smaller without photolithography which will easily be closed by the interlayer insulating film 11 at a later time. In this embodiment, a substrate structure comprising the SiGe layer 14 and the thin-film Si layer 5 which are formed on the Si substrate 2 is employed. The principles of the present embodiment are also applicable to a substrate of SOI structure where the BOX layer and the thin-film Si layer 5 are formed on the Si substrate 2, a substrate where the SiGe layer 14 and the thin-film Si layer 5 are formed on the SOI substrate, or a substrate of SiGe-On-Insulator structure.

In the above first through fifth embodiments, for forming the device separating region 3, the SiGe layer 14 and the thin-film Si layer 5 are formed on the Si substrate 2 or the SOI substrate 2b, after which a trench is formed. The trench may be formed before the SiGe layer 14 and the thin-film Si layer 5 are formed. Another process for forming the device separating region 3 will be described below.

Figure 50A:
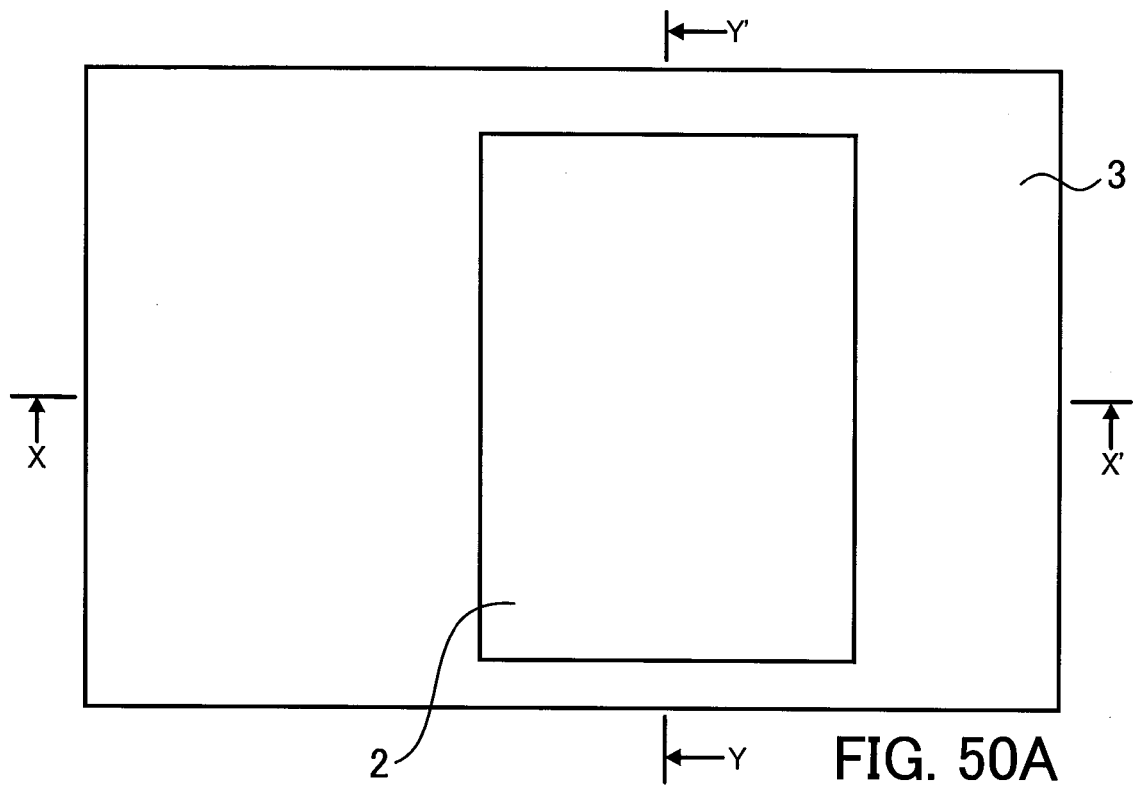
FIGS. 50A through 50C are views (1) illustrative of a process for forming a device separating region, FIG. 50A being a plan view, FIG. 50B a cross-sectional view taken along line X–X' of FIG. 50A, and FIG. 50C a cross-sectional view taken along line Y–Y' of FIG. 50A.
Figure 50B:
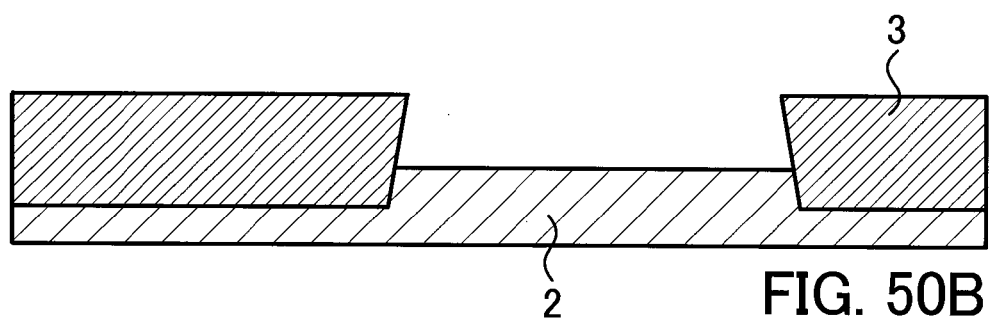
Figure 50C:
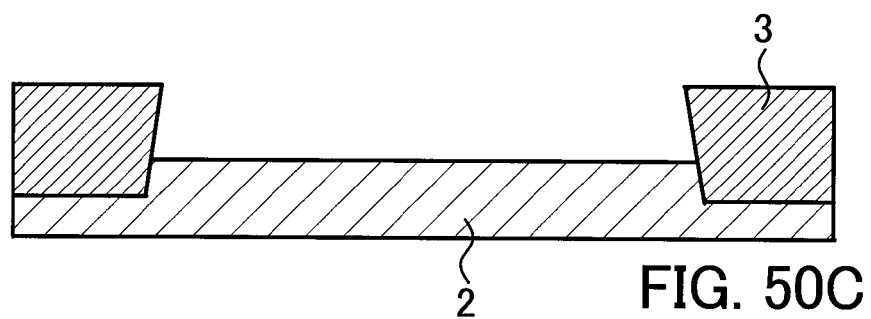
Figure 51A:
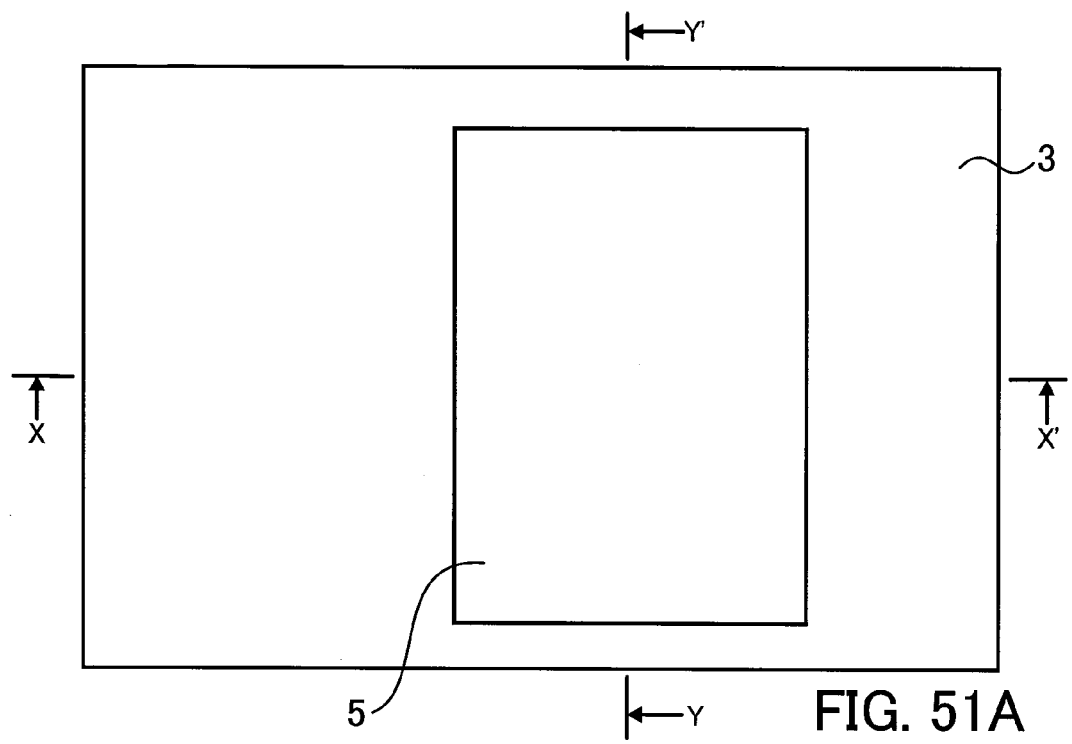
FIGS. 51A through 51C are views (2) illustrative of the process for forming the device separating region, FIG. 51A being a plan view, FIG. 51B a cross-sectional view taken along line X–X' of FIG. 51A, and FIG. 51C a cross-sectional view taken along line Y–Y' of FIG. 51A.
Figure 51B:
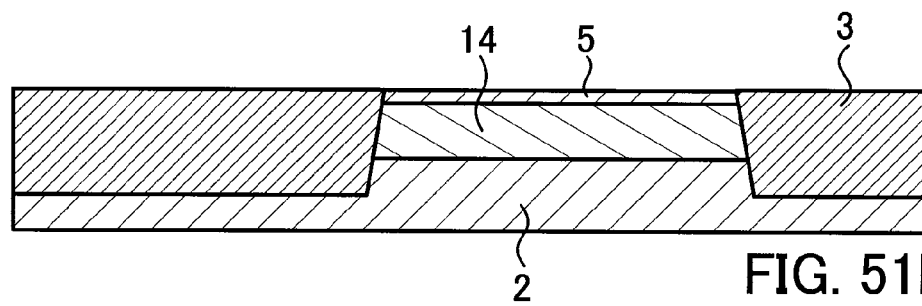

FIGS. 50A through 50C and 51A through 51C are views illustrative of a process for forming a device separating region, FIGS. 50A, 51A being plan views, FIGS. 50B, 51B cross-sectional views taken along line X–X' of FIGS. 50A, 51A, and FIGS. 50C, 51C cross-sectional views taken along line Y–Y' of FIGS. 50A, 51A. In FIGS. 50A through 50C and 51A through 51C, those elements which are identical to those shown in FIGS. 3A through 3C are denoted by identical reference numerals.

Figure 51C:
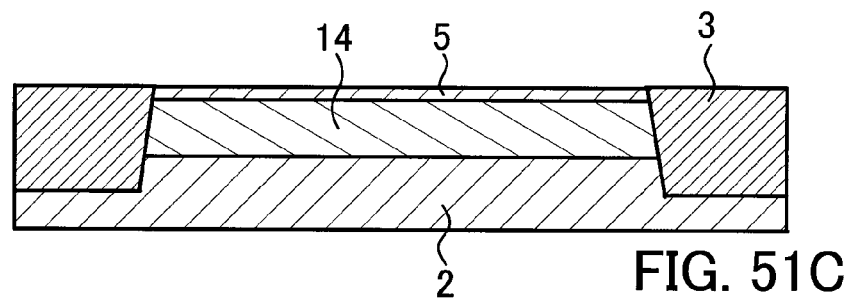

As shown in FIGS. 50A through 50C, for forming the device separating region 3 on the Si substrate 2, a trench is formed in the Si substrate 2, an insulating film such as of SiN, $SiO_2$, or the like is deposited in the trench and planarized, and thereafter the insulating film which has protected the transistor forming region is selectively removed. In this manner, as shown in FIGS. 50B and 50C, the device separating region 3 projecting from the Si substrate 2 is formed. Then, as shown in FIGS. 51A, 51B, and 51C, the SiGe layer 14 and the thin-film Si layer 5, for example, are successively epitaxially grown in the transistor forming region that is surrounded by the device separating region 3, thus producing a structure which is the same as the structure shown in FIGS. 3A, 3B, and 3C. The same sequence of manufacturing steps may be followed if the SOI substrate 2b is employed instead of the Si substrate 2.

As described above, the semiconductor devices 1, 1a, 1b, 1c, 20, 20a, 20b, 30, 30a, 30b, 30c, 40, 40a, 40b according to the first through fourth embodiments are of such a structure that the cavity 4 is disposed below the channel region and the source/drain 10 of the thin-film Si layer 5, or the cavity 4 is filled with the interlayer insulating film 11. With this structure, there can be realized a high-speed, high-functionality, low-power-consumption semiconductor device whose parasitic capacitance due to a pn junction is greatly reduced and whose carrier mobility is large. Particularly, the semiconductor devices 1, 1a, 1b, 1c, 20, 20a, 20b, 30, 30a, 30b, 30c according to the first through third embodiments has their high-speed performance greatly improved by curving the thin-film Si layer 5 to develop large strains in the thin-film Si layer 5 directly below the gate electrode 8. With the semiconductor devices 40, 40a, 40b according to the fourth embodiment, the opening used to form the cavity 4 below the thin-film Si layer 5 may be formed at a position spaced from the gate electrode 8. Therefore, when the cavity 4 is formed below the thin-film Si layer 5, the interlayer insulating film 11 is not introduced deeply into the cavity 4 even if the cavity 4 is thick, and hence the parasitic capacitance can be reduced by increasing the thickness of the cavity 4. Furthermore, the manufacturing process can be simplified as the cavity can be formed utilizing the contact holes without photolithography.

Inasmuch as the thin-film Si layer 5 where the channel is formed can be formed as a highly thin film by epitaxial growth, it is possible to suppress a transistor short-circuit channel effect, increase an S value, and reduce a leakage by suppressing a sub-threshold current. By thus forming the thin-film Si layer 5 by way of epitaxial growth, a device of SOI structure can be fabricated without using an SOI substrate.

The above embodiments are applicable to either one of PMOS and NMOS structures for better performance thereof. For example, though the strained-SiGe structure is effective only with the PMOS structure, the mobility can be increased for the NMOS structure by removing the SiGe layer from the NMOS structure to form a cavity to provide an SOI structure, or curving the layer to mechanically strain the same. Though the strained-Si structure is effective with the NMOS structure, but not significantly effective with the PMOS structure, it may become highly effective with the PMOS structure by forming the cavity in the PMOS structure to provide an SOI structure or mechanically curving the layer.

The film thicknesses of the SiGe layer 14, the thin-film Si layer 5, the gate insulating film 7, and the interlayer insulating film 11, and the gate length of the gate electrode 8 as described above may appropriately be established depending on the desired characteristics of a semiconductor device to be fabricated. Regardless of whether the thin-film Si layer 5 is curved or not, Si may be epitaxially grown in a region where the source/drain 10 is to be formed before the source/drain 10 is formed, and thereafter ions may be introduced and the assembly may be heated to form a stacked source/drain.

In the above description, the thin-film Si layer 5 is grown on the SiGe layer 14 which has been epitaxially grown on the Si substrate 2, and is used as a channel. The cavity 4 is formed below the thin-film Si layer 5 or the thin-film Si layer 5 is curved and strained for making transistors higher in speed. For the purpose of making transistors higher in speed, SiGe or Ge which is a material different from the substrate is epitaxially grown on the Si substrate that has heretofore been employed, and is used as a channel (see Japanese Unexamined Patent Publication No. 5-121450 and Japanese Unexamined Patent Publication No. 8-186249).

The above approach is based on the phenomenon that when a crystal having a lattice constant different from a substrate is grown to achieve a lattice match with the substrate, the crystal is strained, changing the band structure for an increased carrier mobility. According to heteroepitaxial growth for stacking different materials, however, the crystal surface morphology is generally degraded as the film thickness increases. Because the degraded crystal surface morphology is responsible for a reduction in the carrier mobility for those transistors which have a film surface serving as a channel, it is very important to make high-quality crystal growth. For epitaxial growth of semiconductor layers having different lattice constants, there may be employed a process of providing a graded layer whose the Ge ratio is gradually changed between layers to prevent dislocations from occurring. According to such a process, a plurality of epitaxial growth cycles need to be carried out, resulting in a complex process. Furthermore, since the gate is oxidized after a semiconductor layer having a high Ge concentration is formed, the problem of dislocations still remains unsolved. For epitaxial growth of semiconductor layers having widely different lattice constants, as the thickness of the film being grown increases, the crystal surface morphology is degraded, resulting in crystal defects such as dislocations. If crystal defects are present in the channel region, they impair high-speed movement of electrons or holes, presenting an obstacle to higher-speed operation of transistors.

A transistor structure in which an initial growth surface with good crystal surface morphology is used as a channel to reduce the effect that crystal defects have on the carrier mobility according to a sixth embodiment of the present invention, and a process of manufacturing such a transistor structure will be described below.

Figure 52:
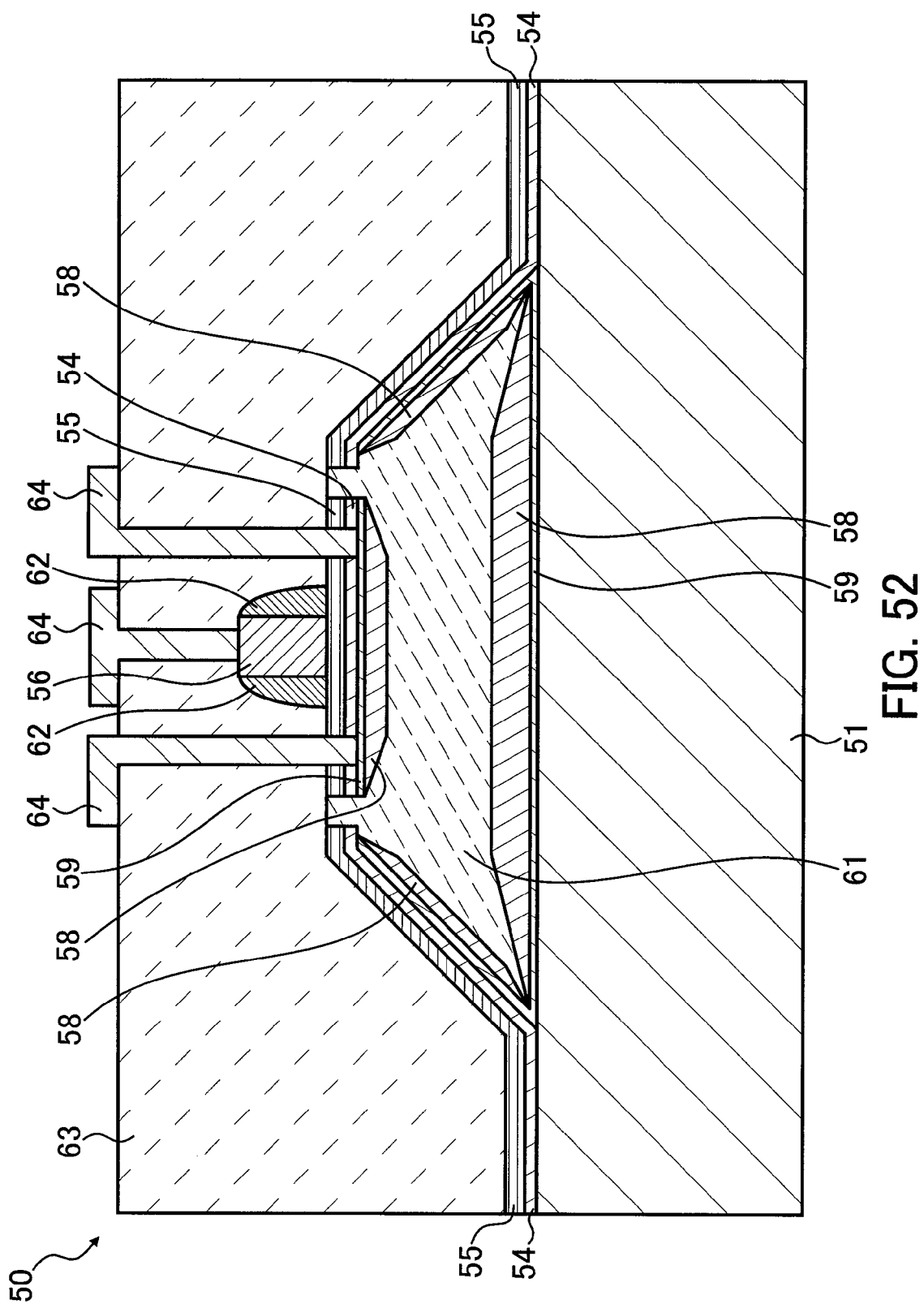
FIG. 52 is a cross-sectional view of a semiconductor device according to a sixth embodiment of the present invention.

FIG. 52 is a cross-sectional view of a semiconductor device according to a sixth embodiment of the present invention.

A semiconductor device 50 according to the sixth embodiment shown in FIG. 52 comprises a dome-shaped semiconductor having a second semiconductor layer 54 which has been formed as a dome-shaped structure on a substrate 51, using a first semiconductor layer 53. A gate electrode 56 is formed on an outer wall surface of the dome-shaped semiconductor with a dome-shaped gate insulating film 55 interposed therebetween. Third and fourth semiconductor layers 58, 59 are disposed on an inner wall surface of the dome-shaped semiconductor such that the fourth semiconductor layer 59 and the third semiconductor layer 58 are positioned successively from the second semiconductor layer 54. The fourth semiconductor layer 59 serves as a cap layer, and a source/drain is formed in the third semiconductor layer 58 on the fourth semiconductor layer 59, thus forming a channel. The interior space of the dome-shaped semiconductor is filled with a BOX layer 61. A side wall 62 is formed on side edges of the gate electrode 56, and interconnections 64 that extend through an interlayer insulating film 63 are connected to the gate electrode 56 and a source/drain in the fourth semiconductor layer 59.

The substrate 51 of the semiconductor device 50 may be made of Si, SiGe, SiGeC, Ge, or the like. The second and fourth semiconductor layers 54, 59 are of the same material as the substrate 51. The third semiconductor layer 58 may be made of Si, SiGe, SiGeC, Ge, or the like. The gate insulating film 55 may be made of $SiO_2$, silicon oxide nitride (SiON), or an insulating material such as $HfO_2$ having a dielectric constant higher than $SiO_2$.

A process of manufacturing the semiconductor device 50 thus constructed will be described below with reference to FIGS. 53 through 63. In FIGS. 53 through 63, those elements which are identical to those shown in FIG. 52 are denoted by identical reference numerals.

Figure 53:
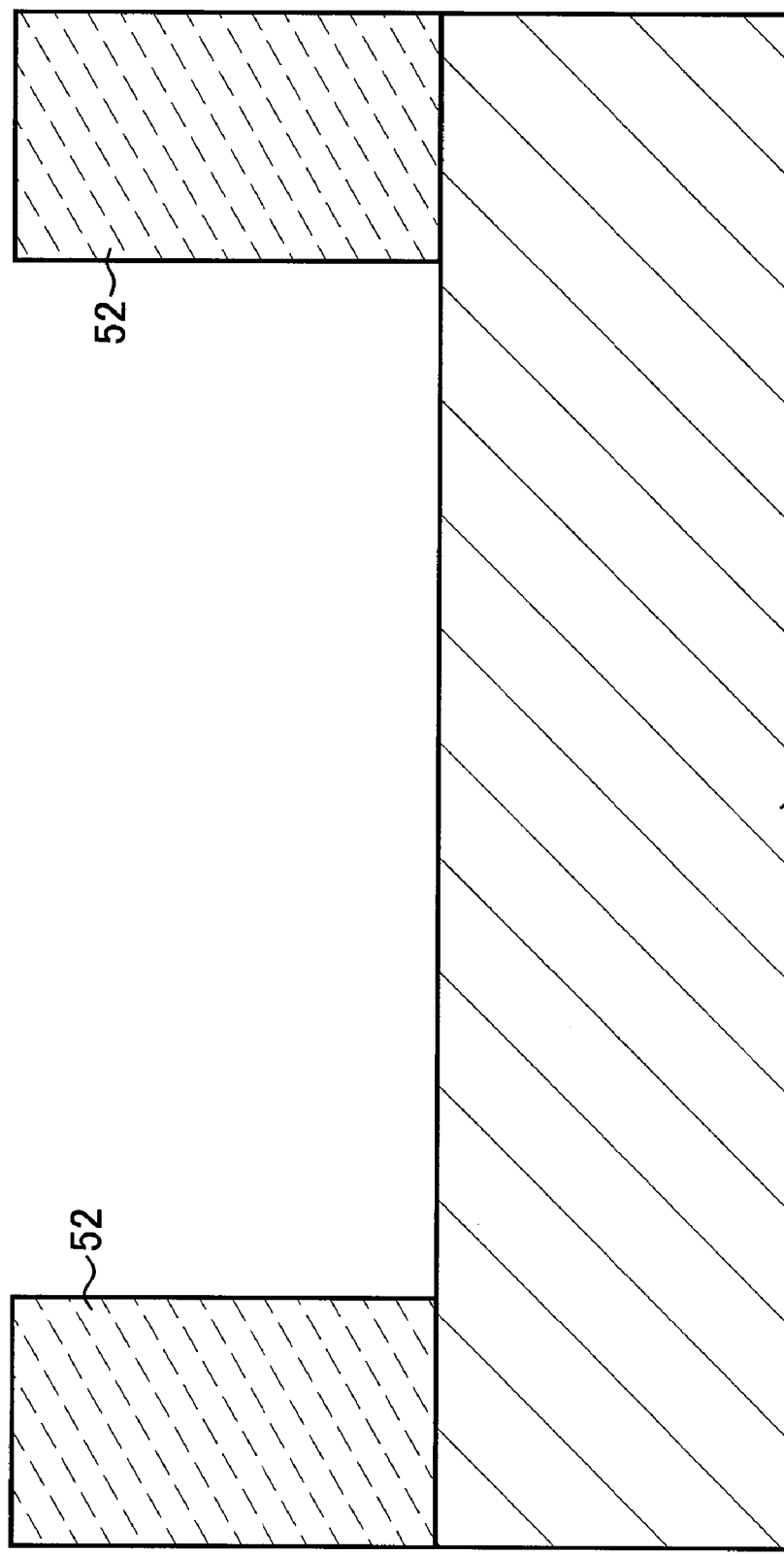
FIG. 53 is a cross-sectional view showing a first manufacturing step of manufacturing the semiconductor device according to the sixth embodiment of the present invention.

FIG. 53 is a cross-sectional view showing a first manufacturing step of manufacturing the semiconductor device according to the sixth embodiment of the present invention.

In the first manufacturing step, a mask 52 is formed of $SiO_2$ or the like on the substrate 51 by photolithography, exposing a portion of the substrate 51. The substrate 51 is made of Si(001), for example, and the mask 52 is deposited of $SiO_2$, $Si_3N_4$, or the like by CVD.

Figure 54:
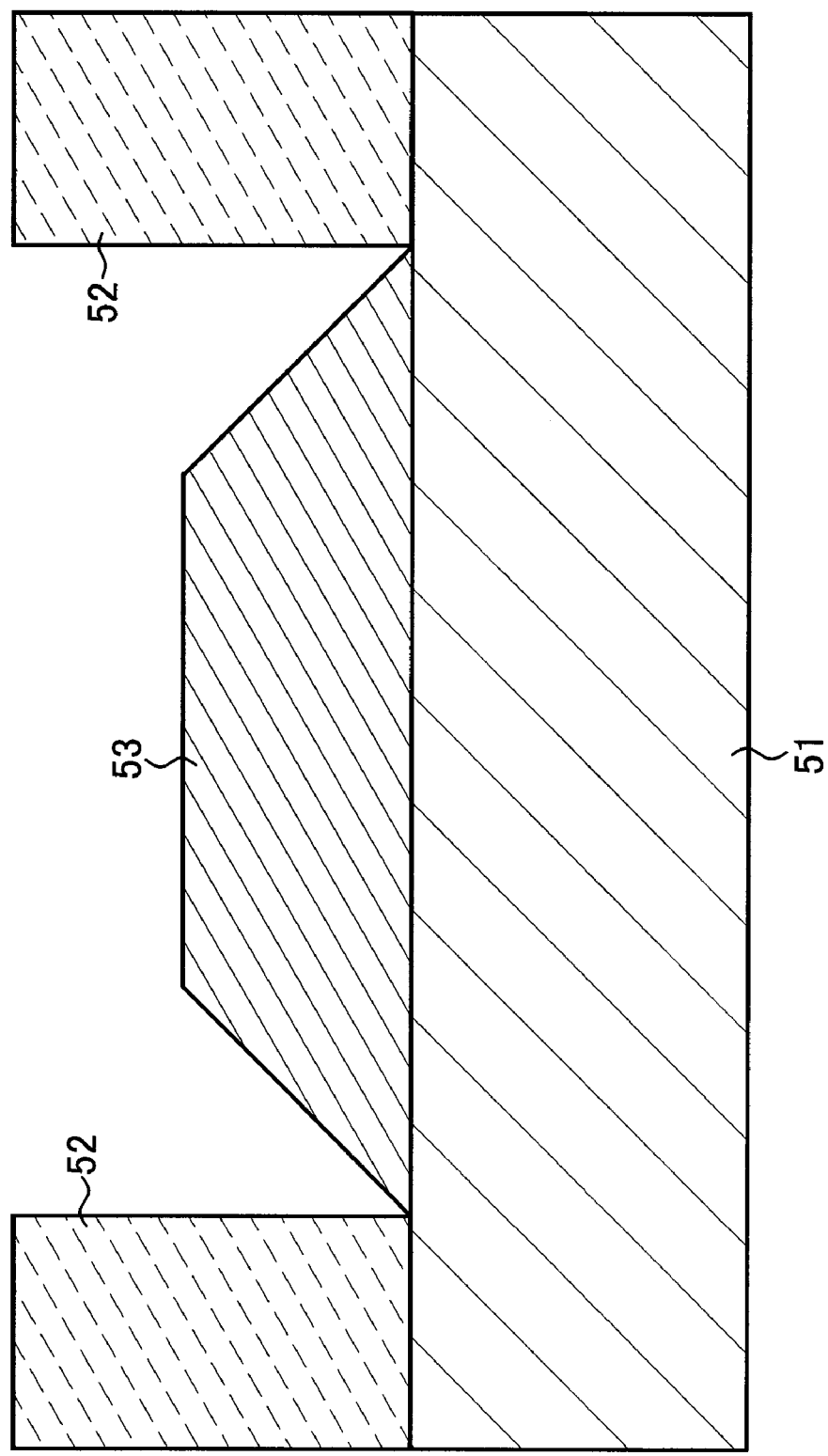
FIG. 54 is a cross-sectional view showing a second manufacturing step of manufacturing the semiconductor device according to the sixth embodiment of the present invention.

FIG. 54 is a cross-sectional view showing a second manufacturing step of manufacturing the semiconductor device according to the sixth embodiment of the present invention.

In the second manufacturing step, the first semiconductor layer 53 of a material different from the substrate 51 is selectively formed on the exposed portion of the substrate 51. The first semiconductor layer 53 is made of $Si_{0.8}G_{0.2}$, for example. The first semiconductor layer 53 is selectively formed by CVD such that its film thickness is equal to or smaller than a critical film thickness of 10 nm. Alternatively, the first semiconductor layer 53 may be made of SiGe, SiGeC, Ge, or the like which contains Ge at a concentration higher than the substrate 51.

Figure 55:
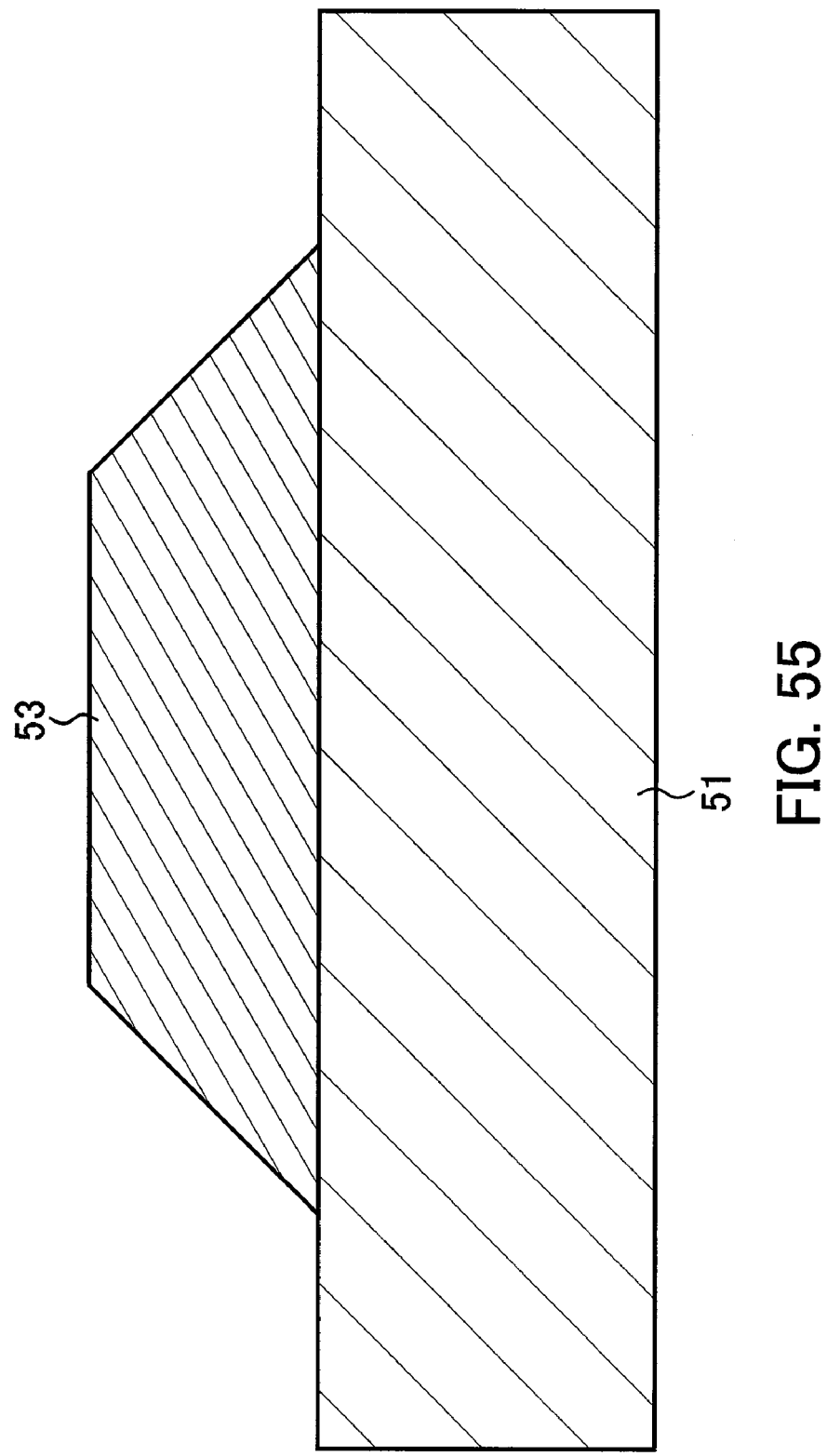
FIG. 55 is a cross-sectional view showing a third manufacturing step of manufacturing the semiconductor device according to the sixth embodiment of the present invention.

FIG. 55 is a cross-sectional view showing a third manufacturing step of manufacturing the semiconductor device according to the sixth embodiment of the present invention.

In the third manufacturing step, the mask 52 is selectively removed. For example, if the mask 52 is made of $SiO_2$, then the assembly is immersed in a dilute HF solution to selectively etch only $SiO_2$ away.

Figure 56:
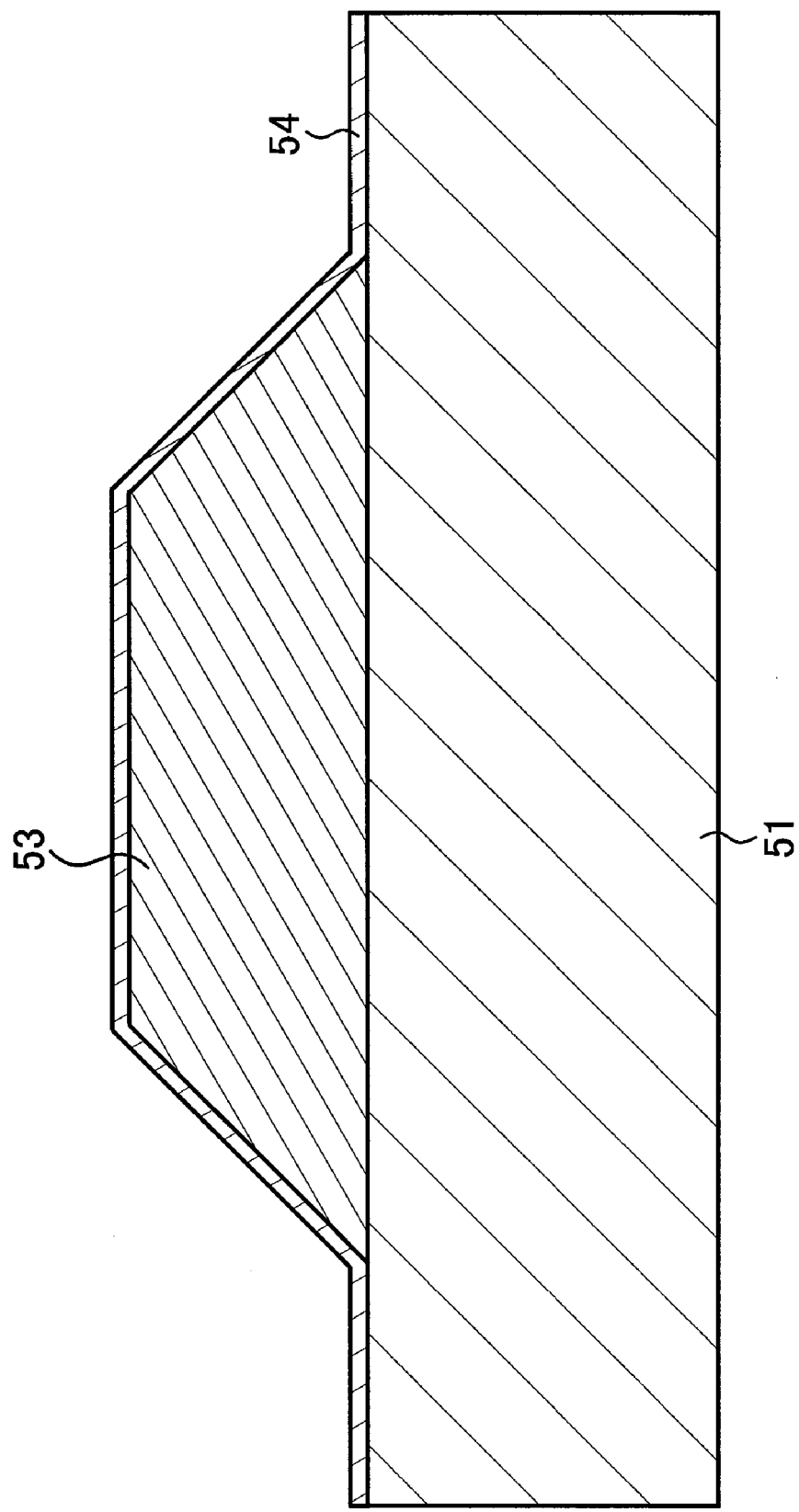
FIG. 56 is a cross-sectional view showing a fourth manufacturing step of manufacturing the semiconductor device according to the sixth embodiment of the present invention.

FIG. 56 is a cross-sectional view showing a fourth manufacturing step of manufacturing the semiconductor device according to the sixth embodiment of the present invention.

In the fourth manufacturing step, the second semiconductor layer 54 is deposited. If the substrate 51 is made of Si, for example, the second semiconductor layer 54 is also made of Si. In that case, the second semiconductor layer 54 is formed such that the thickness of the Si film which will be left after the gate insulating film 55 is formed in a fifth manufacturing step to be described below will be in the range from 1 nm to 3 nm.

Figure 57:
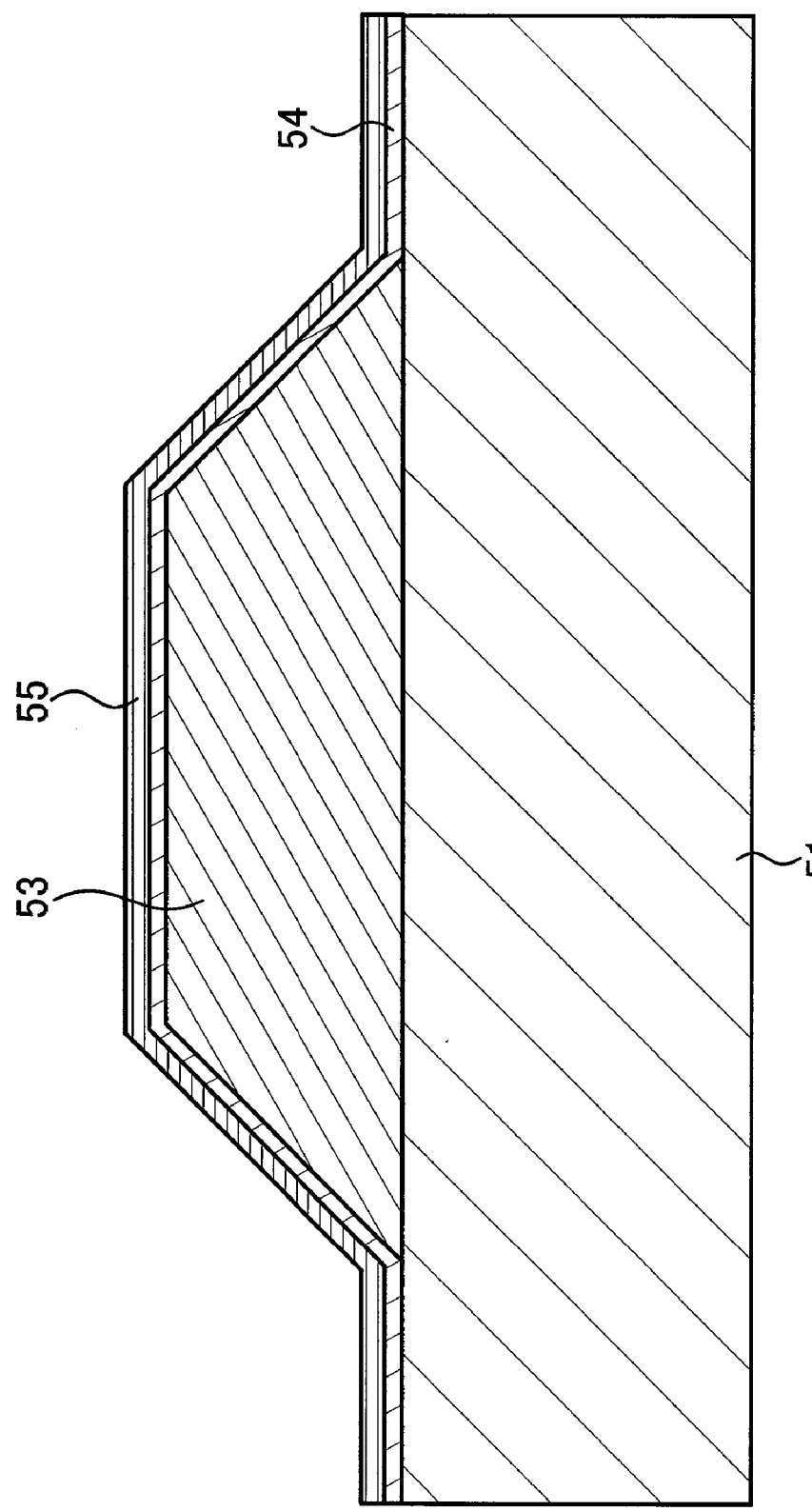
FIG. 57 is a cross-sectional view showing a fifth manufacturing step of manufacturing the semiconductor device according to the sixth embodiment of the present invention.

FIG. 57 is a cross-sectional view showing a fifth manufacturing step of manufacturing the semiconductor device according to the sixth embodiment of the present invention.

In the fifth manufacturing step, the gate insulating film 55 is formed on the surface of the second semiconductor layer 54. For example, if the second semiconductor layer 54 is made of Si, then the surface thereof is thermally oxidized to form the gate insulating film 55. As described above, the thickness of the second semiconductor layer 54 which is left after the gate insulating film 55 is formed is in the range from 1 nm to 3 nm.

Figure 58:
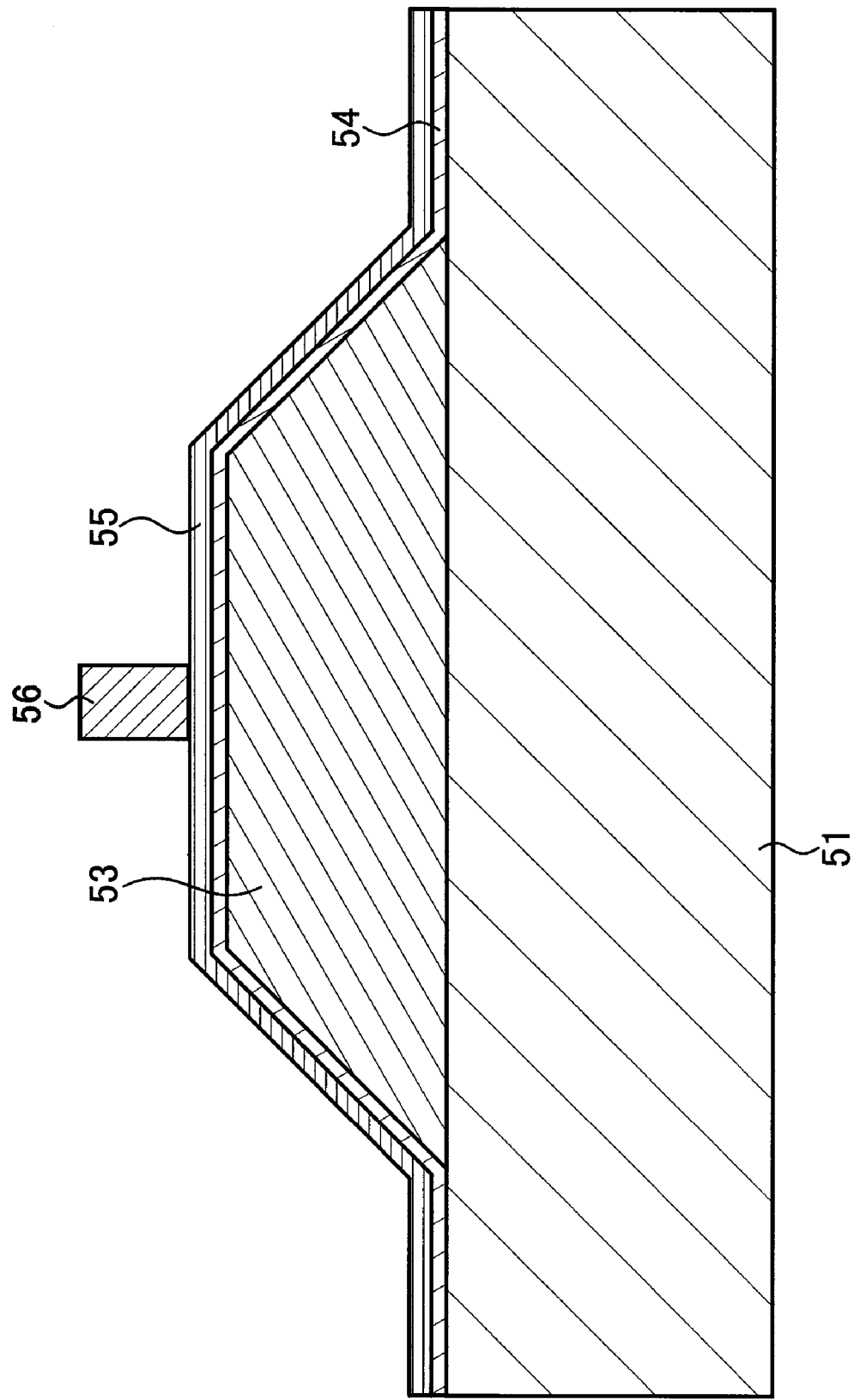
FIG. 58 is a cross-sectional view showing a sixth manufacturing step of manufacturing the semiconductor device according to the sixth embodiment of the present invention.

FIG. 58 is a cross-sectional view showing a sixth manufacturing step of manufacturing the semiconductor device according to the sixth embodiment of the present invention.

In the sixth manufacturing step, the gate electrode 56 is formed on the gate insulating film 55. The gate electrode 56 is formed by depositing poly-Si or poly-SiGe and thereafter processing the deposited layer according to photolithography and etching.

Figure 59:
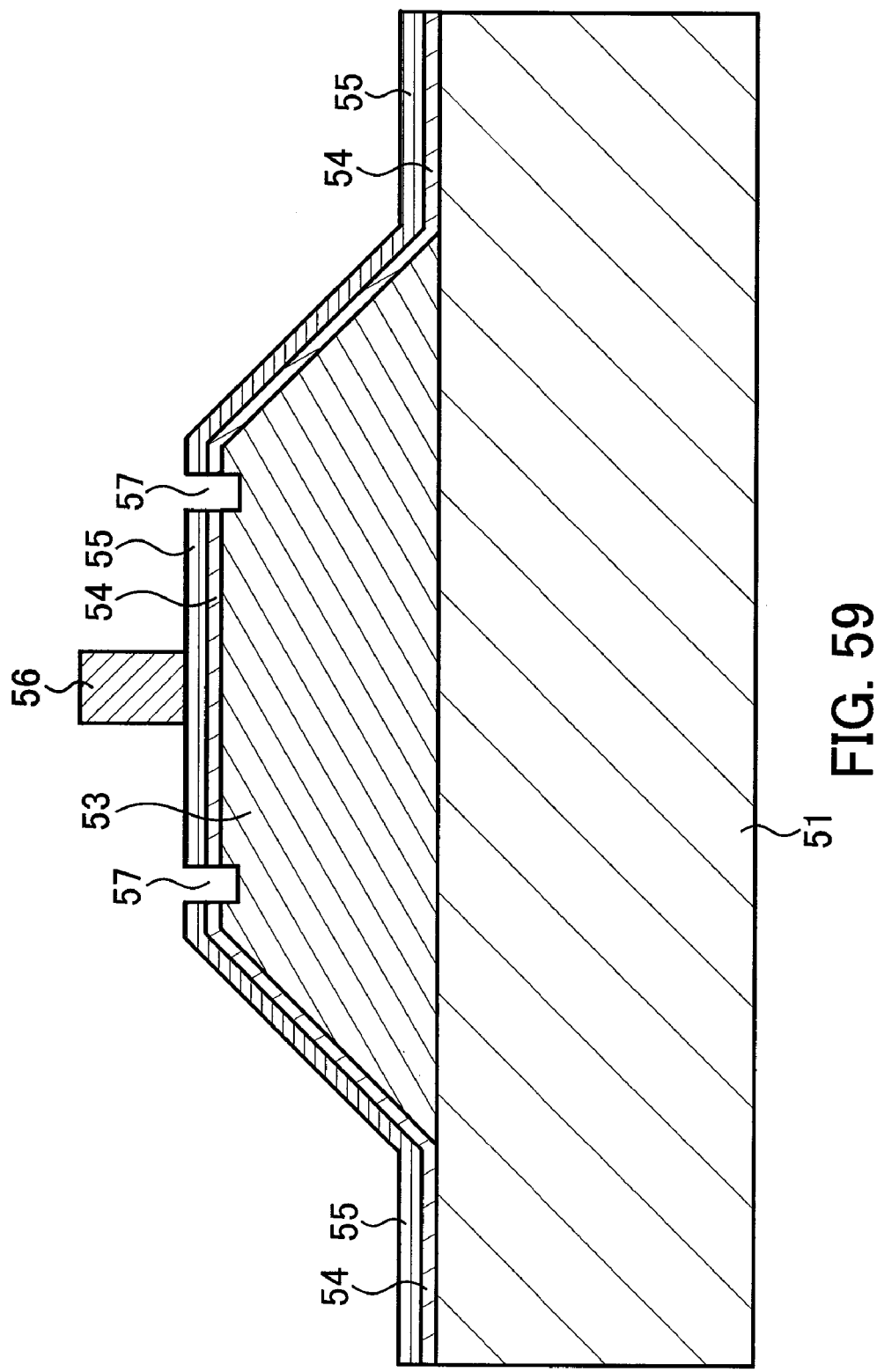
FIG. 59 is a cross-sectional view showing a seventh manufacturing step of manufacturing the semiconductor device according to the sixth embodiment of the present invention.

FIG. 59 is a cross-sectional view showing a seventh manufacturing step of manufacturing the semiconductor device according to the sixth embodiment of the present invention.

In the seventh manufacturing step, holes 57 extending through the gate insulating film 55 and the second semiconductor layer 54 to the first semiconductor layer 53 are formed by photolithography and etching.

Figure 60:
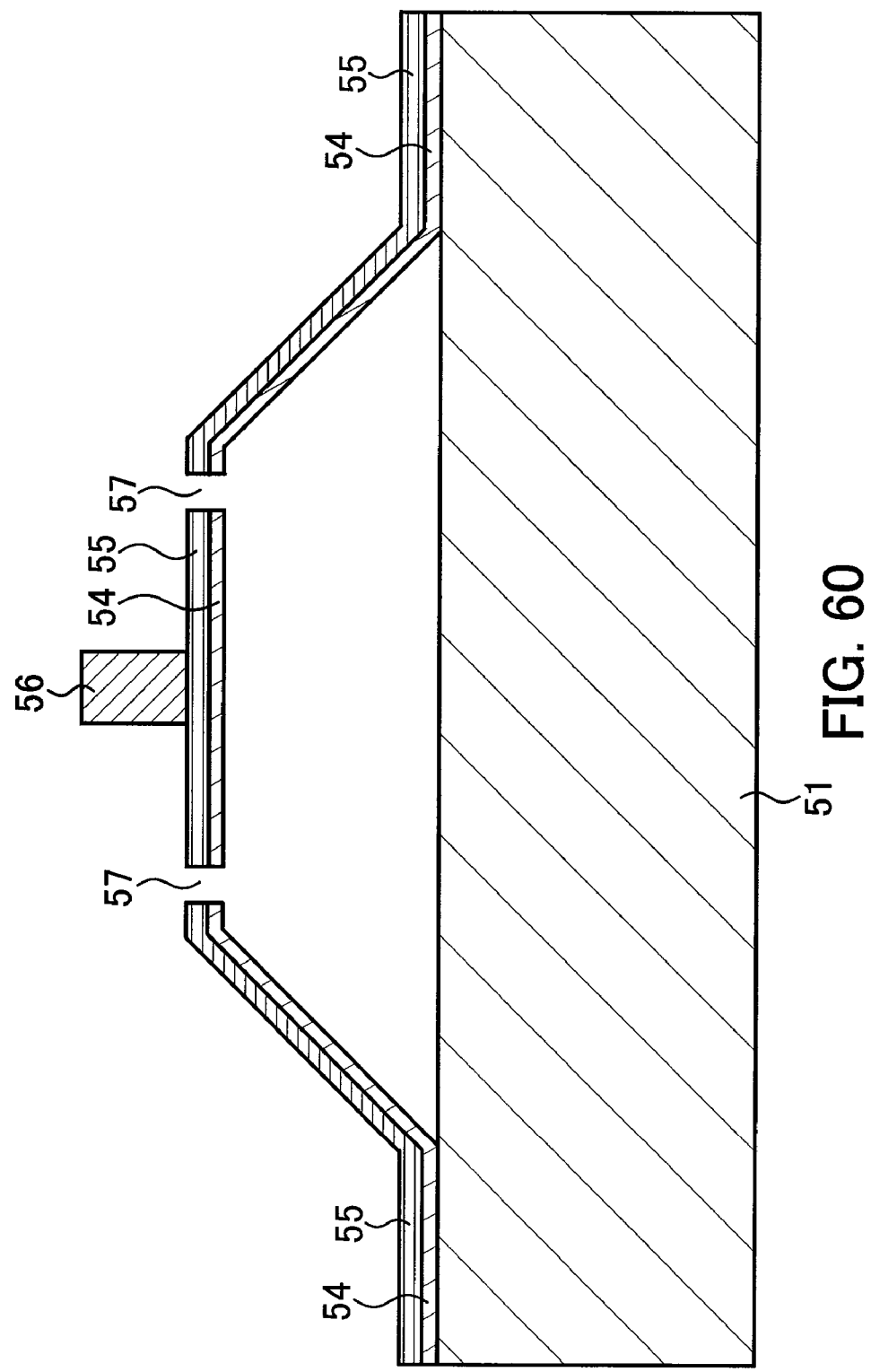
FIG. 60 is a cross-sectional view showing an eighth manufacturing step of manufacturing the semiconductor device according to the sixth embodiment of the present invention.

FIG. 60 is a cross-sectional view showing an eighth manufacturing step of manufacturing the semiconductor device according to the sixth embodiment of the present invention.

In the eighth manufacturing step, the first semiconductor layer 53 is selectively etched through the holes 57. For example, if the first semiconductor layer 53 is made of SiGe, then only SiGe is selectively etched away by $H_2O_2$, a mixed solution of $H_2O_2$ and sulfuric acid ($H_2SO_4$), or a mixed solution of HF and $H_2O_2$. In this manner, the dome-shaped semiconductor comprising the second semiconductor layer 54 is formed on the substrate 51.

Figure 61:
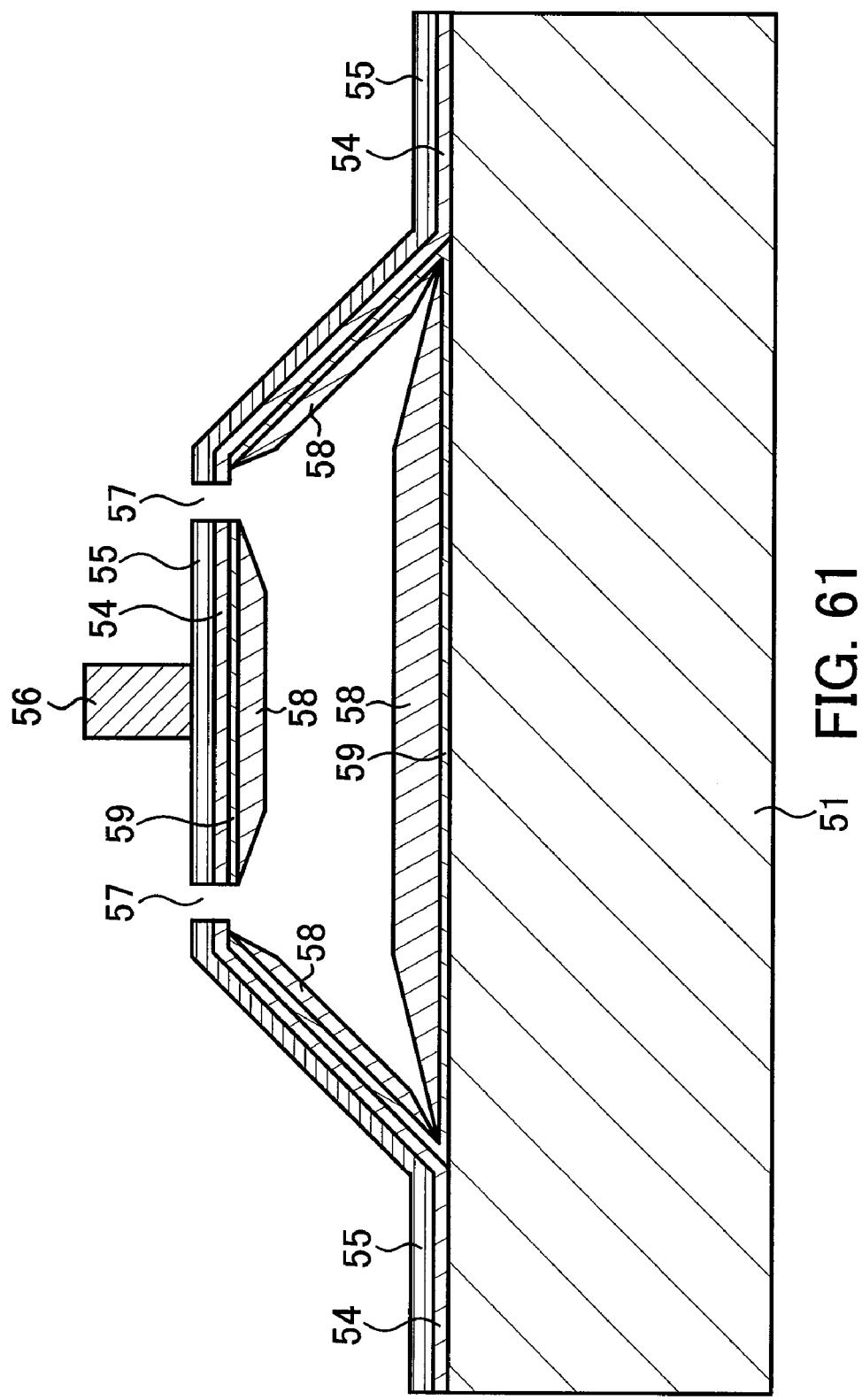
FIG. 61 is a cross-sectional view showing a ninth manufacturing step of manufacturing the semiconductor device according to the sixth embodiment of the present invention.

FIG. 61 is a cross-sectional view showing a ninth manufacturing step of manufacturing the semiconductor device according to the sixth embodiment of the present invention.

In the ninth manufacturing step, the fourth semiconductor layer 59 serving as a cap layer and the third semiconductor layer 58 where a source/drain is to be formed are selectively formed on the inner wall surface of the dome-shaped semiconductor, successively from the second semiconductor layer 54. The fourth semiconductor layer 59 reduces contaminations on the third semiconductor layer 58, such as carbon remaining on the surface of the second semiconductor layer 54, and has a film thickness of 1 nm or less. The fourth semiconductor layer 59 is made of Si if the substrate 51 is made of Si. The third semiconductor layer 58 is made of either one of Si, SiGe, SiGeC, and Ge, and may be of the n-type or the p-type with an impurity mixed.

After the third and fourth semiconductor layers 58, 59 are formed, ions are introduced into the second, third, and fourth semiconductor layers 54, 58, 59 in regions directly below both sides of the gate electrode 56, forming a source/drain. The third semiconductor layer 58 has an initial growth surface with good crystal surface morphology close to the gate electrode 56, the initial growth surface functioning as a channel.

Figure 62:
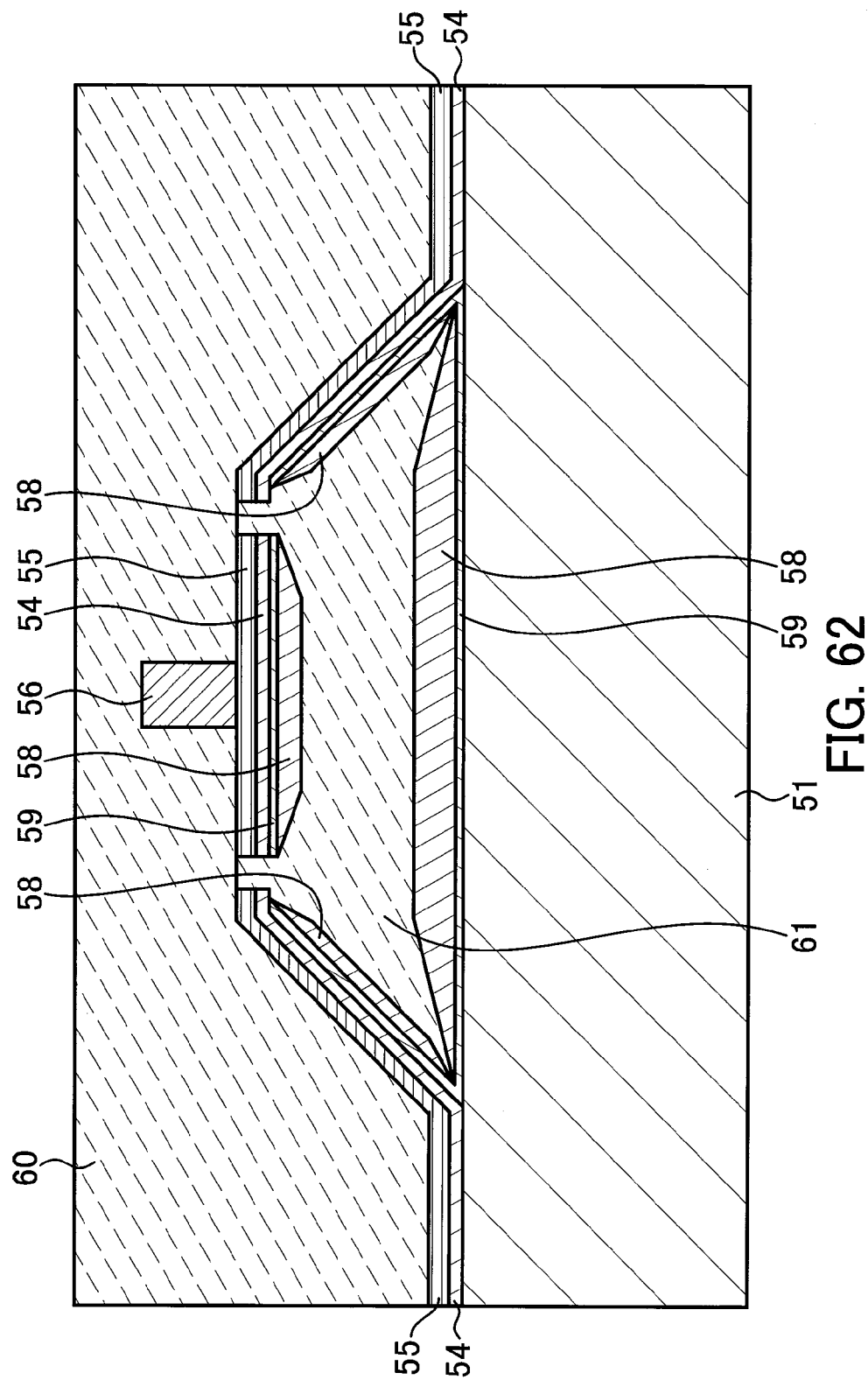
FIG. 62 is a cross-sectional view showing a tenth manufacturing step of manufacturing the semiconductor device according to the sixth embodiment of the present invention.

FIG. 62 is a cross-sectional view showing a tenth manufacturing step of manufacturing the semiconductor device according to the sixth embodiment of the present invention.

In the tenth manufacturing step, the insulating film 60 is formed by CVD to fill the interior space of the dome-shaped semiconductor with the BOX layer 61, and also to cover the entire surface of the assembly. The insulating film 60 and the BOX layer 61 may be made of $SiO_2$ or an insulating material having a dielectric constant lower than $SiO_2$, for example.

Figure 63:
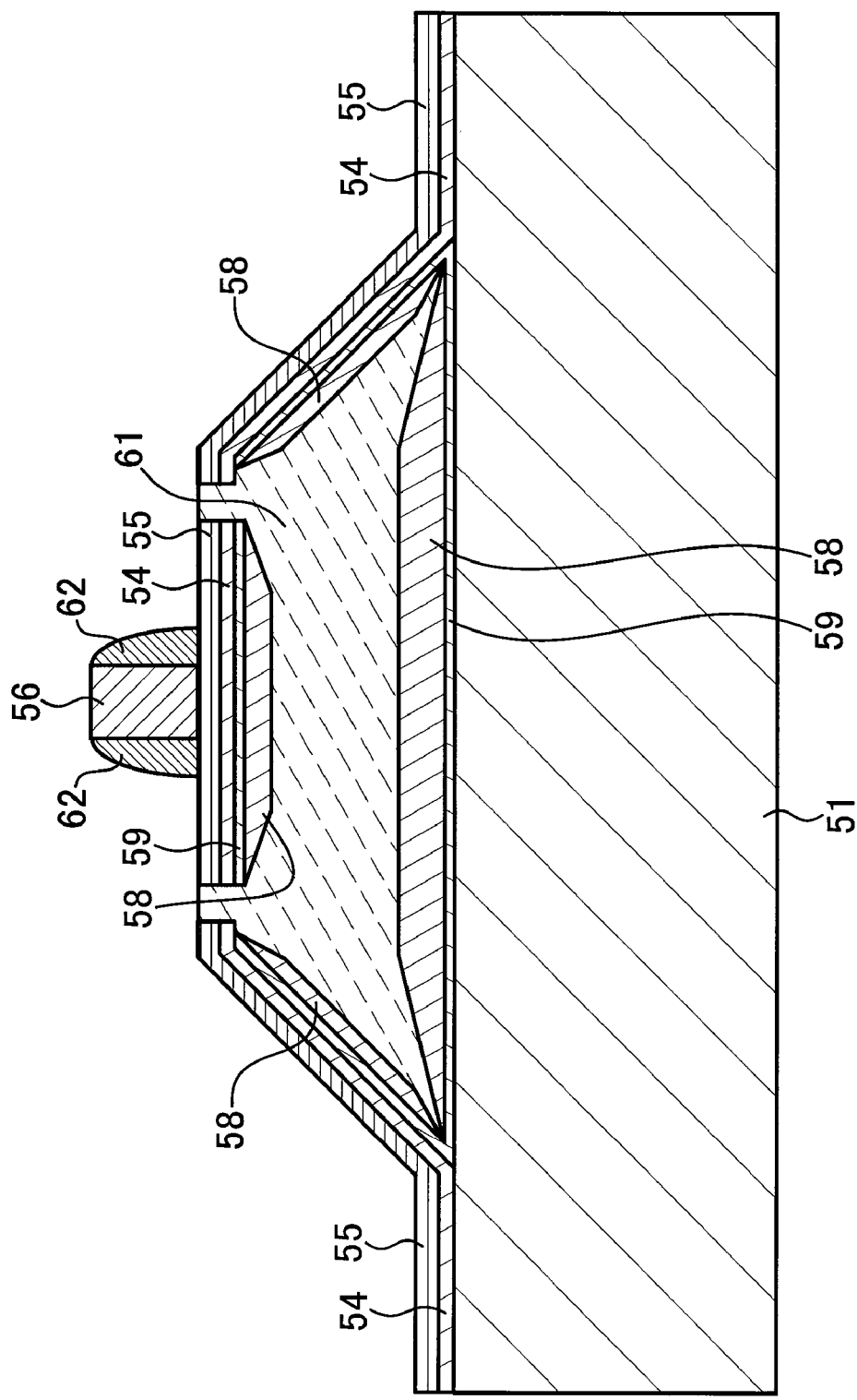
FIG. 63 is a cross-sectional view showing an eleventh manufacturing step of manufacturing the semiconductor device according to the sixth embodiment of the present invention.
Figure 64:
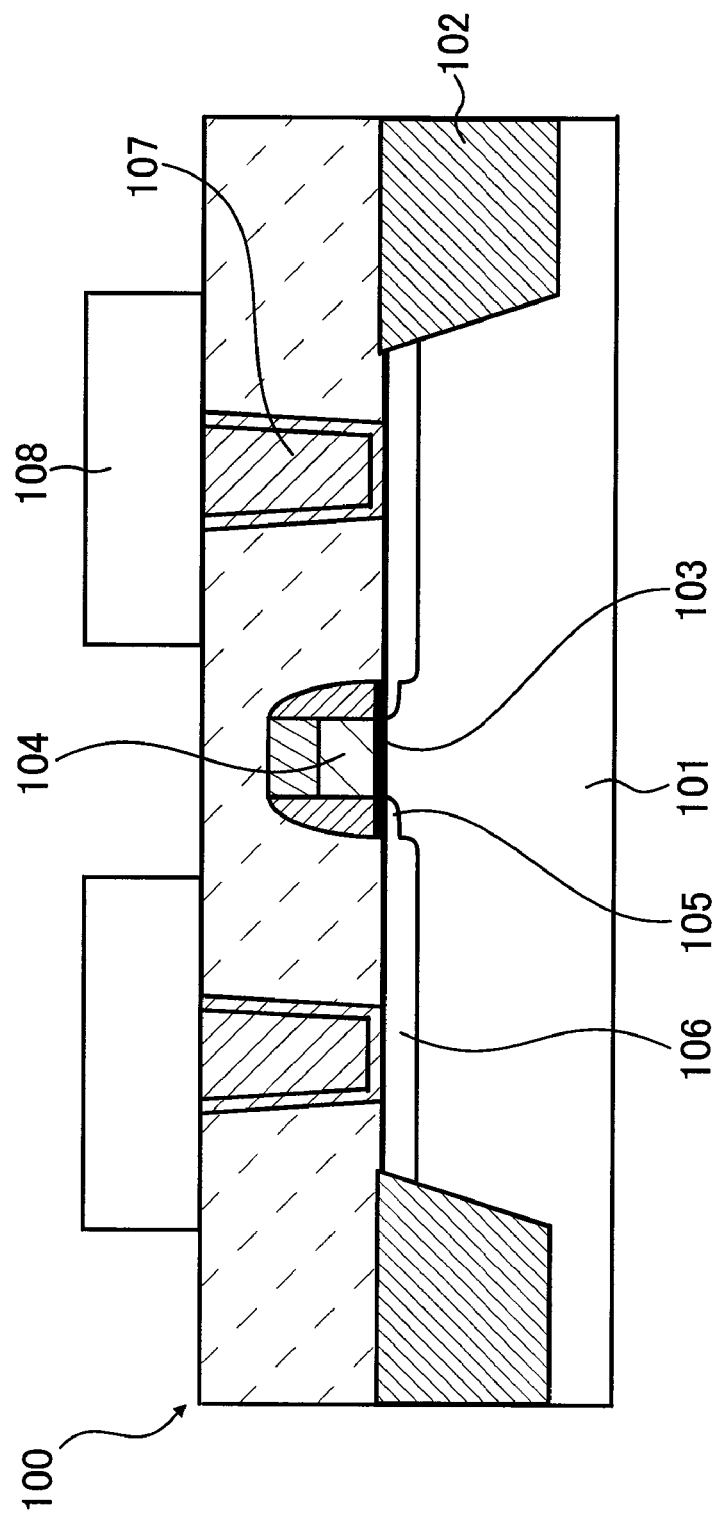
FIG. 64 is a schematic cross-sectional view of a basic structure of a conventional semiconductor device.
Figure 65:
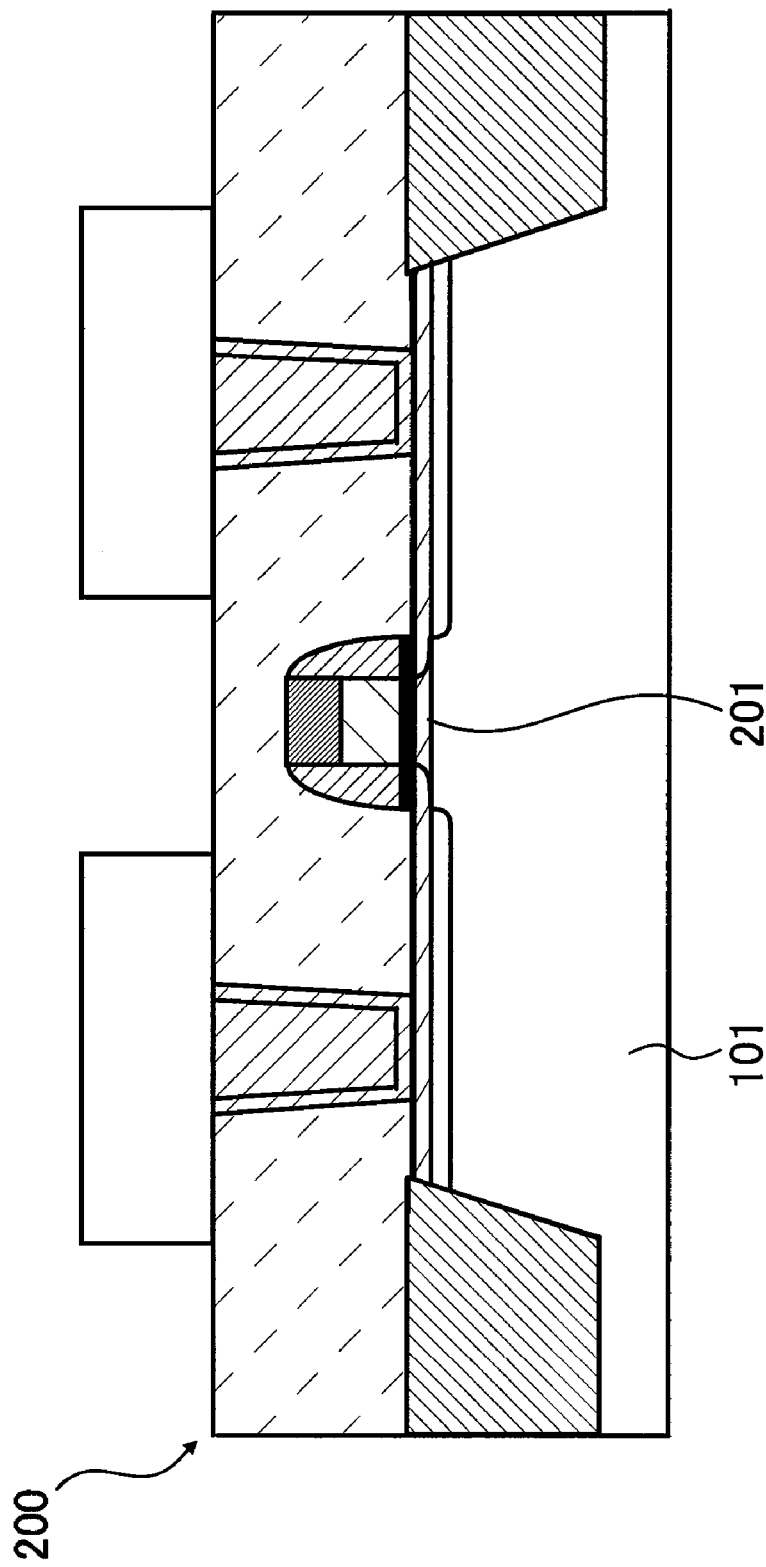
FIG. 65 is a schematic cross-sectional view of a semiconductor device according to a first conventional example.
Figure 66:
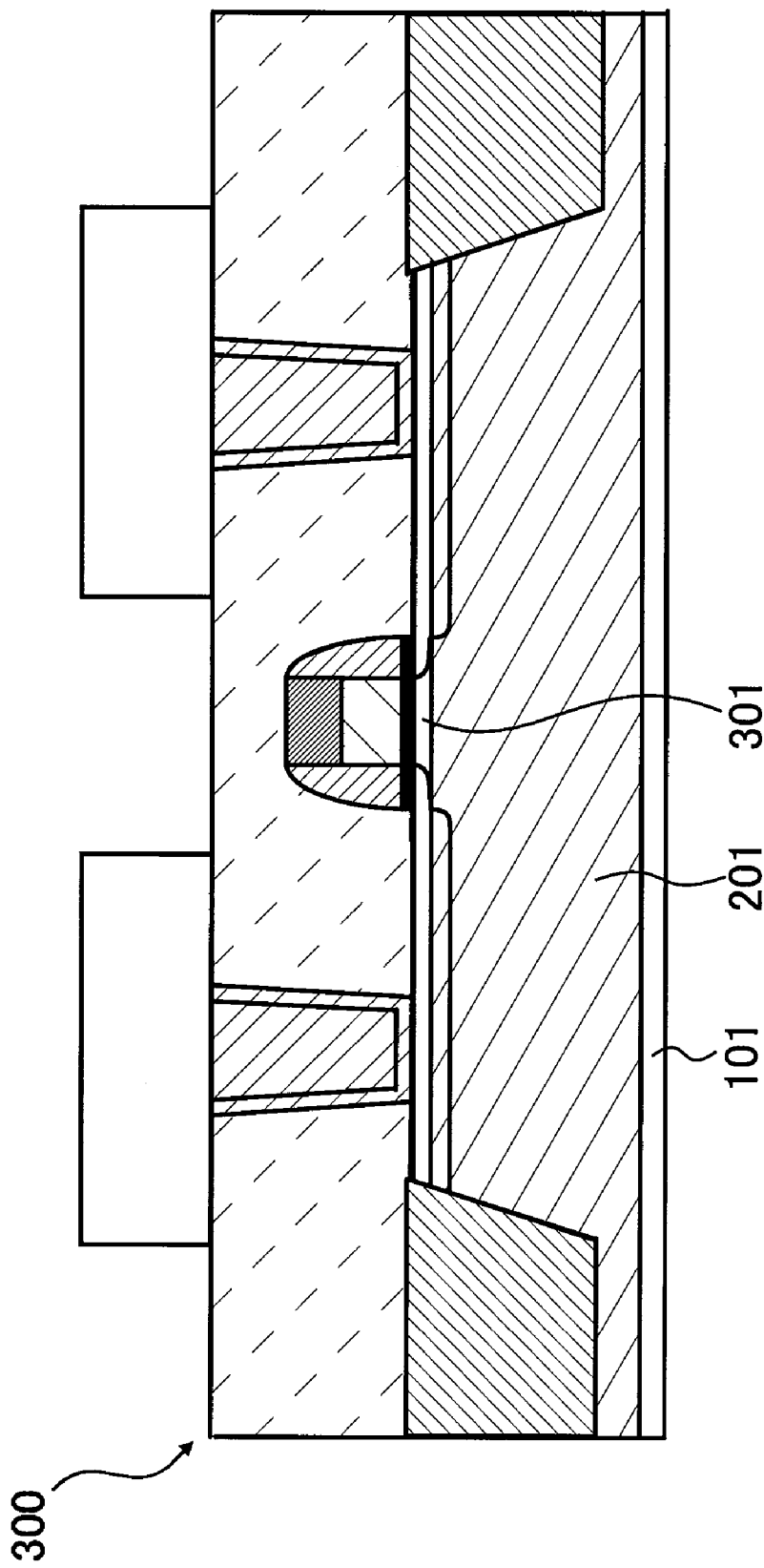
FIG. 66 is a schematic cross-sectional view of a semiconductor device according to a second conventional example.
Figure 67:
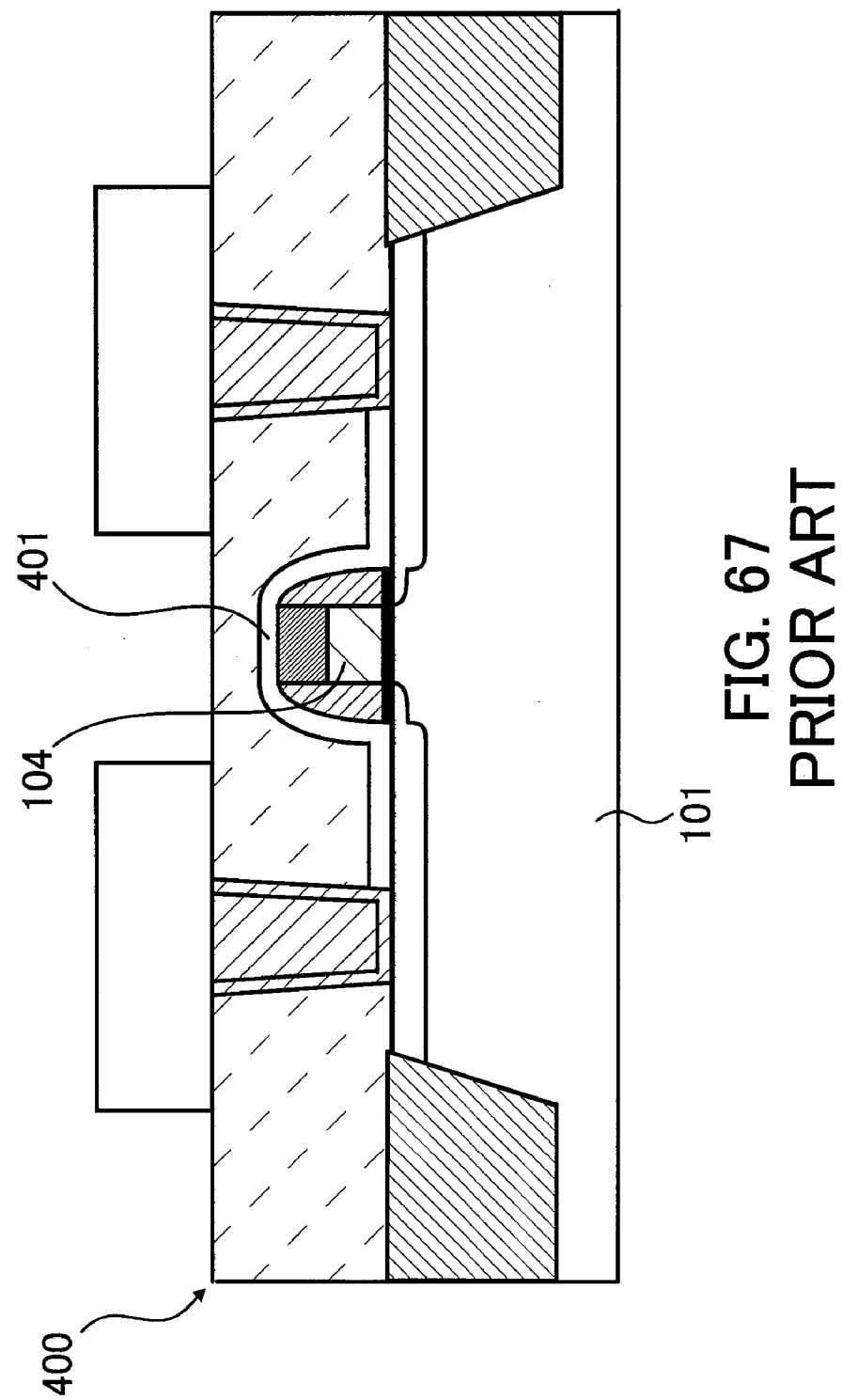
FIG. 67 is a schematic cross-sectional view of a semiconductor device according to a third conventional example.

FIG. 63 is a cross-sectional view showing an eleventh manufacturing step of manufacturing the semiconductor device according to the sixth embodiment of the present invention.

In the eleventh manufacturing step, the entire surface is anisotropically etched to form the side wall 62 on the side edges of the gate electrode 56. After the side wall 62 is formed, ions may be introduced into the second, third, and fourth semiconductor layers 54, 58, 59 in the regions directly below both sides of the gate electrode 56.

Finally, the entire surface is covered with the interlayer insulating film 63. After a contact hole extending to the gate electrode 56 and the source/drain is formed by photolithography, the interconnection 64 is formed, thus completing the semiconductor device 50 shown in FIG. 52. The interlayer insulating film 63 may be made of $SiO_2$ or a low-k material. Before the interconnection 64 is formed, a metal such as Co, Ni, or the like may be brought into reaction with the fourth semiconductor layer 59 or the third semiconductor layer 58 to form a silicide layer. The interconnection 64 may be formed of Al or Cu. The gate electrode 56 may not be formed in the sixth manufacturing step, and a metal gate made of Al or the like may be embedded in the eleventh manufacturing step.

With the semiconductor device 50, the third semiconductor layer 58 serving as a channel region is grown on the inner wall surface of the dome-shaped semiconductor from the gate electrode 56. Therefore, the heteroepitaxial initial growth surface suffering few crystal defects may be used as a channel, making it possible to provide a high-speed transistor. By forming the BOX layer 61 between the third semiconductor layer 58 and the substrate 51, the parasitic capacitance is reduced and the leakage current flowing toward the substrate is reduced for low-power consumption.

According to the present invention, as described above, the high-speed performance of the transistor is greatly enhanced to make the semiconductor device higher in speed, lower in power consumption, and higher in functionality.

The structure in which the semiconductor layer with the channel formed therein is curved according to the present invention is also applicable to a poly-Si layer or an Si layer where the channel of a thin-film transistor (TFT) is formed for an increased carrier mobility in the field of liquid crystal display devices.

According to the present invention, since the semiconductor layer is curved to develop large strains in the channel region, the carrier mobility is drastically increased for making the semiconductor device higher in speed. With the cavity or the insulating film formed below the curved semiconductor layer, the parasitic capacitance is reduced. Therefore, the semiconductor device can be higher in speed and lower in power consumption.

According to the present invention, furthermore, the dome-shaped semiconductor is formed on the substrate, and the initial growth surface of the semiconductor layer formed on the inner wall surface of the dome-shaped semiconductor serves as a channel. Consequently, the semiconductor device is made higher in speed. If the insulating layer is formed below the semiconductor layer with the channel formed therein, then the parasitic capacitance is reduced. Therefore, the semiconductor device can be higher in speed and lower in power consumption.

The foregoing is considered as illustrative only of the principles of the present invention. Further, since numerous modification and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

The invention claimed is:

1. A method of manufacturing a semiconductor device having a gate electrode formed on a semiconductor layer with a gate insulating film interposed therebetween and a source/drain formed in the semiconductor layer, comprising the steps of:
forming a laminated region of a sacrificial layer and a semiconductor layer formed on said sacrificial layer, and a device separating region surrounding said laminated region, on a substrate;
forming a gate electrode on said device separating region and said semiconductor layer with a gate insulating film interposed therebetween;
forming an opening through which said sacrificial layer is exposed between said device separating region and said semiconductor layer; and
removing the whole of said sacrificial layer through said opening to form a cavity below said semiconductor layer.

2. The method according to claim 1, further comprising the step of:
after the step of removing said sacrificial layer through said opening to form the cavity below said semiconductor layer, curving said semiconductor layer.

3. The method according to claim 2, wherein said step of curving said semiconductor layer comprises the step of:
curving said semiconductor layer under a surface tension acting between said semiconductor layer and said substrate.

4. The method according to claim 2, further comprising the steps of:
after the step of forming the gate electrode, forming a thermally elongatable film on the entire surface, wherein after said thermally elongatable film is formed on the entire surface, said opening through which said sacrificial layer is exposed is formed between said device separating region and said semiconductor layer, and said sacrificial layer is removed through said opening to form said cavity below said semiconductor layer;
wherein said step of curving said semiconductor layer comprises the step of:
curving said semiconductor layer by heating said thermally elongatable film to thermally elongate said thermally elongatable film.

5. The method according to claim 2, further comprising the steps of:
after the step of fonning the gate electrode, introducing ions into said semiconductor layer, wherein after the ions are introduced into said semiconductor layer, said opening through which said sacrificial layer is exposed is formed between said device separating region and said semiconductor layer, and said sacrificial layer is removed through said opening to form said cavity below said semiconductor layer;
wherein said step of curving said semiconductor layer comprises the step of:
curving said semiconductor layer by heating said semiconductor layer to curve said semiconductor layer.

6. The method according to claim 1, wherein said step of forming the opening comprises the step of:
removing said device separating region toward said substrate to partly expose a side surface of said sacrificial layer thereby to form said opening.

7. The method according to claim 1, wherein said step of forming the laminated region and the device separating region comprises the steps of:
forming said sacrificial layer and said semiconductor layer on said substrate to form said laminated region; and
thereafter, forming said device separating region surrounding said laminated region and extending to said substrate.

8. The method according to claim 1, wherein said step of forming the laminated region and the separating region comprises the steps of:
forming said device separating region on said substrate so as to project from a surface of the substrate; and
thereafter, fonning said sacrificial layer and said semiconductor layer on said substrate in a region surrounded by said device separating region to form said laminated region.

9. The method according to claim 1, wherein said sacrificial layer comprises a BOX layer of an SOI substrate, and said semiconductor layer comprises a thin-film semiconductor layer formed on an uppermost layer of said SOI substrate.

10. The method according to claim 1, further comprising the steps of:
before or after the step of removing said sacrificial layer, forming a source/drain in said semiconductor layer in sandwiching relation to a region directly below said gate electrode; and
following said step of forming said source/drain, silicidizing said source/drain entirely or partly.

11. The method according to claim 1, further comprising the steps of:
before or after the step of removing said sacrificial layer, forming another semiconductor layer on said semiconductor layer, and forming a source/drain in said semiconductor layer and said other semiconductor layer in sandwiching relation to a region directly below said gate electrode.

* * * * *